(12) United States Patent
Tokutomi et al.

(10) Patent No.: US 11,367,489 B2
(45) Date of Patent: *Jun. 21, 2022

(54) MULTI-BIT MEMORY SYSTEM WITH ADAPTIVE READ VOLTAGE CONTROLLER

(71) Applicant: KIOXIA CORPORATION, Tokyo (JP)

(72) Inventors: Tsukasa Tokutomi, Kamakura (JP); Masanobu Shirakawa, Chigasaki (JP); Marie Takada, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/126,649

(22) Filed: Dec. 18, 2020

(65) Prior Publication Data

US 2021/0104282 A1 Apr. 8, 2021

Related U.S. Application Data

(63) Continuation of application No. 16/397,241, filed on Apr. 29, 2019, now Pat. No. 11,017,863, which is a (Continued)

(30) Foreign Application Priority Data

Mar. 27, 2017 (JP) .................................. 2017-060481

(51) Int. Cl.
*G11C 16/26* (2006.01)
*G11C 16/34* (2006.01)
(Continued)

(52) U.S. Cl.
CPC .......... *G11C 16/26* (2013.01); *G11C 11/5642* (2013.01); *G11C 16/0483* (2013.01);
(Continued)

(58) Field of Classification Search
CPC ..... G11C 16/0483; G11C 16/26; G11C 16/34; G11C 16/3427; G11C 16/3459
(Continued)

(56) References Cited

U.S. PATENT DOCUMENTS 6,377,485 B1 * 4/2002 Shibata ............... G11C 11/5635
365/185.03
9,239,751 B1 1/2016 Chen
(Continued)

FOREIGN PATENT DOCUMENTS

| JP | 2011-40137 | 2/2011 |
|---|---|---|
| JP | 2013-12267 | 1/2013 |

(Continued)

*Primary Examiner* — Alfredo Bermudez Lozada
(74) *Attorney, Agent, or Firm* — Oblon, McClelland, Maier & Neustadt, L.L.P.

(57) ABSTRACT

According to an embodiment, a semiconductor memory, on receiving a first command, applies a voltage within a first range and a voltage within a second range to a word line and reads a first bit from a memory cell, and, on receiving a second command, applies a voltage within a third range to the word line and reads a second bit from the memory cell. The controller issues the first command a plurality of times and changes the voltages to be applied to the word line within the first range and the second range in accordance with the plurality of first commands, specifies a first and second voltage within the first and the second range, respectively, and estimates a third voltage within the third range. The voltage applied to read the second bit is the estimated third voltage.

14 Claims, 45 Drawing Sheets

Related U.S. Application Data continuation of application No. 15/698,141, filed on Sep. 7, 2017, now Pat. No. 10,325,664.

(51) Int. Cl.
 *G11C 16/04* (2006.01)
 *G11C 11/56* (2006.01)

(52) U.S. Cl.
 CPC .......... *G11C 16/34* (2013.01); *G11C 16/3427* (2013.01); *G11C 16/3459* (2013.01); *G11C 2211/5621* (2013.01)

(58) Field of Classification Search
 USPC .................................................. 365/185.17
 See application file for complete search history.

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0038212 A1 | 2/2011 | Uchikawa et al. |
| 2011/0284946 A1 | 11/2011 | Kiyotoshi |
| 2012/0069663 A1 | 3/2012 | Itagaki et al. |
| 2012/0163085 A1 | 6/2012 | Alrod |
| 2012/0307557 A1 | 12/2012 | Itagaki |
| 2013/0003454 A1 | 1/2013 | Edahiro et al. |
| 2013/0077400 A1 | 3/2013 | Sakurada |
| 2013/0148436 A1 | 6/2013 | Kurosawa |
| 2014/0340964 A1 | 11/2014 | Shiino et al. |
| 2014/0355340 A1 | 12/2014 | Sharon |
| 2015/0085571 A1 | 3/2015 | Hu |
| 2016/0078954 A1 | 3/2016 | Shirakawa et al. |

FOREIGN PATENT DOCUMENTS

| | | |
|---|---|---|
| JP | 2013-80450 | 5/2013 |
| JP | 2013-122804 | 6/2013 |
| JP | 2014-225310 | 12/2014 |
| JP | 2016-62623 | 4/2016 |

* cited by examiner

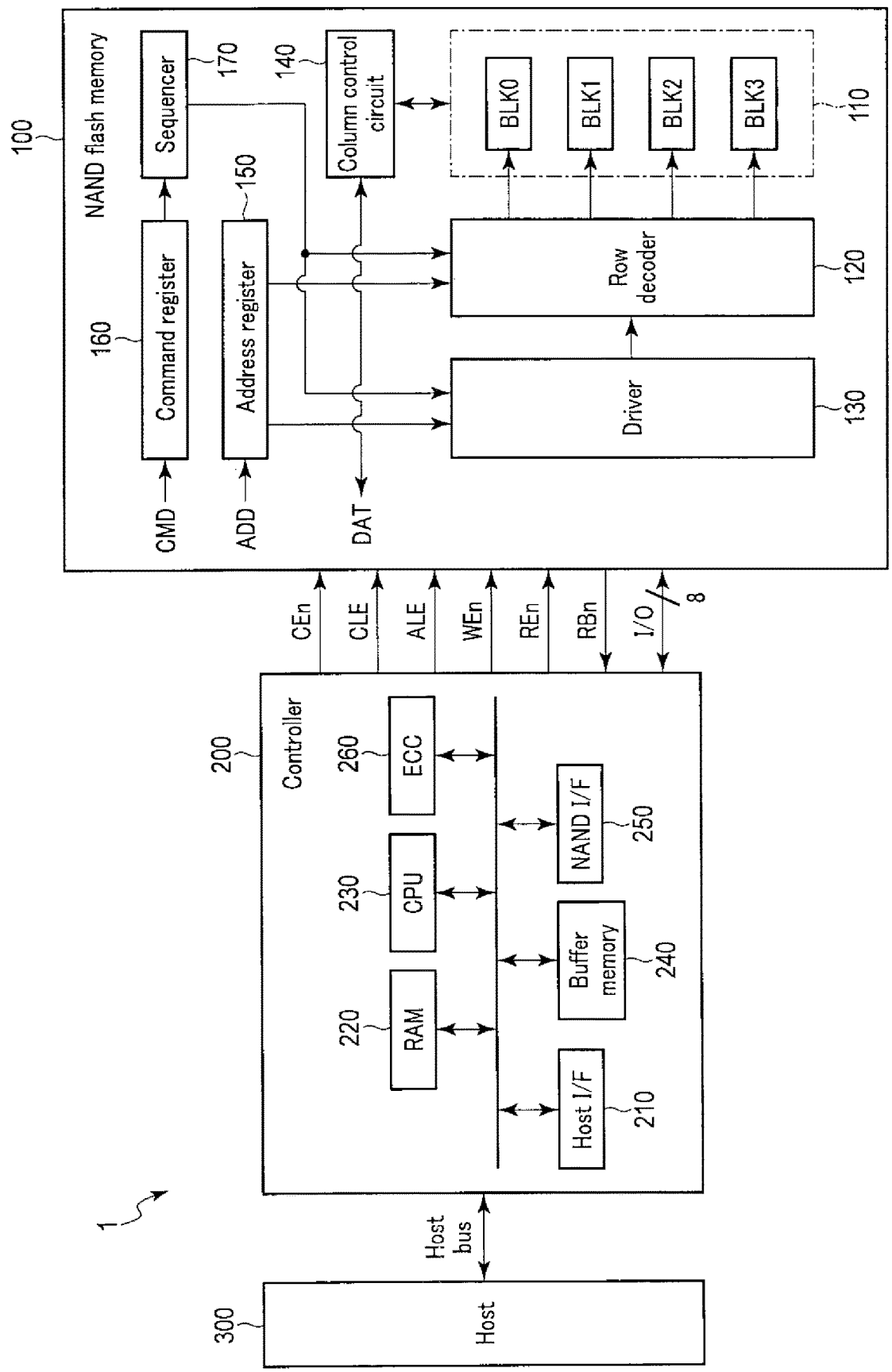
F I G. 1

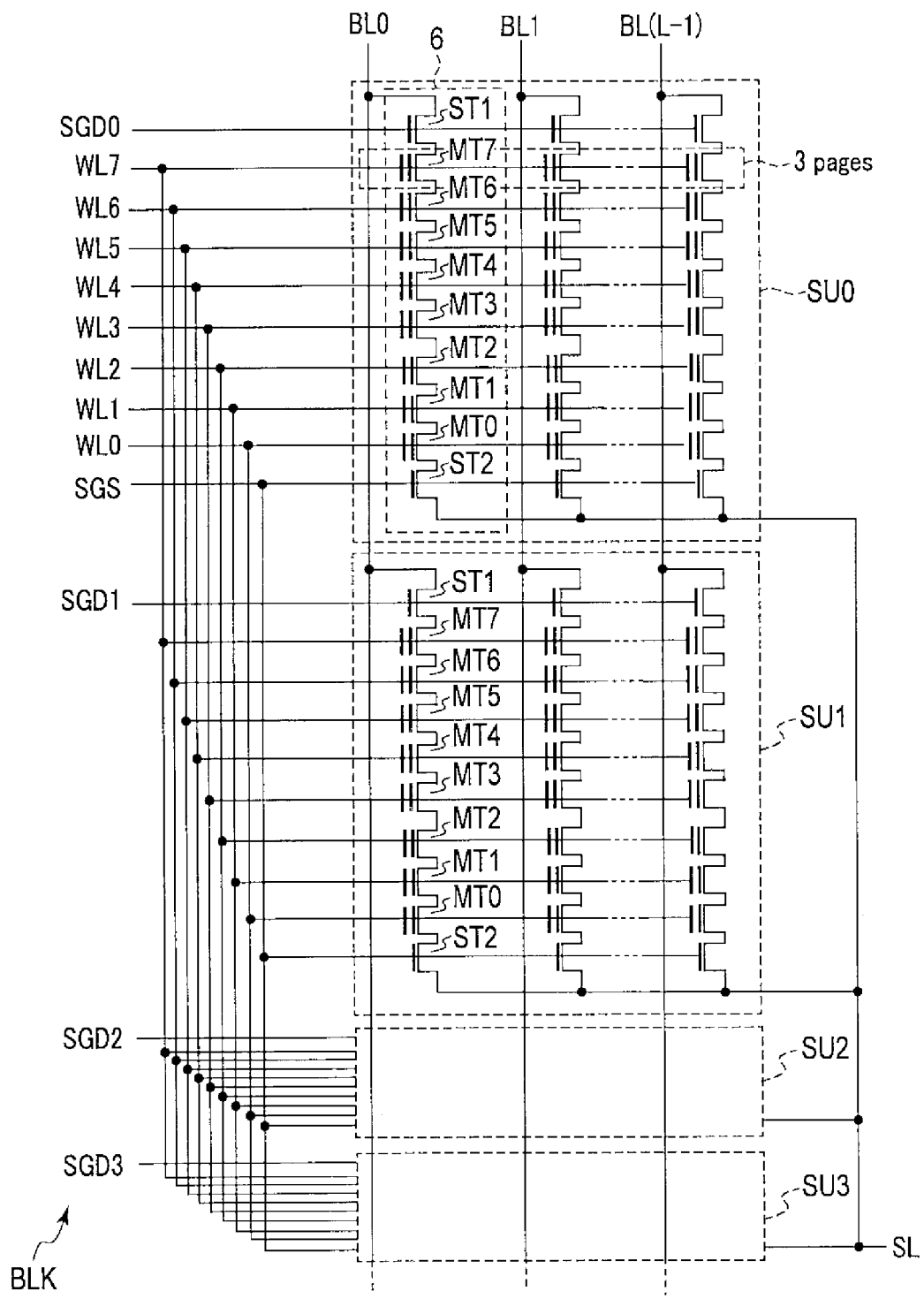
F I G. 2

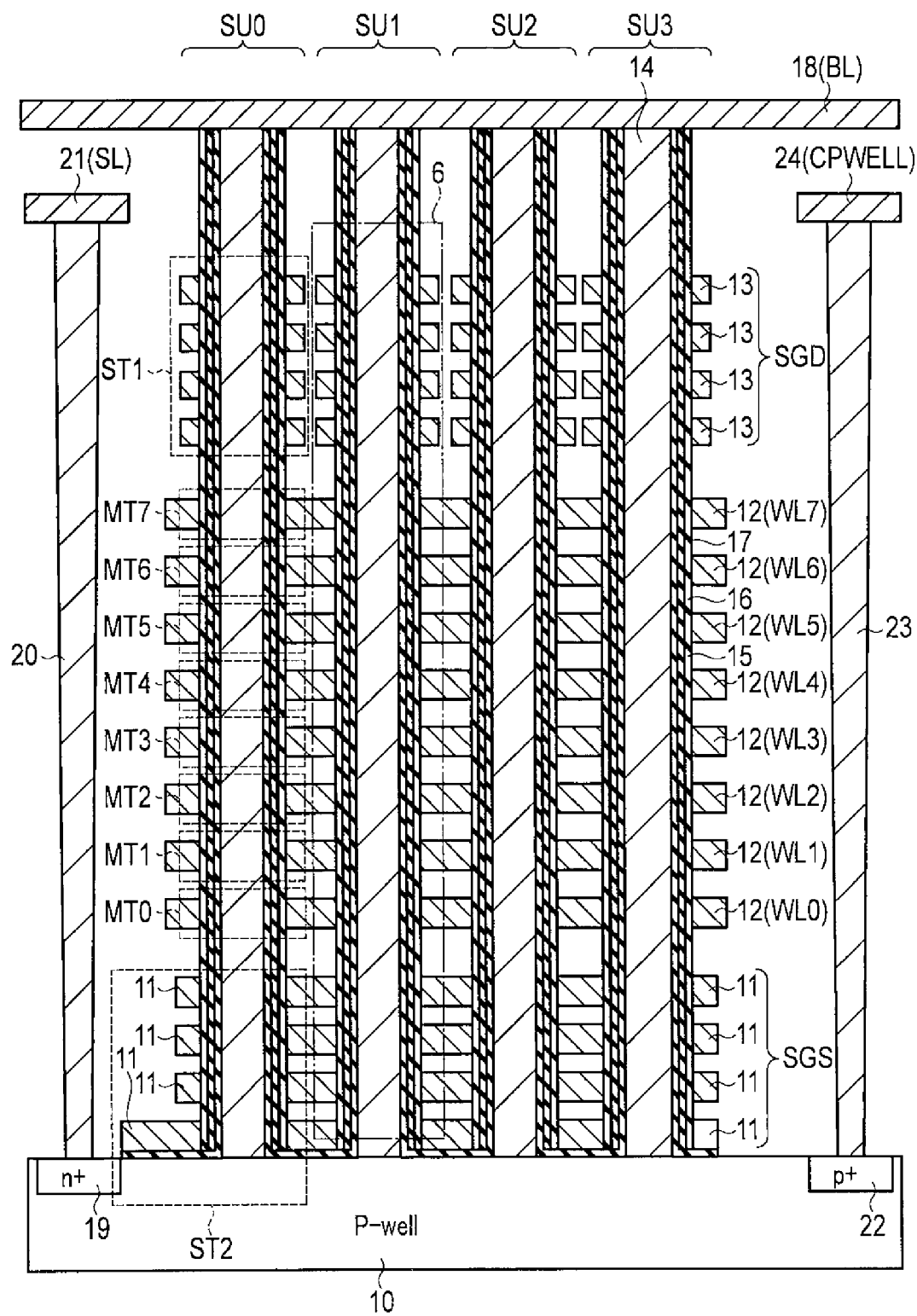
F I G. 3

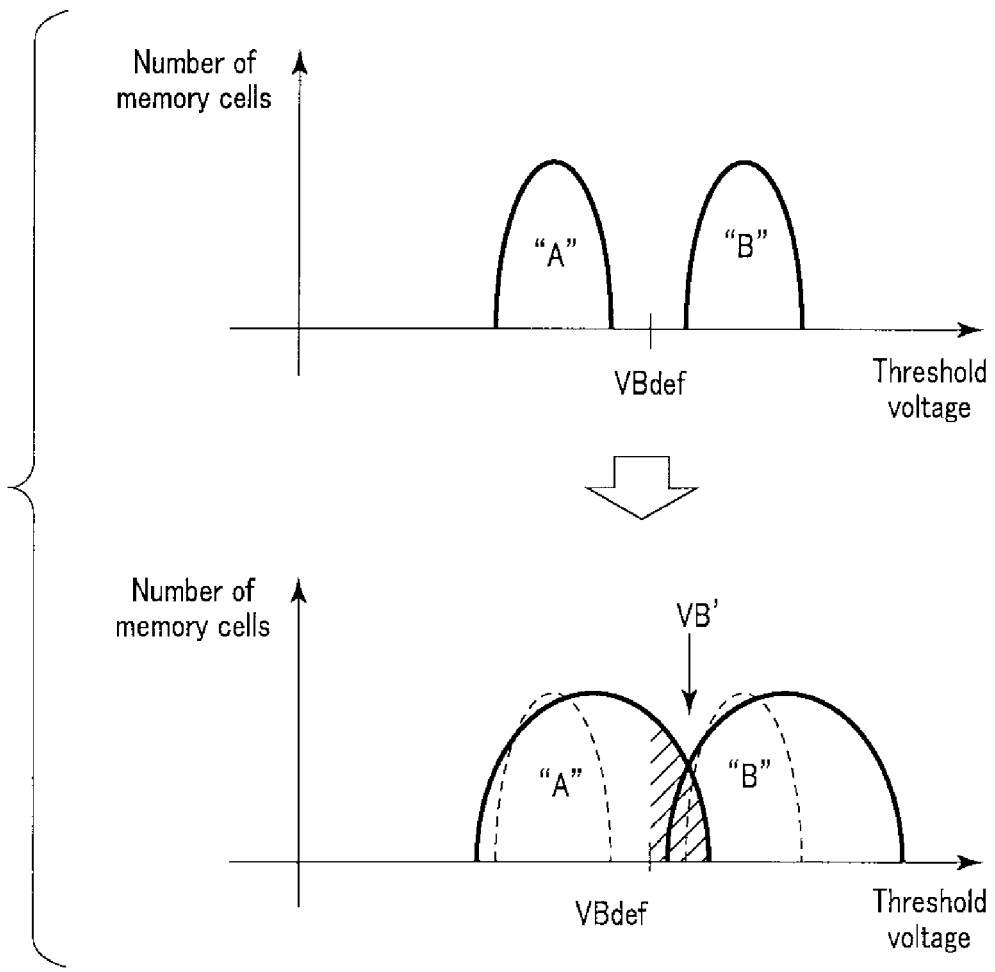
F I G. 8

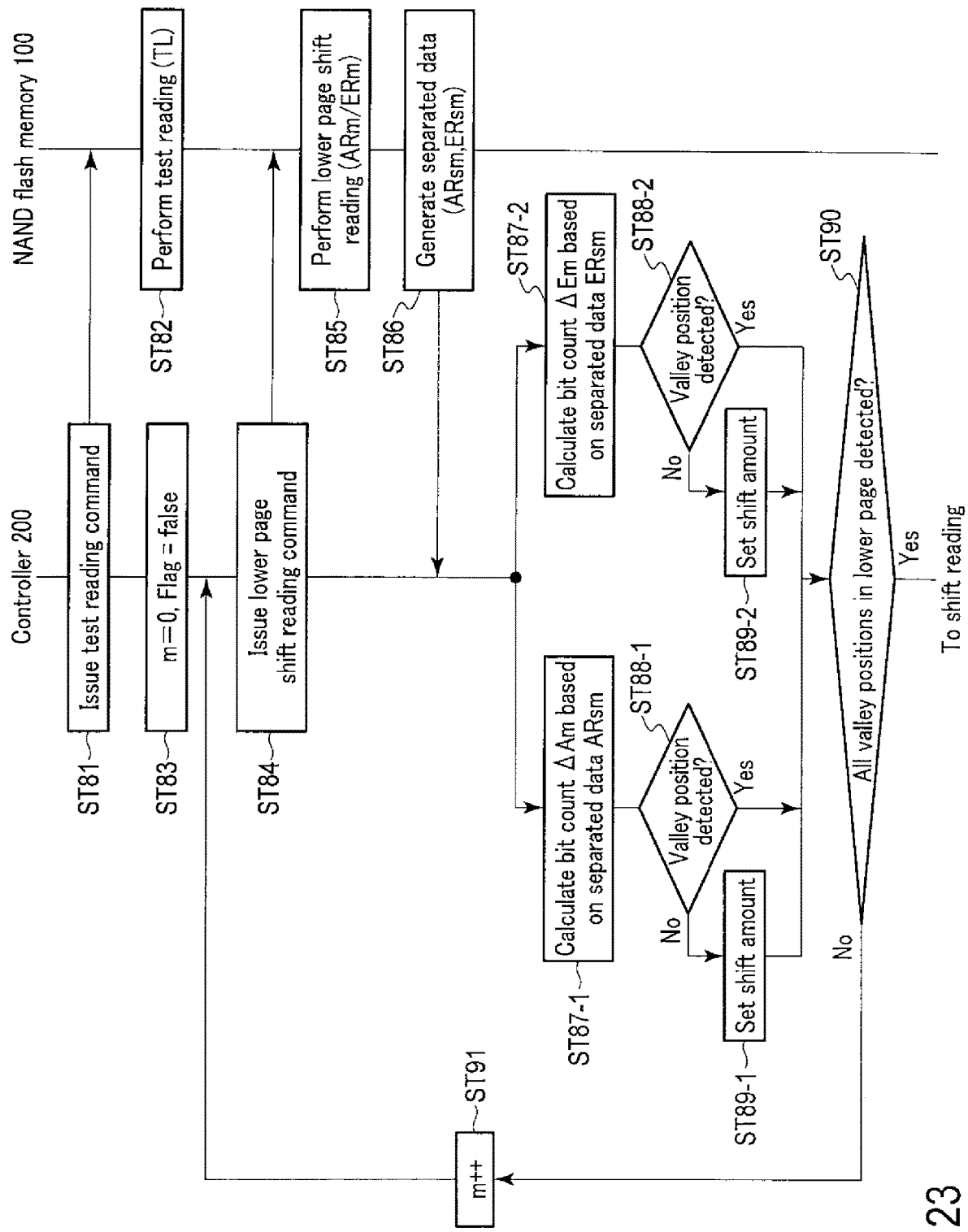
F I G. 23

| Threshold | Ratio of number of memory cells of data "1" relative to number of memory cells corresponding to one level |
|---|---|
| Bmin | 1.5 |
| Bmax | 2.5 |
| Dmin | 0.5 |
| Dmax | 1.5 |
| Fmin | 0.5 |
| Fmax | 1.5 |

F I G. 32

| Threshold | Ratio of number of memory cells of data "1" relative to number of memory cells corresponding to one level |
|---|---|
| Amin | 0.5 |
| Amax | 1.5 |
| Emin | 1.5 |
| Emax | 2.5 |

F I G. 34

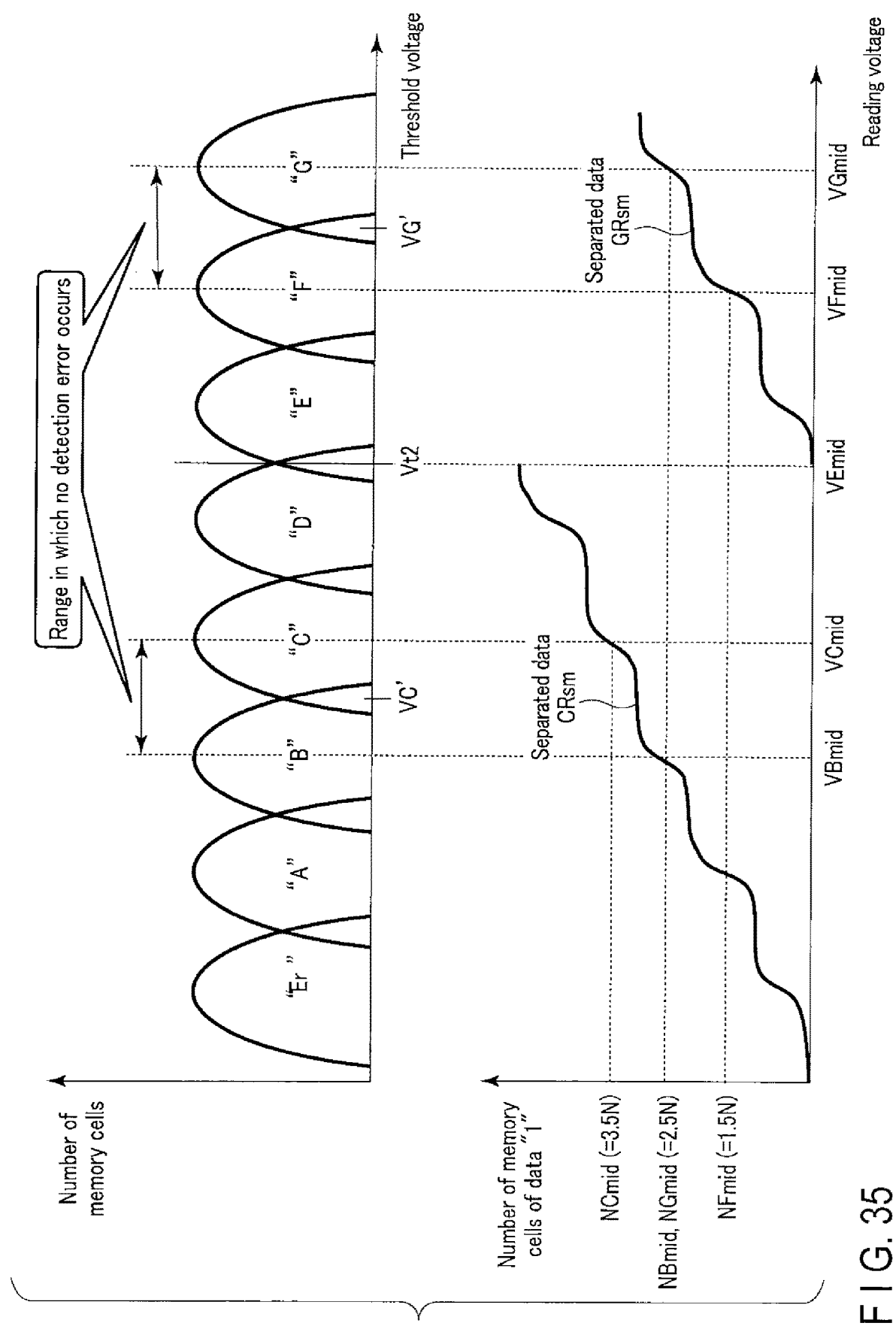
F I G. 35

| Threshold | Ratio of number of memory cells of data "1" relative to number of memory cells corresponding to one level |
|---|---|
| Cmin | 2.5 |
| Cmax | 3.5 |
| Gmin | 1.5 |
| Gmax | 2.5 |

F I G. 36

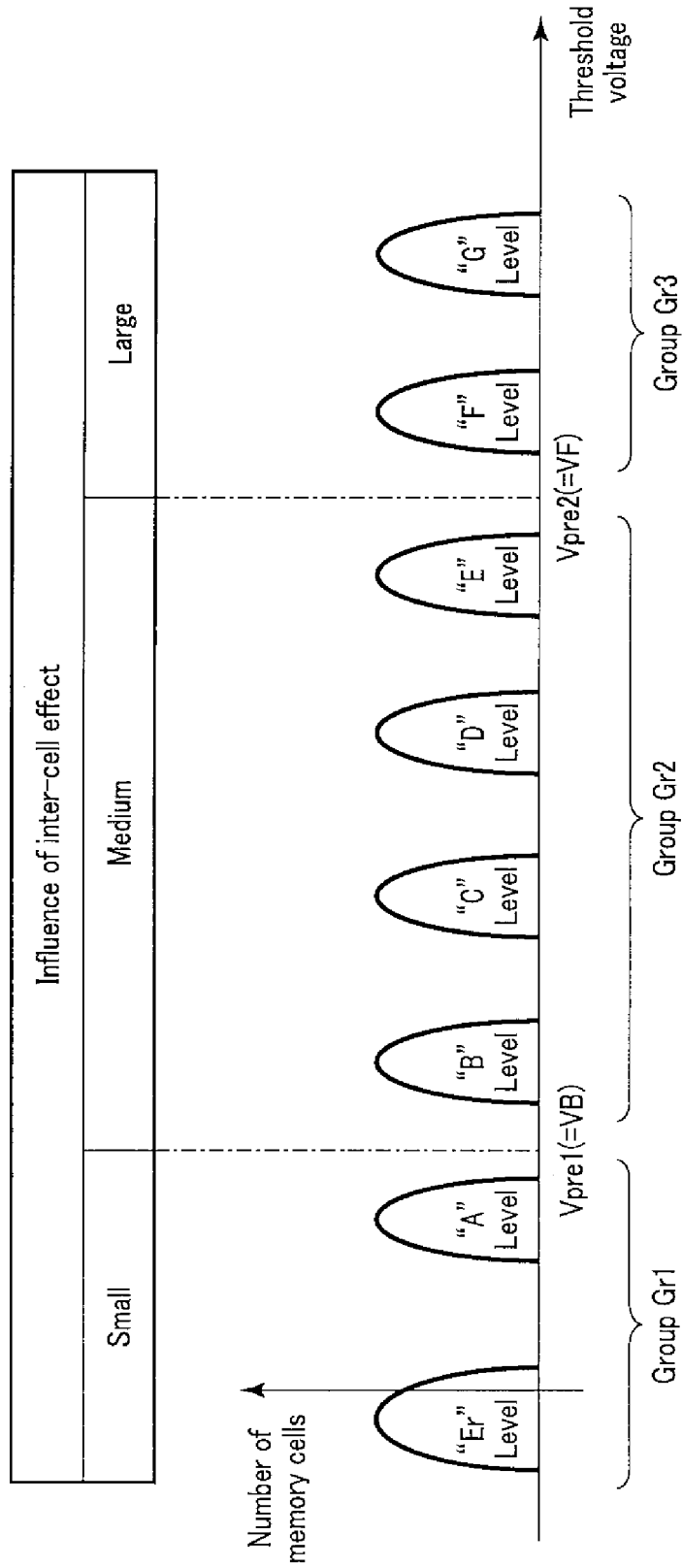
F I G. 37

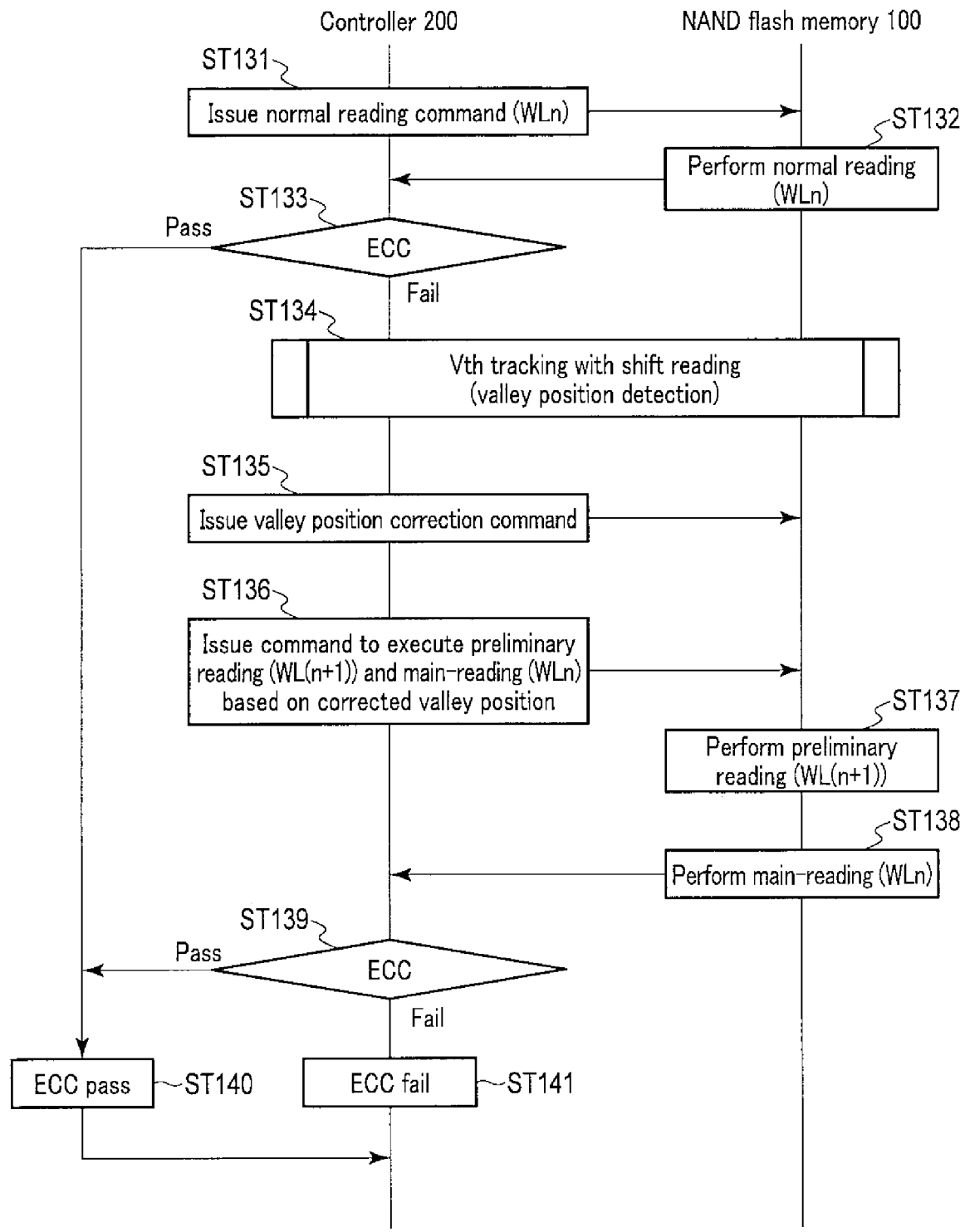
F I G. 38

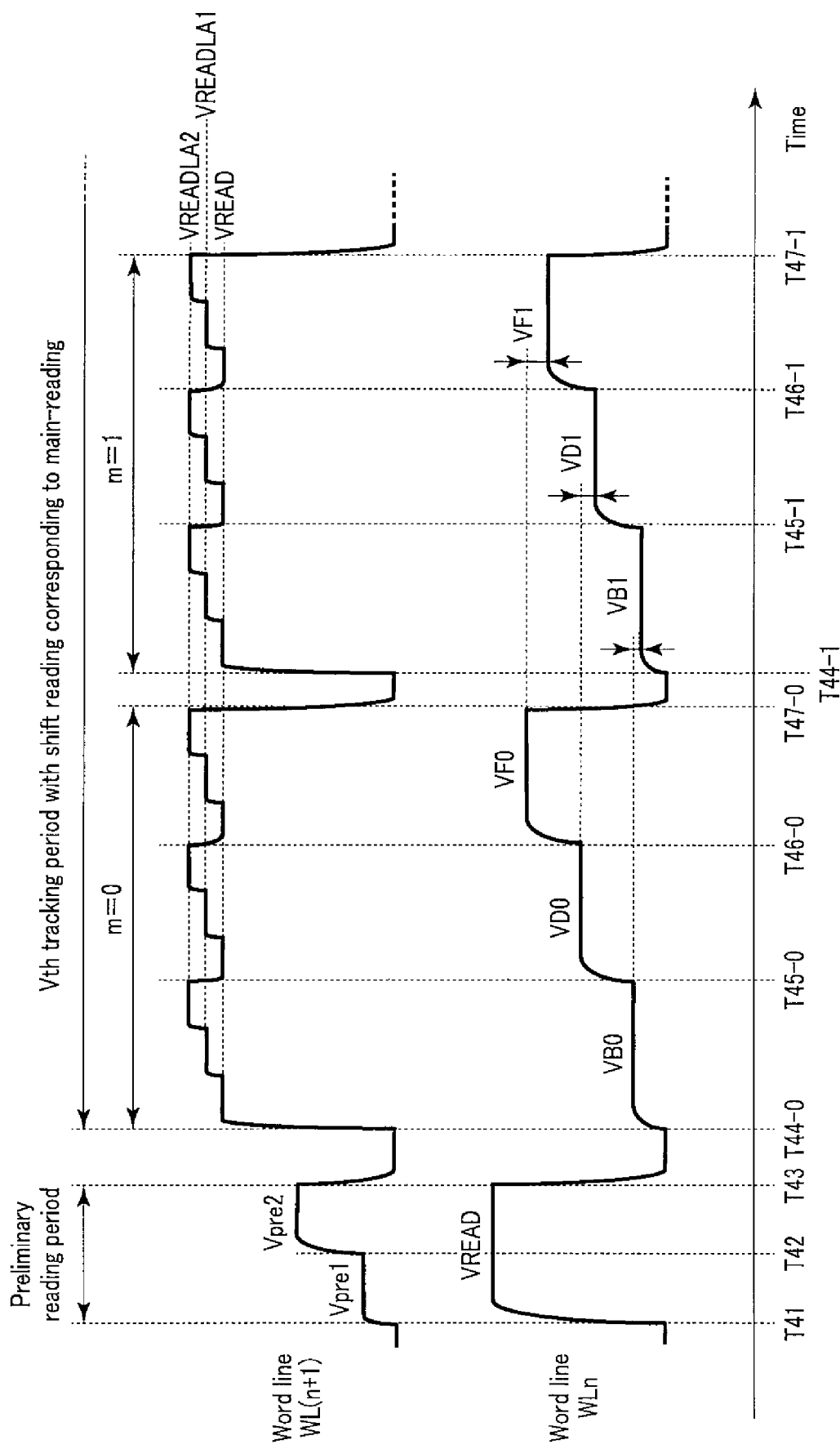
F I G. 44

US 11,367,489 B2

MULTI-BIT MEMORY SYSTEM WITH ADAPTIVE READ VOLTAGE CONTROLLER

CROSS-REFERENCE TO RELATED APPLICATIONS

This application is a continuation of U.S. application Ser. No. 16/397,241 filed Apr. 29, 2019, which is a continuation of U.S. application Ser. No. 15/698,141 filed Sep. 7, 2017, and is based upon and claims the benefit of priority from Japanese Patent Application No. 2017-060481, filed Mar. 27, 2017, the entire contents of each of which are incorporated herein by reference.

FIELD

Embodiments described herein relate generally to a memory system.

BACKGROUND

A memory system including a NAND flash memory serving as a semiconductor storage device, and a controller that controls the NAND flash memory is known.

BRIEF DESCRIPTION OF THE DRAWINGS

FIG. 1 is a block diagram of a memory system according to a first embodiment;

FIGS. 2 and 3 are a circuit diagram and a sectional view, respectively, showing a memory cell array according to the first embodiment;

FIG. 8 shows a graph of threshold voltage distributions according to the first embodiment;

FIG. 23 is a flowchart showing the operation including the M-point Vth tracking operation of the memory system according to the third embodiment;

FIG. 32 is a table showing the erroneous detection suppressing operation according to the fourth embodiment;

FIG. 34 is a table showing the erroneous detection suppressing operation according to the fourth embodiment;

FIG. 35 is a schematic view showing the erroneous detection suppressing operation according to the fourth embodiment;

FIG. 36 is a table showing the erroneous detection suppressing operation according to the fourth embodiment;

FIG. 37 is a schematic view for explaining an inter-cell effect;

FIG. 38 is a flowchart showing the Vth tracking operation of a memory system according to a fifth embodiment;

FIGS. 44 and 45 are timing charts showing the Vth tracking operation of the memory system according to the modification of the fifth embodiment.

DETAILED DESCRIPTION

Figure 4:
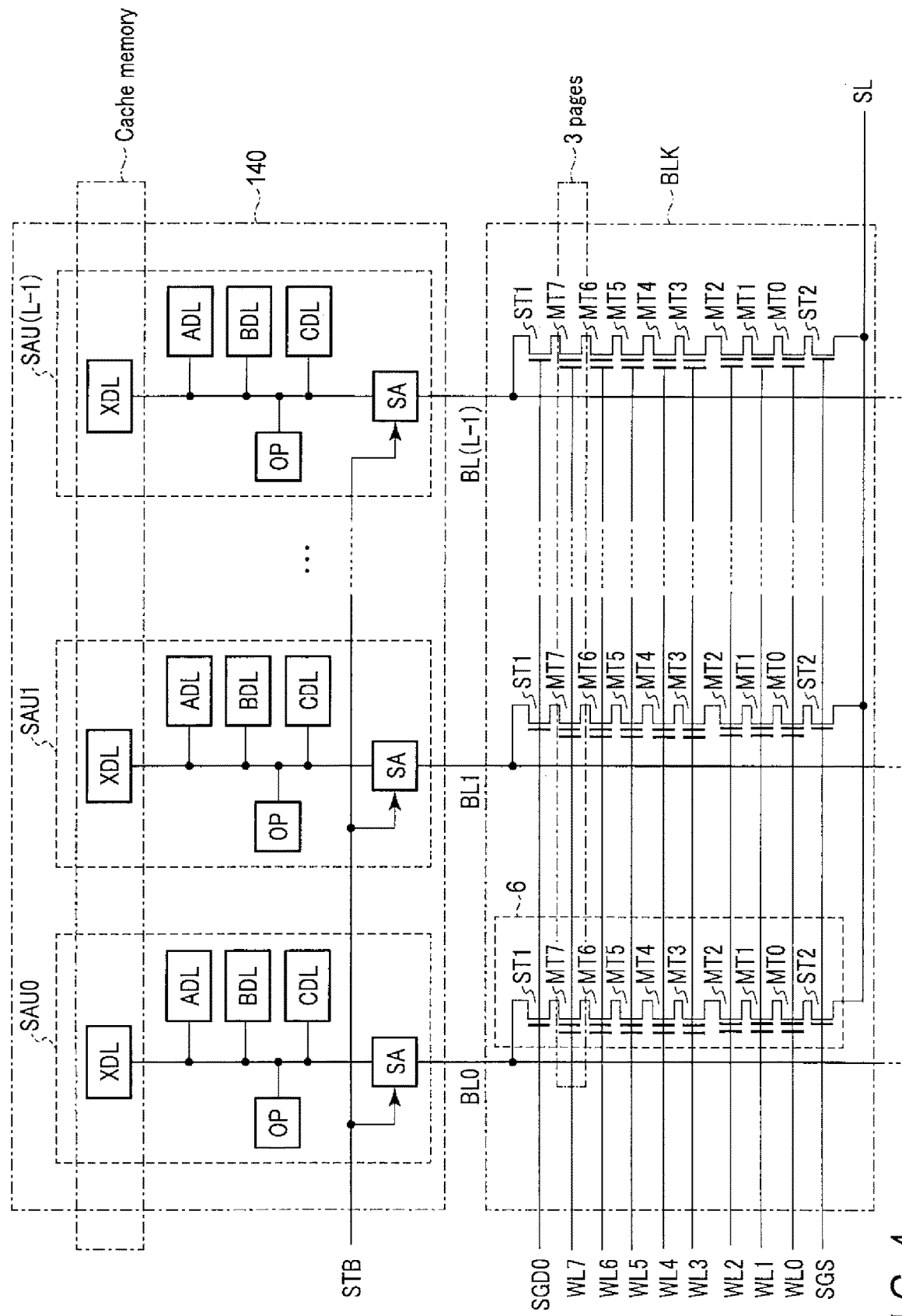
FIG. 4 is a block diagram of a sense amplifier according to the first embodiment.

In general, according to one embodiment, a memory system includes: a semiconductor memory including a first memory cell coupled to a first word line and capable of holding data; and a controller capable of issuing a first command and a second command. The data that the semiconductor memory can hold is multi-bit data including a first bit and a second bit. Upon receiving the first command, the semiconductor memory applies a voltage within a first range and a voltage within a second range to the first word line and reads the first bit from the first memory cell, and upon receiving the second command, the semiconductor memory applies a voltage within a third range to the first word line and reads the second bit from the first memory cell. The controller issues the first command a plurality of times and changes the voltages to be applied to the first word line within the first range and the second range in accordance with the plurality of first commands. Based on the first bit read from the first memory cell for each of the plurality of first commands, the controller specifies a first voltage within the first range and specifies a second voltage within the second range. Based on at least the first voltage, the controller estimates a third voltage within the third range. The voltage applied to the first word line to read the second bit when the second command is issued is the estimated third voltage.

1. First Embodiment

A memory system according to the first embodiment will be described. A memory system including a NAND flash memory as a semiconductor storage device will be exemplified below.

1.1 Configuration

1.1.1 Configuration of Memory System

A rough overall configuration of the memory system according to the first embodiment will be described first with reference to FIG. 1.

As shown in FIG. 1, a memory system 1 includes a NAND flash memory 100 and a controller 200. The NAND flash memory 100 and the controller 200 may form one semiconductor device by, for example, a combination thereof. Examples of the device are a memory card such as an SD™ card and an SSD (Solid State Drive).

The NAND flash memory 100 includes a plurality of memory cells and nonvolatilely stores data. The controller 200 is connected to the NAND flash memory 100 by a NAND bus and is connected to a host device 300 by a host bus. The controller 200 controls the NAND flash memory 100, and accesses the NAND flash memory 100 in response to an instruction received from the host device 300. The host device 300 is, for example, a digital camera or a personal computer, and the host bus is, for example, a bus complying with an SD™ interface. The NAND bus transmits/receives signals complying with a NAND interface. Detailed examples of the signals are a chip enable signal CEn, an address latch enable signal ALE, a command latch enable signal CLE, a write enable signal WEn, a read enable signal REn, a ready busy signal RBn, and an input/output signal I/O.

The signal CEn is a signal used to enable the NAND flash memory 100 and is asserted LOW. The signals CLE and ALE are signals that notify the NAND flash memory 100 that the input signals I/O to the NAND flash memory 100 are a command and an address, respectively. The signal WEn is a signal asserted LOW and used to make the NAND flash memory 100 to receive the input signal I/O. The signal REn is also a signal asserted LOW and used to read the output signal I/O from the NAND flash memory 100. The ready busy signal RBn is a signal representing whether the NAND flash memory 100 is in a ready state (a state in which an command from the controller 200 can be received) or a busy state (a state in which an command from the controller 200 cannot be received), and the low level represents the busy state. The input/output signal I/O is, for example, an 8-bit signal. The input/output signal I/O is the entity of data transmitted/received between the NAND flash memory 100 and the controller 200 and includes a command, an address, write data, read data, and the like.

1.1.2 Configuration of Controller

Details of the configuration of the controller 200 will be described next with reference to FIG. 1. As shown in FIG. 1, the controller 200 includes a host interface circuit 210, a memory (RAM) 220, a processor (CPU) 230, a buffer memory 240, a NAND interface circuit 250, and an ECC circuit 260.

The host interface circuit 210 is connected to the host device 300 via the host bus, and transfers instructions and data received from the host device 300 to the processor 230 and the buffer memory 240. The host interface circuit 210 also transfers data in the buffer memory 240 to the host device 300 in response to an instruction from the processor 230.

The processor 230 controls the operation of the entire controller 200. For example, if a writing instruction is received from the host device 300, in response to the instruction, the processor 230 issues a writing instruction to the NAND interface circuit 250. This also applies to reading and erasing. The processor 230 also executes various kinds of processing such as wear leveling to manage the NAND flash memory 100.

The NAND interface circuit 250 is connected to the NAND flash memory 100 via the NAND bus, and controls communication with the NAND flash memory 100. Based on an command received from the processor 230, the NAND interface circuit 250 outputs the signals CEn, ALE, CLE, WEn, and REn to the NAND flash memory 100. At the time of writing, the NAND interface circuit 250 transfers a writing command issued by the processor 230 and write data in the buffer memory 240 to the NAND flash memory 100 as the input/output signal I/O. At the time of reading, the NAND interface circuit 250 transfers a reading command issued by the processor 230 to the NAND flash memory 100 as the input/output signal I/O. In addition, the NAND interface circuit 250 receives data read from the NAND flash memory 100 as the input/output signal I/O and transfers it to the buffer memory 240.

The buffer memory 240 temporarily holds write data or read data.

The memory 220 is, for example, a semiconductor memory such as a DRAM, and is used as the work area of the processor 230. The memory 220 holds firmware configured to manage the NAND flash memory 100 and various kinds of management tables.

The ECC circuit 260 performs error detection and error correction processing concerning data stored in the NAND flash memory 100. That is, at the time of data writing, the ECC circuit 260 generates an error-correcting code and adds it to write data. At the time of data reading, the ECC circuit 260 decodes the data. As the error-correcting code, a hard decision decoding code such as a BCH code or an RS (Reed-Solomon) code and a soft decision decoding code such as an LDPC (Low-Density Parity-Check) code can be used.

1.1.3 Configuration of NAND Flash Memory

1.1.3.1 Overall Configuration of NAND Flash Memory

The configuration of the NAND flash memory 100 will be described next. As shown in FIG. 1, the NAND flash memory 100 includes a memory cell array 110, a row decoder 120, a driver circuit 130, a column control circuit 140, an address register 150, a command register 160, and a sequencer 170.

The memory cell array 110 includes a plurality of blocks BLK each including a plurality of nonvolatile memory cells associated with rows and columns. For example, FIG. 1 shows four blocks BLK0 to BLK3. The memory cell array 110 stores data given by the controller 200.

The row decoder 120 selects one of the blocks BLK0 to BLK3, and further selects a row direction in the selected block BLK.

The driver circuit 130 applies a voltage to the selected block BLK via the row decoder 120.

At the time of data reading, the column control circuit 140 senses data read from the memory cell array 110 and performs necessary operations. The column control circuit 140 then outputs data DAT to the controller 200. At the time of data writing, the column control circuit 140 transfers the write data DAT received from the controller 200 to the memory cell array 110.

The address register 150 holds an address ADD received from the controller 200. The command register 160 holds a command CMD received from the controller 200.

The sequencer 170 controls the operation of the entire NAND flash memory 100 based on the command CMD held by the command register 160.

1.1.3.2 Configuration of Block

The configuration of the block BLK will be described next with reference to FIG. 2. FIG. 2 is a circuit diagram of a block BLK.

As shown in FIG. 2, the block BLK includes, for example, four string units SU (SU0 to SU3). Each string unit SU includes a plurality of NAND strings 6. The number of block BLKs in the memory cell array 110 and the number of string units in each block are arbitrary.

Each NAND string 6 includes, for example, eight memory cell transistors MT (MT0 to MT7) and select transistors ST1 and ST2. Each memory cell transistor MT includes a control gate and a charge accumulation layer and nonvolatilely holds data. The memory cell transistors MT are connected in series between the source of the select transistor ST1 and the drain of the select transistor ST2.

The gates of the select transistors ST1 in the string units SU0 to SU3 are connected to select gate lines SGD0 to SGD3. On the other hand, the gates of the select transistors ST2 in the string units SU0 to SU3 are commonly connected to, for example, a select gate line SGS. The gates of the select transistors ST2 may be connected to different select gate lines SGS0 to SGS3 on a string unit basis, as a matter of course. The control gates of the memory cell transistors MT0 to MT7 in the same block BLK are commonly connected to word lines WL0 to WL7, respectively.

The drains of the select transistors ST1 of the NAND strings 6 on the same column in the memory cell array 110 are commonly connected to a bit line BL (BL0 to BL(L−1), where L is a natural number of 2 or more). That is, the bit line BL commonly connects the NAND strings 6 between the plurality of blocks BLK. The sources of the plurality of select transistors ST2 are commonly connected to a source line SL.

That is, the string unit SU is an aggregate of NAND strings 6 connected to different bit lines BL and connected to the same select gate line SGD. The block BLK is an aggregate of a plurality of string units SU that share the word lines WL. The memory cell array 110 is an aggregate of a plurality of blocks BLK that share the bit lines BL.

FIG. 3 is a sectional view of a partial region of the block BLK. As shown in FIG. 3, the plurality of NAND strings 6 are formed on a p-type well region 10. That is, for example, four interconnect layers 11 functioning as the select gate lines SGS, eight interconnect layers 12 functioning as the word lines WL0 to WL7, and, for example, four interconnect layers 13 functioning as the select gate lines SGD are sequentially stacked on the well region 10. Insulating films (not shown) are formed between the stacked interconnect layers.

Pillar-shaped conductors 14 extending through the interconnect layers 13, 12, and 11 and reaching the well region 10 are formed. A gate insulating film 15, a charge accumulation layer (an insulating film or a conductive film) 16, and a block insulating film 17 are sequentially formed on the side surfaces of the conductors 14. The memory cell transistors MT and the select transistors ST1 and ST2 are thus formed. Each conductor 14 is a region which functions as the current path of the NAND string 6 and in which the channels of the transistors are formed. The upper ends of the conductors 14 are connected to a metal interconnect layer 18 functioning as the bit line BL.

An $n^+$-type impurity diffusion layer 19 is formed in the surface region of the well region 10. A contact plug 20 is formed on the diffusion layer 19. The contact plug 20 is connected to a metal interconnect layer 21 functioning as the source line SL. In addition, a $p^+$-type impurity diffusion layer 22 is formed in the surface region of the well region 10. A contact plug 23 is formed on the diffusion layer 22. The contact plug 23 is connected to a metal interconnect layer 24 functioning as a well interconnect CPWELL. The well interconnect CPWELL is an interconnect used to apply a potential to the conductors 14 via the well region 10.

A plurality of configurations described above are arrayed in the depth direction of the sheet of FIG. 3. The string unit SU is formed by the aggregate of the plurality of NAND strings 6 arranged in the depth direction.

In this example, one memory cell transistor MT can hold, for example, 3-bit data. The bits of the 3-bit data will be referred to as a lower bit, a middle bit, and an upper bit sequentially from the lower side. An aggregate of lower bits held by memory cells connected to the same word line will be referred to as a lower page, an aggregate of middle bits will be referred to as a middle page, and an aggregate of upper bits will be referred to as an upper page. That is, three pages are assigned to one word line WL, and the block BLK including eight word lines WL has a capacity of 24 pages. In other words, "page" can be defined as a part of a memory space formed by memory cells connected to the same word line. Writing and reading of data may be done on a page basis (this reading method will be referred to as page-by-page reading).

Data erasing can be done for each block BLK or a unit smaller than the block BLK. An erasing method is described in, for example, U.S. patent application Ser. No. 13/235,389 "NONVOLATILE SEMICONDUCTOR MEMORY DEVICE" filed on Sep. 18, 2011. An erasing method is also described in, for example, U.S. patent application Ser. No. 12/694,690 "NON-VOLATILE SEMICONDUCTOR STORAGE DEVICE" filed on Jan. 27, 2010. An erasing method is also described in, for example, U.S. patent application Ser. No. 13/483,610 "NONVOLATILE SEMICONDUCTOR MEMORY DEVICE AND DATA ERASE METHOD THEREOF" filed on May 30, 2012. These patent applications are incorporated by reference in this specification in their entirety.

The memory cell array 110 may have another configuration. That is, an configuration of the memory cell array 110 is described in, for example, U.S. patent application Ser. No. 12/407,403 "THREE DIMENSIONAL STACKED NON-VOLATILE SEMICONDUCTOR MEMORY" filed on Mar. 19, 2009. Configurations are also described in U.S. patent application Ser. No. 12/406,524 "THREE DIMENSIONAL STACKED NONVOLATILE SEMICONDUCTOR MEMORY" filed on Mar. 18, 2009, U.S. patent application Ser. No. 12/679,991 "NON-VOLATILE SEMICONDUCTOR STORAGE DEVICE AND METHOD OF MANUFACTURING THE SAME" filed on Mar. 25, 2010, and U.S. patent application Ser. No. 12/532,030 "SEMICONDUCTOR MEMORY AND METHOD FOR MANUFACTURING SAME" filed on Mar. 23, 2009. These patent applications are incorporated by reference in this specification in their entirety.

1.1.4 Configuration of Column Control Circuit

The configuration of the column control circuit 140 will be described next with reference to FIG. 4. FIG. 4 is a circuit diagram of the column control circuit 140 and the string unit SU0 according to the first embodiment.

As shown in FIG. 4, the column control circuit 140 includes a sense unit SAU (SAU0 to SAU(L-1)) provided for each bit line BL.

Each of the sense units SAU includes a sense amplifier SA, an operation unit OP, and latch circuits ADL, BDL, CDL, and XDL.

The sense amplifier SA senses data read to the corresponding bit line BL, and applies a voltage to the bit line BL in accordance with write data. That is, the sense amplifier SA is a module that directly controls the bit line BL. At the time of reading, a strobe signal STB is given from, for example, the sequencer 170 to the sense amplifier SA. The sense amplifier SA incorporates a node SEN and a latch circuit (not shown in FIG. 4). The potential of the node SEN varies depending on whether the memory cell transistor MT connected to a selected word line is turned on or off. Whether the memory cell transistor MT is turned on or off is determined based on the timing of assertion of the signal STB and the potential of the node SEN. The result is held by the internal latch circuit as "0" or "1" data. The data held by the internal latch circuit is further transferred to one of the latch circuits ADL, BDL, CDL, and XDL.

The latch circuits ADL, BDL, and CDL temporarily hold read data and write data. The operation unit OP performs various logical operations such as a NOT operation, an OR operation, an AND operation, an XOR operation, and an XNOR operation for data held by the sense amplifier SA and the latch circuits ADL, BDL, CDL, and XDL. For example, the operation unit OP performs an operation for the data transferred from the internal latch circuit of the sense amplifier SA, thereby generating page data.

The sense amplifier SA, the latch circuits ADL, BDL, CDL, and XDL, and the operation unit OP are connected by a bus so as to transmit/receive data to/from each other. The bus is further connected to the latch circuit XDL.

Data input/output to/from the column control circuit 140 is done via the latch circuit XDL. That is, data received from the controller 200 is transferred to the latch circuits ADL, BDL, and CDL or the sense amplifier SA via the latch circuit XDL. In addition, data in the latch circuits ADL, BDL, and CDL or the sense amplifier SA is transmitted to the controller 200 via the latch circuit XDL. The latch circuit XDL functions as the cache memory of the NAND flash memory 100. Hence, even if the latch circuits ADL, BDL, and CDL are in use, the NAND flash memory 100 can be set in a ready state as long as the latch circuit XDL is free.

1.2 Reading Operation

The reading operation of the memory system according to the first embodiment will be described next.

1.2.1 Held Data and Threshold Voltage of Memory Cell Transistor

Figure 5:
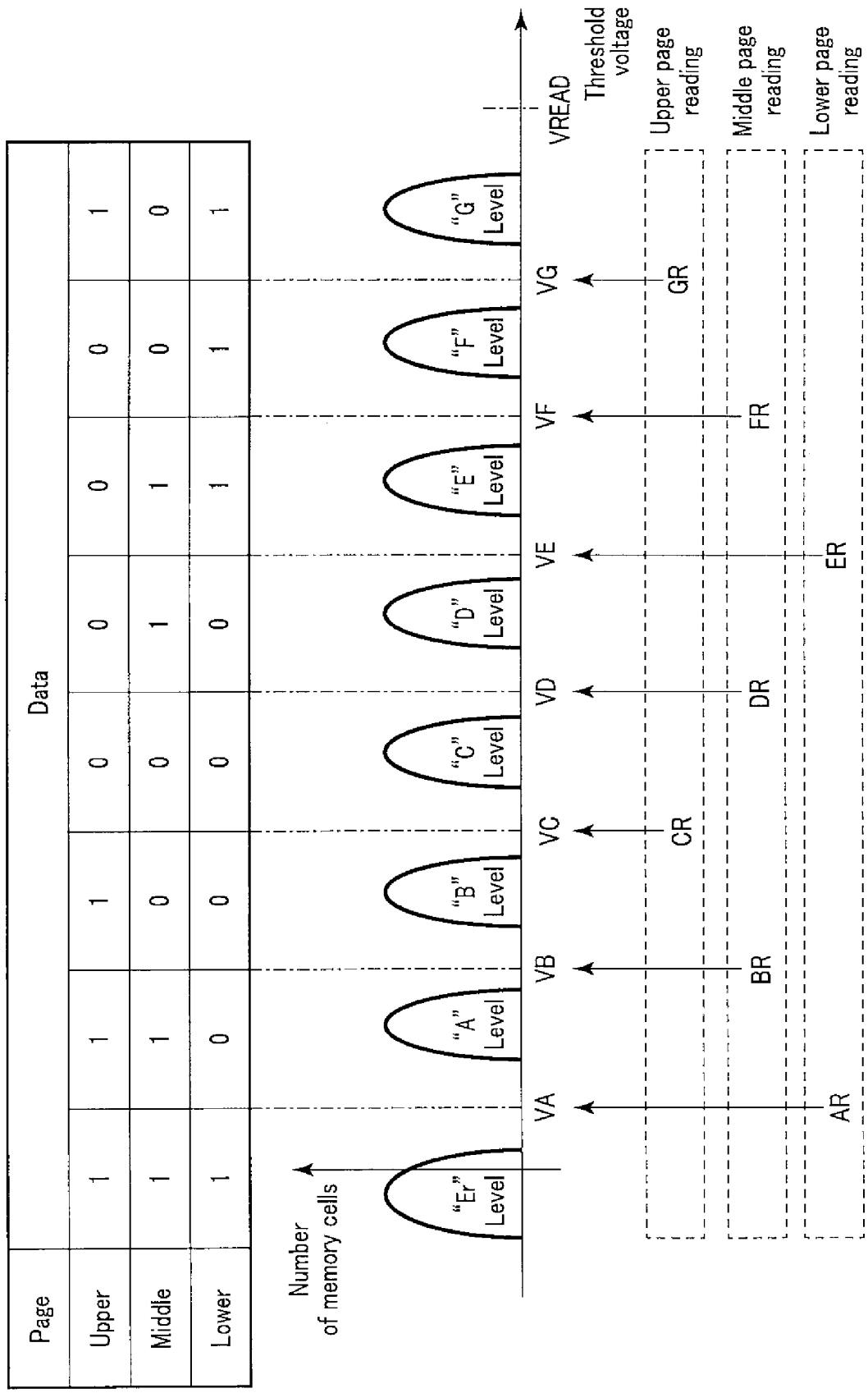
FIG. 5 is a diagram showing the distributions of threshold voltages of memory cell transistors according to the first embodiment.

The held data, threshold voltage, and data reading levels of the memory cell transistor MT will be described first with reference to FIG. 5. FIG. 5 is a diagram showing data that each memory cell transistor MT can take, threshold distributions, and voltages used at the time of reading.

As described above, the memory cell transistor MT can take eight states in accordance with the threshold voltage. The eight states will be referred to as an "Er" state, "A" state, "B" state, "C" state, . . . , and "G" state in ascending order of threshold voltage.

The threshold voltage of the memory cell transistor MT in the "Er" state is less than a voltage VA, and this state corresponds to a data erasing state. The threshold voltage of the memory cell transistor MT in the "A" state ranges from the voltage VA (inclusive) to a voltage VB (>VA) (exclusive). The threshold voltage of the memory cell transistor MT in the "B" state ranges from the voltage VB (inclusive) to a voltage VC (>VB) (exclusive). The threshold voltage of the memory cell transistor MT in the "C" state ranges from the voltage VC (inclusive) to a voltage VD (>VC) (exclusive). The threshold voltage of the memory cell transistor MT in the "D" state ranges from the voltage VD (inclusive) to a voltage VE (>VD) (exclusive). The threshold voltage of the memory cell transistor MT in the "E" state ranges from the voltage VE (inclusive) to a voltage VF (>VE) (exclusive). The threshold voltage of the memory cell transistor MT in the "F" state ranges from the voltage VF (inclusive) to a voltage VG (>VF) (exclusive). The threshold voltage of the memory cell transistor MT in the "G" state ranges from the voltage VG (inclusive) to a voltage VREAD (exclusive). Of the eight states distributed in this way, the "G" state is the state of the highest threshold voltage. Note that the voltage VREAD is the voltage applied to unselected word lines in the reading operation. This voltage turns on the memory cell transistor MT independently of held data. The voltages VA to VG will also be generically referred to as a voltage VCGRV.

The above-described threshold distributions are implemented by writing 3-bit (3-page) data formed from the above-described lower bit, middle bit, and upper bit. That is, the "Er" state to the "G" state and the lower bit, the middle bit, and the upper bit hold the following relationship.

"Er" state: "111" (the bits are arranged in the order of "upper/middle/lower")
"A" state: "110"
"B" state: "100"
"C" state: "000"
"D" state: "010"
"E" state: "011"
"F" state: "001"
"G" state: "101"

Between data corresponding to two adjacent states in the threshold distributions, only one of the three bits changes. Hence, when reading the lower bit, a voltage corresponding to the boundary where the value ("0" or "1") of the lower bit changes is used. This also applies to the middle bit and the upper bit.

That is, as shown in FIG. 5, in lower page reading, the voltage VA that discriminates between the "Er" state and the "A" state and the voltage VE that discriminates between the "D" state and the "E" state are used as reading levels. Reading operations using the voltages VA and VE will be referred to as reading operations AR and ER, respectively.

In the reading operation AR, it is determined whether the threshold voltage of the memory cell transistor MT is less than the voltage VA or not. That is, by the reading operation AR, the memory cell transistor MT in the erasing state is specified. In the reading operation ER, it is determined whether the threshold voltage of the memory cell transistor MT is less than the voltage VE or not.

In middle page reading, the voltage VB that discriminates between the "A" state and the "B" state, the voltage VD that discriminates between the "C" state and the "D" state, and the voltage VF that discriminates between the "E" state and the "F" state are used as reading levels. Reading operations using the voltages VB, VD, and VF will be referred to as reading operations BR, DR, and FR, respectively.

In the reading operation BR, it is determined whether the threshold voltage of the memory cell transistor MT is less than the voltage VB or not. In the reading operation DR, it is determined whether the threshold voltage of the memory cell transistor MT is less than the voltage VD or not. In the reading operation FR, it is determined whether the threshold voltage of the memory cell transistor MT is less than the voltage VF or not.

In upper page reading, the voltage VC that discriminates between the "B" state and the "C" state and the voltage VG that discriminates between the "F" state and the "G" state are used as reading levels. Reading operations using the voltages VC and VG will be referred to as reading operations CR and GR, respectively.

In the reading operation CR, it is determined whether the threshold voltage of the memory cell transistor MT is less than the voltage VC or not. In the reading operation GR, it is determined whether the threshold voltage of the memory cell transistor MT is less than the voltage VG or not. That is, by the reading operation GR, the memory cell transistor MT in the "G" state is specified.

1.2.2 Reading Method

A reading method according to the first embodiment will be described next. The reading method according to the first embodiment includes, for example, test reading, normal reading, and shift reading.

1.2.2.1 Test Reading

The test reading operation according to the first embodiment will be described first. In the test reading, for example, the reading operation is executed using a single special reading voltage. In the following explanation, a reading voltage used in the test reading will be discriminated from reading voltages in other reading operations by adding "t" to the end of reading voltage.

Figure 6:
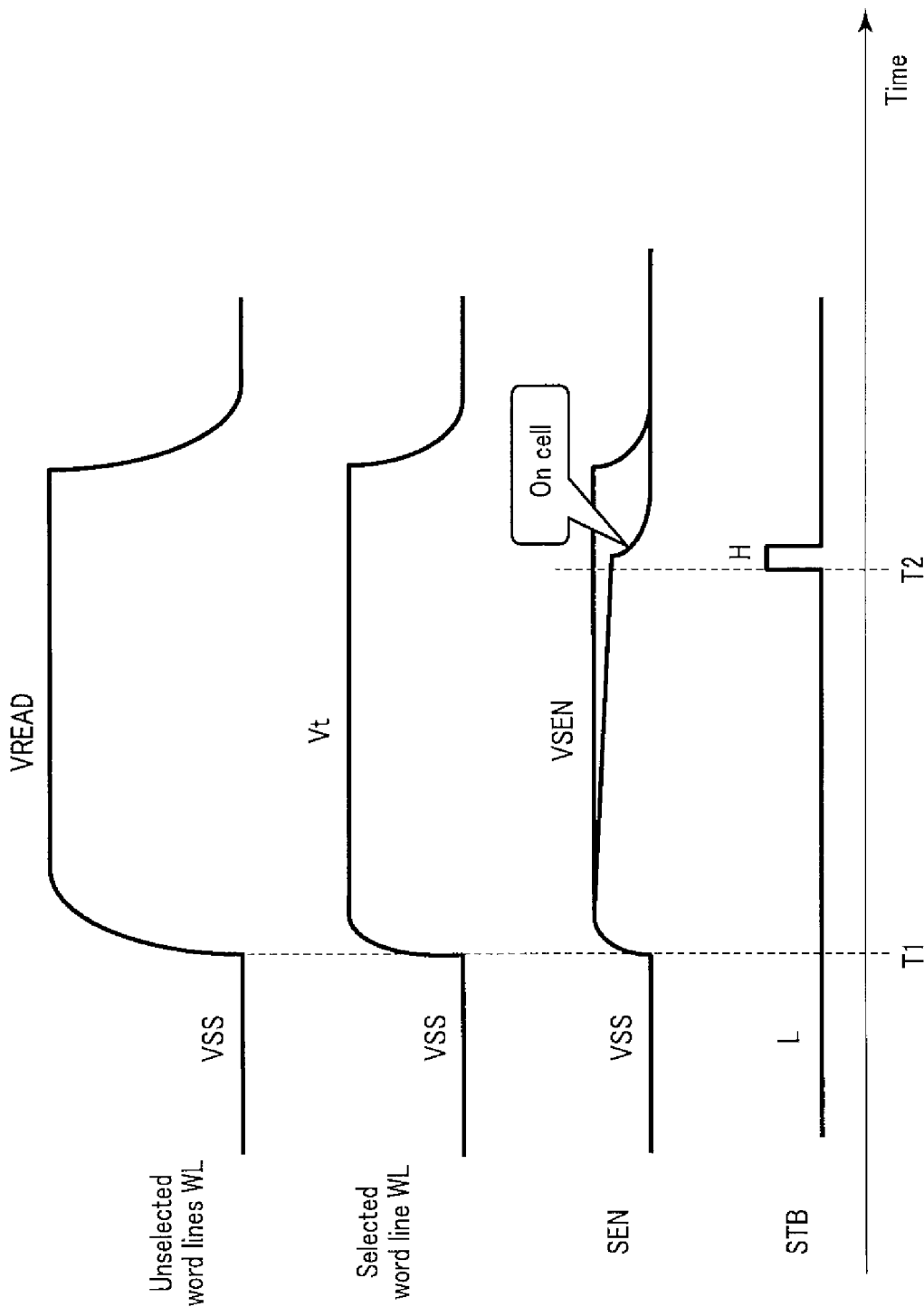
FIGS. 6 and 7 are timing charts showing a test reading operation and a normal reading operation according to the first embodiment, respectively.

FIG. 6 is a timing chart showing unselected word lines, a selected word line, the node SEN, and the signal STB in the NAND flash memory 100 so as to explain the outline of the test reading operation according to the first embodiment.

As shown in FIG. 6, in the test reading, the row decoder 120 applies a certain voltage Vt to the selected word line WL at time T1. During this time, the row decoder 120 also applies the voltage VREAD to the unselected word lines, and the node SEN in the sense amplifier SA is charged to a potential VSEN higher than a voltage VSS. At time T2 during the application of the voltage Vt to the selected word line WL, the sequencer 170 asserts the signal STB ("H" level in the example of FIG. 6).

For example, when the voltage Vt is applied to the selected word line WL to turn on the memory cell transistor MT, a current flows from the bit line BL to the source line SL. As a result, the node SEN is discharged, and the potential of the node SEN lowers. The sense amplifier SA asserts the signal STB at the time T2, thereby fetching the state of the node SEN to the internal latch circuit. That is, if the potential of the node SEN is low, one of data "0" and data "1" is stored in the latch circuit. If a predetermined potential or more is maintained, the other of data "0" and data "1" is held by the latch circuit.

As described above, in the test reading, data is determined by the single special reading level (voltage Vt).

1.2.2.2 Normal Reading

The normal reading operation according to the first embodiment will be described next. Unlike the "test reading", "normal reading" means an operation of reading data using a predetermined (default) reading voltage when reading data.

Figure 7:
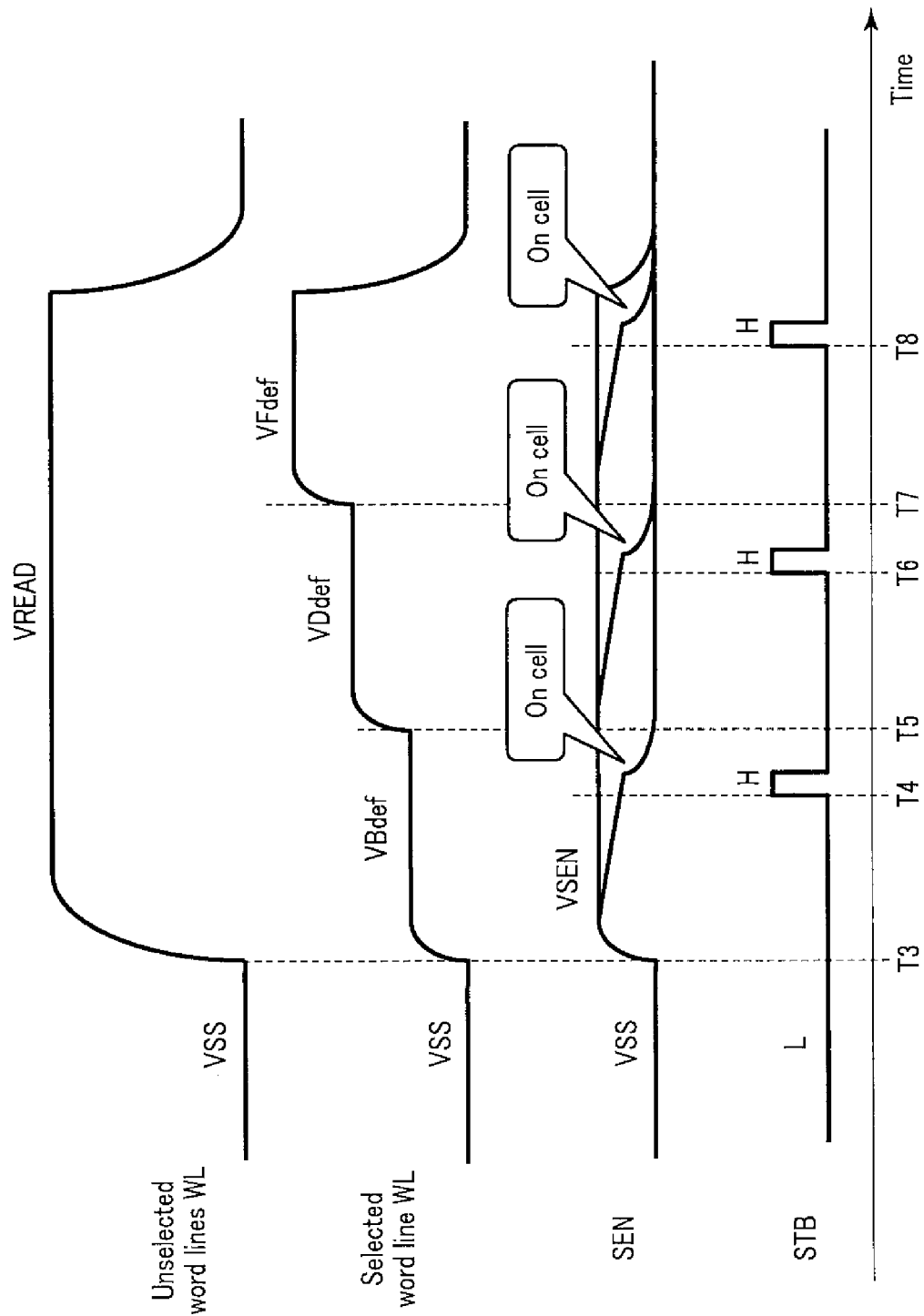

FIG. 7 is a timing chart showing unselected word lines, a selected word line, the node SEN, and the signal STB in the NAND flash memory 100 so as to explain the outline of the normal reading operation according to the first embodiment. FIG. 7 shows, as an example, a case in which the middle page is read.

As shown in FIG. 7, in middle page reading, the row decoder 120 applies a voltage VBdef to the selected word line WL at time T3, a voltage VDdef at time T5, and a voltage VFdef at time T7. During this time, the row decoder 120 also applies the voltage VREAD to the unselected word lines, and the node SEN in the sense amplifier SA is charged to the potential VSEN higher than the voltage VSS. In the periods when the voltages VBdef, VDdef, and VFdef are applied to the selected word line WL, the sequencer 170 asserts the signal STB once in each period, that is, at times T4, T6, and T8.

For example, when the voltage VB is applied to the selected word line WL to turn on the memory cell transistor MT, the sense amplifier SA asserts the signal STB at the time T4, thereby fetching the state of the node SEN to the latch circuit. This also applies to a case in which the voltage VDdef or VFdef is applied to the selected word line WL. The sense amplifier SA asserts the signal STB at each of the times T6 and T8, thereby causing the latch circuit to hold data based on the potential of the node SEN.

The operation unit OP performs arithmetic processing using data based on the three reading levels held by the latch circuit, thereby generating read data of one page.

As described above, in the middle data reading, data is determined by the three reading levels (the voltages VBdef, VDdef, and VFdef).

Note that in lower data reading and upper data reading, data is determined by two reading levels (voltages VAdef and VEdef in lower data reading, and voltages VCdef and VGdef in upper data reading).

1.2.2.3 Shift Reading

A shift reading operation according to the first embodiment will be described next. Shift reading is executed when, for example, data cannot be correctly read by normal reading.

In FIG. 5 described above, the threshold voltage distributions of data are independent of each other. Hence, when the voltage VCGRV serving as a reading voltage is set between the threshold voltage distributions of the data, correct data can be read by normal reading.

However, the threshold voltage of the memory cell transistor MT can vary due to various factors. As a result, the threshold voltage distribution of each data in FIG. 5 may move or may have a larger distribution width, and adjacent distributions may overlap. FIG. 8 shows this state. For example, assume that the threshold voltage distributions of the "A" state and the "B" state immediately after writing are those shown in the upper view of FIG. 8. However, the threshold voltage distributions are assumed to be expanded by a disturbance or the like, as shown in the lower view of FIG. 8. If reading is performed using the initially set reading voltage VBdef, read data of the memory cell transistor MT corresponding to the hatched region results in an error. If the number of error bits exceeds the number of error-correctable bits of the ECC circuit 260, the data cannot properly be corrected.

In this case, a voltage (for example, a voltage VB' that minimizes the overlap between the threshold voltage distributions) that makes the overlap between the threshold voltage distributions of the two levels smaller is preferably set as a new reading voltage such that the number of error bits becomes small. A reading operation performed by setting, as the reading voltage, a voltage (for example, the voltage VB') shifted from a predetermined voltage (for example, the voltage VBdef) in normal reading by a certain value (to be also referred to as a "shift amount") is called shift reading. As described above, the shift reading is a reading method of changing the reading voltage relative to normal reading. The shift reading is the same as the normal reading from the viewpoint of reading the data of a target page, although a reading voltage different from a predetermined voltage is used.

1.2.3 M-point Vth Tracking Operation

To minimize the number of error bits in data reading, the shift reading is preferably performed using a voltage (for example, the voltage VB' in the lower view of FIG. 8) at a valley position where the overlap between the threshold voltage distributions of two levels is minimum. In the following explanation, a valley position voltage will be discriminated from reading voltages in other reading operations by adding "'" to the end of the reading voltage of each level. An operation (M-point Vth tracking operation) of detecting and estimating the valley position voltage VCGRV' will be described below.

1.2.3.1 Vth Tracking Operation Vth tracking will be described before an explanation of an operation including the M-point Vth tracking operation according to the first embodiment. Vth tracking is a basic concept that constitutes the M-point Vth tracking operation.

Figure 9:
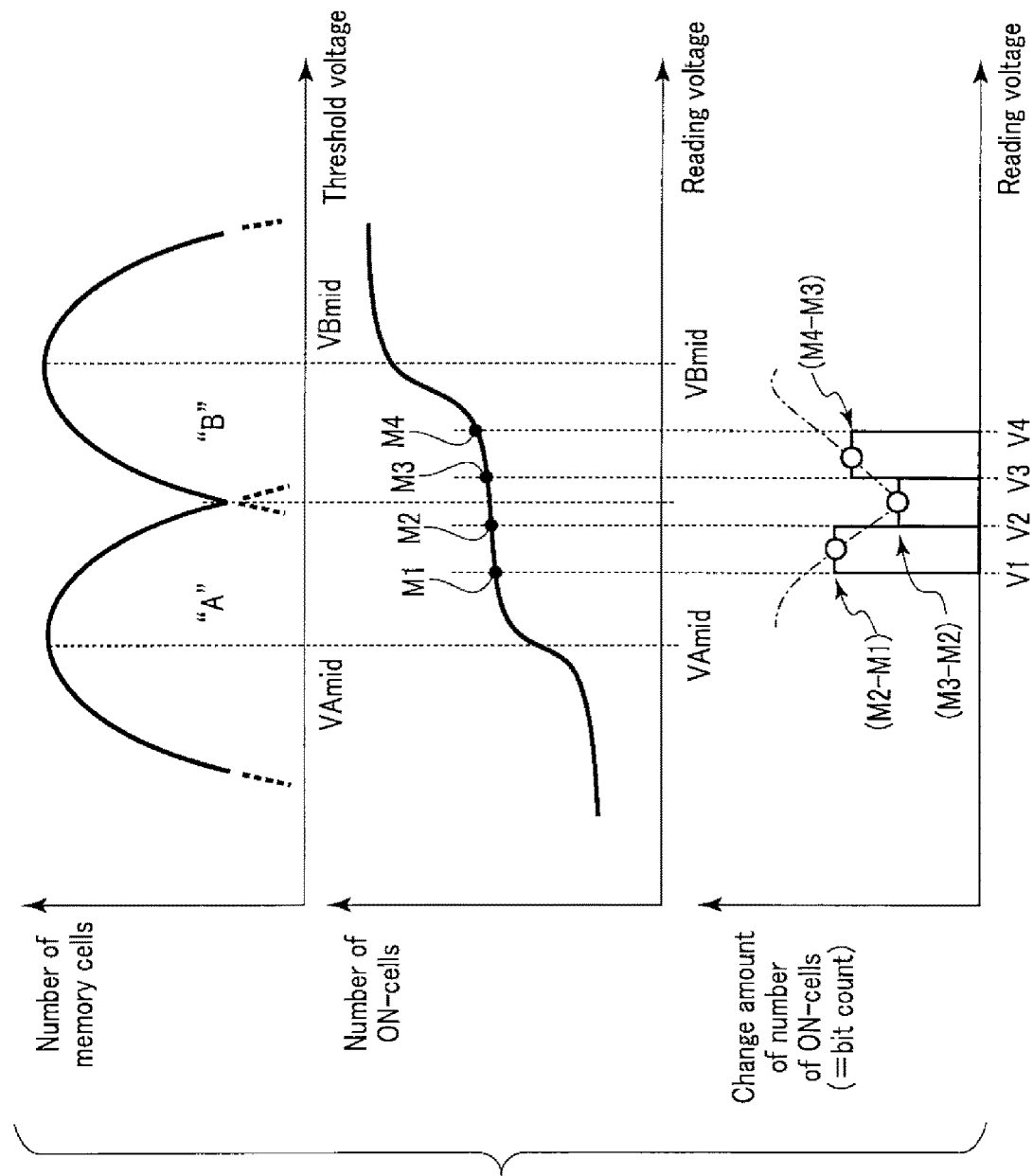
FIG. 9 is a schematic view showing a Vth tracking operation according to the first embodiment.

FIG. 9 is a schematic view for explaining Vth tracking. The upper view of FIG. 9 is a graph showing the threshold voltage distributions of the "A" state and the "B" state as an example of the threshold voltage distributions of the memory cell transistors MT. The middle view of FIG. 9 is a graph showing the transition of the number of memory cells (the number of ON cells) in the ON state with respect to a certain reading voltage. The lower view of FIG. 9 is a histogram showing the change amount of the number of ON cells in the range of each reading voltage. Note that the middle and lower views of FIG. 9 are plotted in correspondence with the memory cell transistors MT having the threshold voltage distributions shown in the upper view of FIG. 9.

As shown in the middle view of FIG. 9, when the reading voltage is raised, the number of ON cells abruptly increases at a voltage slightly lower than a voltage VAmid that is the median of the "A" state, and dM/dV is maximized. Here, the median is the voltage of the highest threshold voltage distribution probability in the upper view of FIG. 9, M is the number of ON cells, and V is the reading voltage applied to the selected word line WL. If the reading voltage is further raised, the increasing rate of the number of ON cells lowers and minimizes in a certain value. If the threshold voltage distribution of the "A" state and the threshold voltage distribution of the "B" state do not overlap, the increasing rate at the reading voltage becomes zero. On the other hand, if the threshold voltage distributions overlap, the increasing rate takes a predetermined minimum value (>0) that is not zero. If the reading voltage is further raised, the increasing rate of the number of ON cells increases again, and dM/dV is maximized again at a voltage slightly lower than a voltage VBmid that is the median of the "B" state.

Based on the above-described change of the cumulative value of the number of ON cells, the valley position between the two levels, that is, the position of the reading voltage at which the overlap between the threshold voltage distributions of the two levels is minimized can be detected. For example, first, the reading operation is performed using a reading voltage V1. Let M1 be the number of ON cells at this time. Next, the reading operation is performed using a voltage V2 higher than the voltage V1 by ΔV. Let M2 be the number of ON cells at this time. Then, the number of memory cell transistors MT turned on newly when the reading voltage applied to the selected word line WL rises from V1 to V2 is (M2−M1).

Next, the reading operation is performed using a voltage V3 higher than the voltage V2 by ΔV. Let M3 be the number of ON cells at this time. Then, the number of memory cell transistors MT turned on newly when the reading voltage applied to the selected word line WL rises from V2 to V3 is (M3−M2). If (M2−M1)>(M3−M2), the voltage that minimizes dM/dV is probably higher than the voltage V2.

Next, the reading operation is performed using a voltage V4 higher than the voltage V3 by ΔV. The number of ON cells at this time is M4. If (M3−M2)>(M4−M3), a histogram as shown in the lower view of FIG. 9 is obtained.

As a result, based on the change amount of the number of ON cells, the threshold voltage distribution as indicated by the one-dot dashed line in the lower view of FIG. 9 can be estimated, and the valley position between the "A" state and the "B" state exists between the voltage V2 and the voltage V3.

The change amount of the number of ON cells (bit count) is extracted by, for example, changing the reading voltage and thus tracking the change in the number of bits in read data per page. These operations will be generically referred to as Vth tracking.

1.2.3.2 Outline of M-Point Vth Tracking Operation

Figure 10:
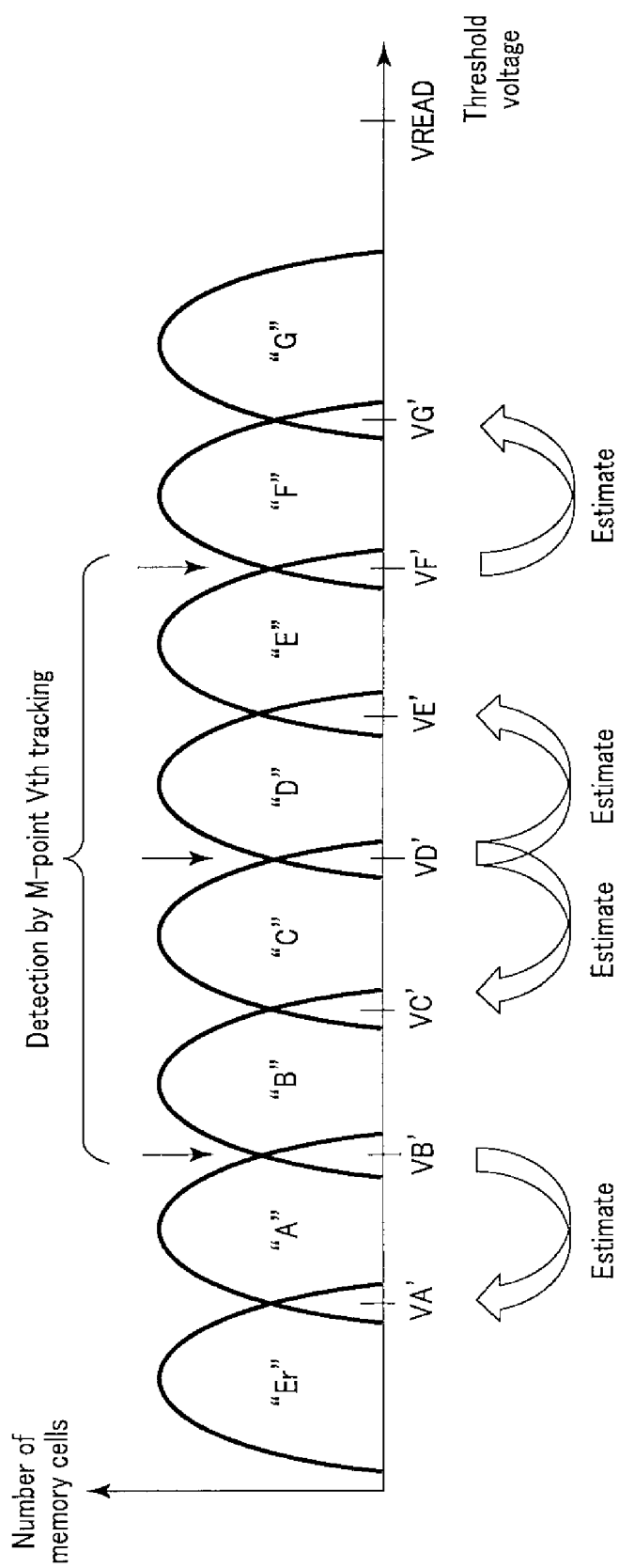
FIG. 10 is a schematic view showing an M-point Vth tracking operation according to the first embodiment.

The outline of the M-point Vth tracking operation according to the first embodiment will be described next. As shown in FIG. 10, in the first embodiment, the valley positions between the "A" state and the "B" state, between the "C" state and the "D" state, and between the "E" state and the "F" state are detected by the M-point Vth tracking operation. The remaining valley positions are estimated based on the information about the detected valley positions.

Figure 11:
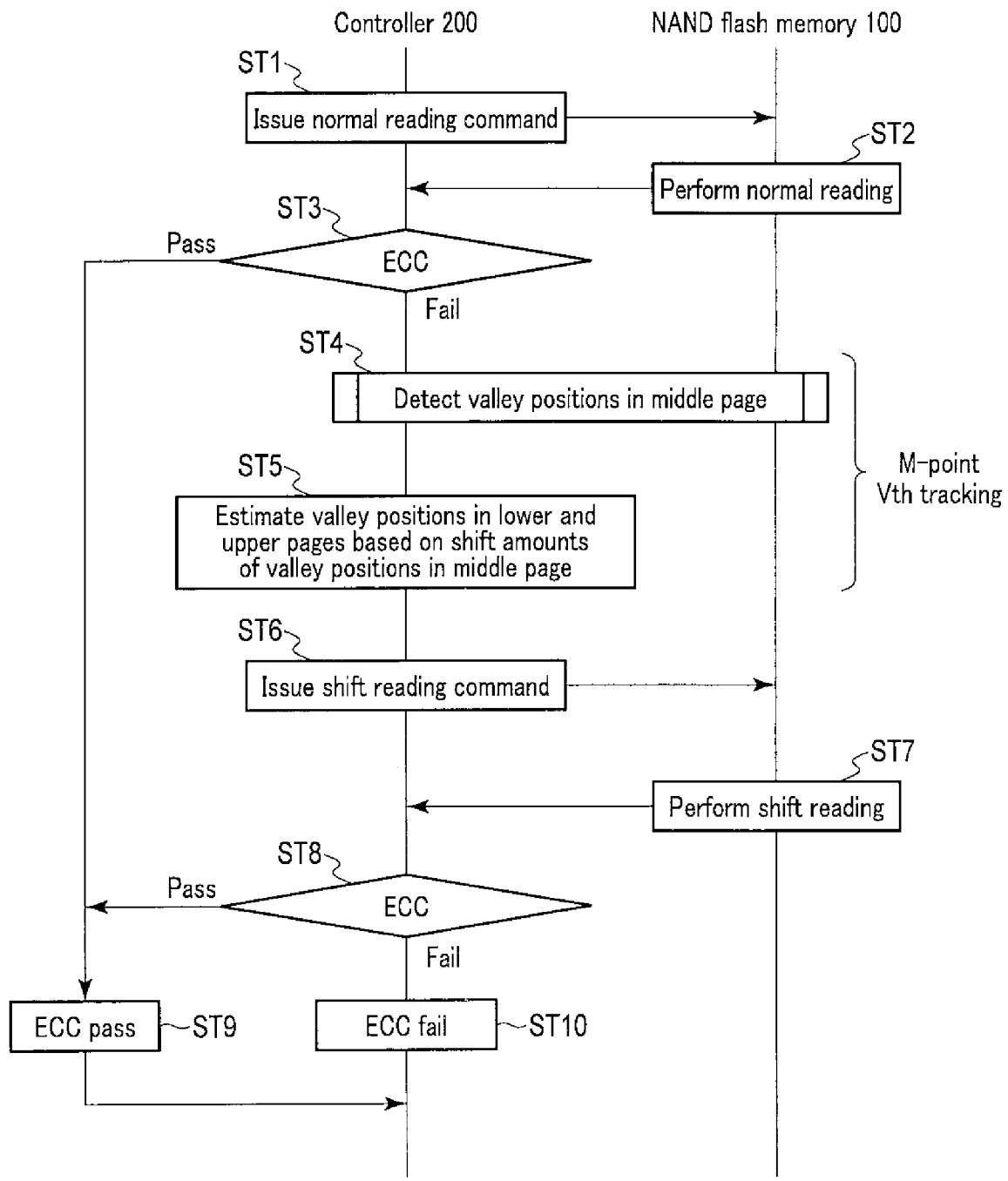
FIGS. 11 and 12 are flowcharts of an operation including the M-point Vth tracking operation according to the first embodiment.

FIG. 11 is a flowchart for explaining an operation including the M-point Vth tracking operation according to the first embodiment.

As shown in FIG. 11, in step ST1, the controller 200 issues a normal reading command using the predetermined reading voltage VCGRV to the NAND flash memory 100.

In step ST2, the NAND flash memory 100 executes normal reading and transmits read data to the controller 200.

In step ST3, the ECC circuit 260 executes ECC based on the read data of normal reading. If the read data of normal reading passes ECC (pass in step ST3), the controller 200 advances to step ST9. If the read data fails in ECC (fail in step ST3), the controller 200 advances to step ST4.

In steps ST4 and ST5, the controller 200 and the NAND flash memory 100 perform the M-point Vth tracking operation. The M-point Vth tracking operation according to the first embodiment includes a valley position detection operation and a valley position estimation operation.

More specifically, in step ST4, the controller 200 and the NAND flash memory 100 detect valley position voltages VB', VD', and VF' at the valley positions in the middle page. Details of the valley position detection operation will be described later.

In step ST5, the controller 200 estimates valley position voltages VA', VC', VE', and VG' at the valley positions in the lower page and the upper page. The valley position voltages VA', VC', VE', and VG' are estimated based on the shift amounts between the valley position voltages VB', VD', and VF' detected in step ST4 and the reading voltages VBdef, VDdef, and VFdef. Details of the valley position estimation operation will be described later.

In step ST6, the controller 200 issues a shift reading command using the detected and estimated valley position voltage VCGRV' to the NAND flash memory 100.

In step ST7, the NAND flash memory 100 executes shift reading and transmits optimum read data to the controller 200.

In step ST8, the ECC circuit 260 executes ECC based on the read data of shift reading. If the read data of shift reading passes ECC (pass in step ST8), the controller 200 advances to step ST9. If the read data fails in ECC (fail in step ST8), the controller 200 advances to step ST10.

In steps ST9, the controller 200 acquires the status of ECC pass, and ends the operation. In step ST10, the controller 200 determines based on the ECC result that the data cannot properly be corrected, and ends the operation.

The operation including the M-point Vth tracking operation thus ends.

1.2.3.3 Valley Position Detection Operation

The valley position detection operation will be described next.

1.2.3.3.1 Flowchart

Figure 12:
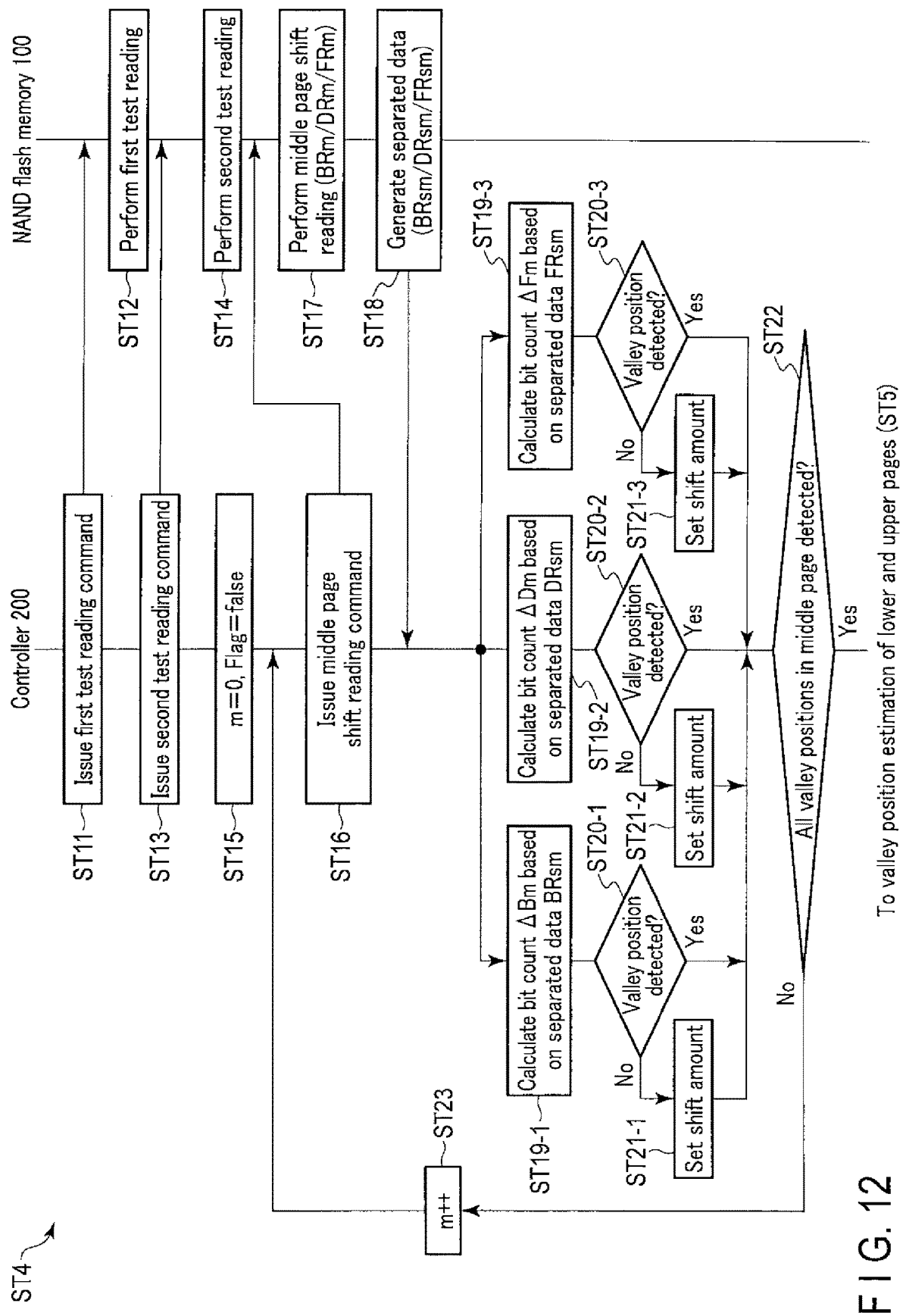

FIG. 12 is a flowchart showing the valley position detection operation according to the first embodiment. FIG. 12 corresponds to step ST4 in FIG. 11.

As shown in FIG. 12, in step ST11, the controller 200 issues a first test reading command to the NAND flash memory 100.

In step ST12, the NAND flash memory 100 executes first test reading, and reads read data TM1. The NAND flash memory 100 holds the read data TM1 in one of the latch circuits ADL, BDL, and CDL.

In step ST13, the controller 200 issues a second test reading command to the NAND flash memory 100.

In step ST14, the NAND flash memory 100 executes second test reading, and reads read data TM2. The NAND flash memory 100 holds the read data TM2 in one of the latch circuits ADL, BDL, and CDL. The latch circuit used here is a latch circuit that does not hold the data TM1. Hence, the column control circuit 140 holds the data TM1 and TM2 at this point of time.

In step ST15, the controller 200 initializes loop processing to be executed in steps ST16 to ST23 (m=0, Flag=false). That is, a value "m" is an integer of "0" or more, which represents the progress state of loop processing in the valley position detection operation (m≥0). In the following explanation, loop processing in which m0 is set to the value m will be referred to as "(m0)th loop processing" or "loop processing of m=m0" for the sake of convenience.

The flag "Flag" is set to switch the reading voltage search direction in the loop processing. More specifically, if the flag "Flag" is "false", the reading voltage search direction is set such that the reading voltage decreases (monotonically decreases) along with the progress of loop processing. On the other hand, if the flag "Flag" is "true", the reading voltage search direction is set such that the reading voltage increases (monotonically increases) along with the progress of loop processing.

In step ST16, the controller 200 issues a shift reading command for the middle page to the NAND flash memory 100.

In step ST17, the NAND flash memory 100 executes shift reading for the middle page, and reads read data BRm/DRm/FRm (BR0/DR0/FR0, BR1/DR1/FR1, . . . ) in the mth loop processing. The NAND flash memory 100 holds the reading voltage BRm/DRm/FRm in the latch circuit. The read data BRm/DRm/FRm in the mth loop processing corresponds to the result of shift reading of the middle page using voltages VBm, VDm, and VFm. For this reason, the read data BRm/DRm/FRm has, in each bit, data "0" or "1" based on the relationship between the threshold voltage of the corresponding memory cell transistor MT and the voltages VBm, VDm, and VFm.

In step ST18, the NAND flash memory 100 generates separated data BRsm (BRs0, BRs1, . . . ), DRsm (DRs0, DRs1, . . . ), and FRsm (FRs0, FRs1, . . . ) based on the read data TM1, TM2, and BRm/DRm/FRm held by the latch circuits. The NAND flash memory 100 then transmits the separated data BRsm, DRsm, and FRsm to the controller 200. The separated data BRsm, DRsm, and FRsm have partial information of the read data BRm/DRm/FRm. Details of the separated data BRsm, DRsm, and FRsm will be described later.

In step ST19 (steps ST19-1, ST19-2, and ST19-3), the controller 200 calculates bit counts ΔBm, ΔDm, and ΔFm based on the separated data BRsm, DRsm, and FRsm, respectively.

In step ST20, the controller 200 executes a valley position detection determination operation. More specifically, in step ST20 (steps ST20-1, ST20-2, and ST20-3), the controller 200 determines whether the valley position between the "A" state and the "B" state, the valley position between the "C" state and the "D" state, and the valley position between the "E" state and the "F" state are detected. Upon determining that the valley positions are not detected (NO in step ST20), the controller 200 advances to step ST21 (steps ST21-1, ST21-2, and ST21-3) to set a shift amount to be applied to shift reading in the (m+1)th loop processing and then advances to step ST22. Upon determining that the valley positions are detected (YES in step ST20), the controller 200 advances to step ST22.

In step ST22, the controller 200 determines whether all valley positions concerning the middle data are detected. Upon determining that all valley positions concerning the middle data are not detected (NO in step ST22), the controller 200 advances to step ST23 to increment the number of loops and then returns to step ST16. Upon determining that all valley positions concerning the middle data are detected (YES in step ST22), the controller 200 advances to step ST5 to subsequently estimate valley positions in the lower page and the upper page.

The valley position detection operation thus ends.

1.2.3.3.2 Separated Data

Figure 13:
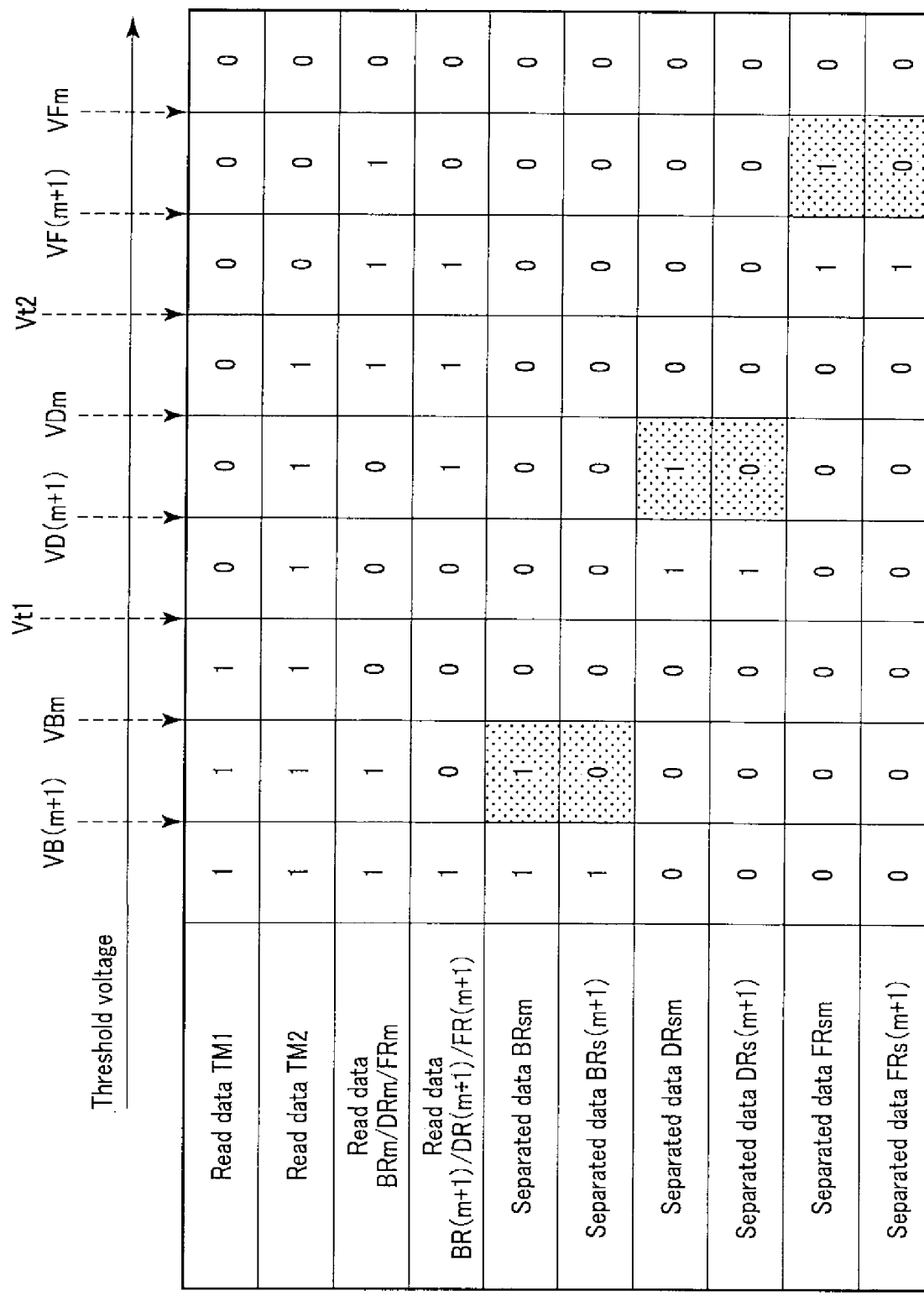
FIG. 13 is a table showing separated data according to the first embodiment.

Separated data used in the valley position detection operation according to the first embodiment will be described next with reference to FIG. 13. FIG. 13 shows the read data TM1 of the first test reading, the read data TM2 of the second test reading, the read data BRm/DRm/FRm and BR(m+1)/DR(m+1)/FR(m+1) of the shift reading, and the separated data BRsm, BRs(m+1), DRsm, DRs(m+1), FRsm, and FRs(m+1). That is, FIG. 13 corresponds to steps ST12, ST14, ST17, and ST18 of FIG. 12.

As shown in FIG. 13, if the threshold voltage of the memory cell transistor MT is less than a voltage Vt1, the read data TM1 is data "1" in this example. If the threshold voltage is not less than the voltage Vt1, the read data TM1 is data "0". In addition, if the threshold voltage of the memory cell transistor MT is less than a voltage Vt2, the read data TM2 is data "1". If the threshold voltage is not less than the voltage Vt2, the read data TM2 is data "0".

If the threshold voltage of the memory cell transistor MT is less than the voltage VBm, the read data BRm/DRm/FRm is data "1". If the threshold voltage ranges from than the voltage VBm (inclusive) to the voltage VDm (exclusive), the read data BRm/DRm/FRm is data "0". If the threshold voltage ranges from than the voltage VDm (inclusive) to the voltage VFm (exclusive), the read data BRm/DRm/FRm is data "1". If the threshold voltage is not less than the voltage VFm, the read data BRm/DRm/FRm is data "0". This also applies to the read data BR(m+1)/DR(m+1)/FR(m+1).

The separated data BRsm and BRs(m+1) are, for example, data "1" if the threshold voltage of the memory cell transistor MT is less than the voltage VBm and if the threshold voltage is less than the voltage VB(m+1), respectively. The separated data BRsm and BRs(m+1) are data "0" if the threshold voltage is not less than the voltage VBm and if the threshold voltage is not less than the voltage VB(m+1), respectively. That is, the number of separated data BRsm that are data "1" corresponds to the number of memory cell transistors MT whose threshold voltage is less than the voltage VBm.

If the threshold voltage of the memory cell transistor MT ranges from the voltage Vt1 (inclusive) to the voltage VDm (exclusive), the separated data DRsm is data "1". If the threshold voltage is less than the voltage Vt1 or not less than the voltage VDm, the separated data DRsm is data "0". If the threshold voltage of the memory cell transistor MT ranges from the voltage Vt1 (inclusive) to the voltage VD(m+1) (exclusive), the separated data DRs(m+1) is data "1". If the threshold voltage is less than the voltage Vt1 or not less than the voltage VD(m+1), the separated data DRs(m+1) is data "0". That is, the number of separated data DRsm that are data "1" corresponds to the number of memory cell transistors MT whose threshold voltage ranges from the voltage Vt1 (inclusive) to the voltage VDm (exclusive).

If the threshold voltage of the memory cell transistor MT ranges from the voltage Vt2 (inclusive) to the voltage VFm (exclusive), the separated data FRsm is data "1". If the threshold voltage is less than the voltage Vt2 or not less than the voltage VFm, the separated data FRsm is data "0". If the threshold voltage of the memory cell transistor MT ranges from the voltage Vt2 (inclusive) to the voltage VF(m+1) (exclusive), the separated data FRs(m+1) is data "1". If the threshold voltage is less than the voltage Vt2 or not less than the voltage VF(m+1), the separated data FRs(m+1) is data "0". That is, the number of separated data FRsm that are data "1" corresponds to the number of memory cell transistors MT whose threshold voltage ranges from the voltage Vt2 (inclusive) to the voltage VFm (exclusive).

For this reason, in step ST19 of FIG. 12, by comparing the separated data BRsm with BRs(m+1), the controller 200 can monitor, as a bit count $\Delta B(m+1)$, the number of memory cells each having a threshold voltage between the voltage VBm and the voltage VB(m+1). Similarly, by comparing the separated data DRsm with DRs(m+1), the controller 200 can monitor, as a bit count $\Delta D(m+1)$, the number of memory cells each having a threshold voltage between the voltage VDm and the voltage VD(m+1). Similarly, by comparing the separated data FRsm with FRs(m+1), the controller 200 can monitor, as a bit count $\Delta F(m+1)$, the number of memory cells each having a threshold voltage between the voltage VFm and the voltage VF(m+1).

Note that the separated data BRsm is generated based on, for example, the read data TM1 and BRm/DRm/FRm. The operation unit OP performs, for example, the AND operation between the read data TM1 and the read data BRm/DRm/FRm, thereby generating the separated data BRsm (BRsm=TM1 AND (BRm/DRm/FRm)).

In addition, the separated data DRsm is generated based on, for example, the read data TM1, TM2, and BRm/DRm/FRm. The operation unit OP performs, for example, the AND operation between an AND operation result (–TM1 AND TM2) between a NOT operation result –TM1 of the read data TM1 and the read data TM2 a NOT operation result (–BRm/DRm/FRm) of the read data BRm/DRm/FRm, thereby generating the separated data DRsm (DRsm=(–TM1 AND TM2) AND (–BRm/DRm/FRm))).

Furthermore, the separated data FRsm is generated based on, for example, the read data TM2 and BRm/DRm/FRm. The operation unit OP performs, for example, the AND operation between a NOT operation result –TM2 of the read data TM2 and the read data BRm/DRm/FRm, thereby generating the separated data FRsm (FRsm=(–TM2 AND (BRm/DRm/FRm)).

Note that the above-described manner the separated data BRsm, DRsm, and FRsm are defined by the operation unit OP is an example, and an arbitrary manner of definition can be applied.

1.2.3.3.3 Valley Position Detection Determination Operation

Figure 14:
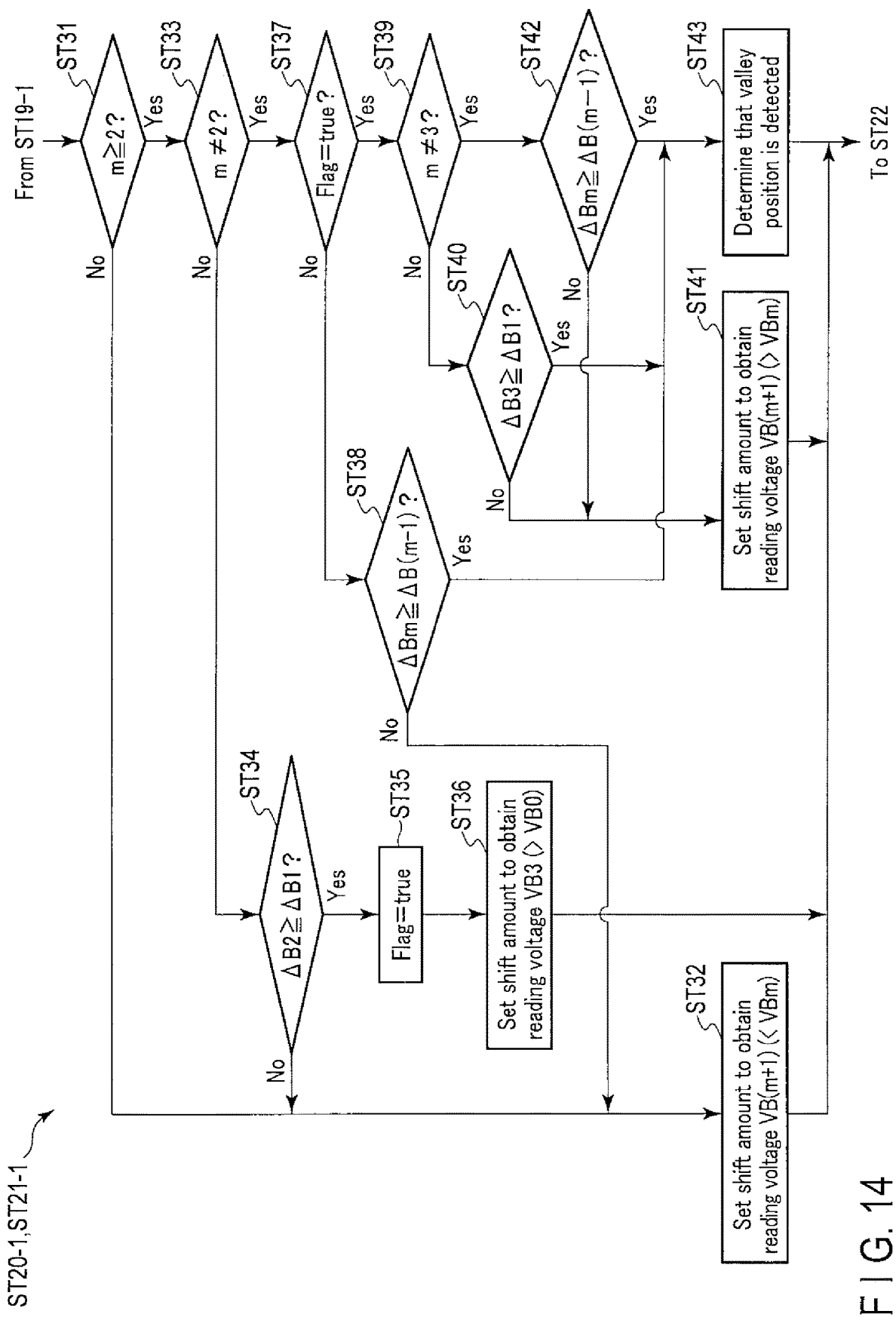
FIG. 14 is a flowchart showing a valley position detection operation according to the first embodiment.

The valley position detection determination operation according to the first embodiment will be described next. FIG. 14 is a flowchart showing the valley position detection determination operation according to the first embodiment. This detection determination operation is applied to a case in which any of the valley position voltages VB', VD', and VF' is detected. FIG. 14 shows, as an example, a case in which detection of the valley position voltage VB' is determined. That is, of the steps of FIG. 14, steps ST31, ST33, ST37 to ST40, and ST42 to ST43 correspond to step ST20-1 of FIG. 12, and steps ST32, ST34 to ST36, ST41, and ST43 correspond to step ST21-1 of FIG. 12. Assuming that the bit count $\Delta Bm$ in the mth loop processing is calculated in step ST19-1 before the steps of FIG. 14, steps ST31 to ST40 following step ST19-1 will be described below.

As shown in FIG. 14, in step ST31, the controller 200 determines whether the value m is "2" or more. Upon determining that the value m is not "2" or more (m=0 or 1) (NO in step ST31), the controller determines that a valley position is not detected, and advances to step ST32. Upon determining that the value m is "2" or more (m≥2) (YES in step ST31), the controller advances to step ST33.

In step ST32, the controller 200 determines that a valley position is not detected in the mth loop processing, and sets the shift amount of the reading voltage VB(m+1) applied to middle page shift reading in the (m+1)th loop processing.

The shift amount is set such that the reading voltage VB(m+1) becomes lower than the reading voltage VBm applied to the mth loop processing (VB(m+1)<VBm). When the shift amount setting in step ST32 is completed, the controller 200 advances to step ST22.

In step ST33, the controller 200 determines whether the value m is not equal to "2". Upon determining that the value m is equal to "2" (m=2) (NO in step ST33), the controller advances to step ST34. Upon determining that the value m is not equal to "2" (m>2) (YES in step ST33), the controller advances to step ST36.

In step ST34, the controller 200 determines whether a bit count ΔB2 is not less than a bit count ΔB1. Upon determining that the bit count ΔB2 is less than the bit count ΔB1 (ΔB2<ΔB1) (NO in step ST34), the controller 200 advances to step ST32. Upon determining that the bit count ΔB2 is not less than the bit count ΔB1 (ΔB2≥ΔB1) (YES in step ST34), the controller 200 advances to step ST35.

In step ST35, the controller 200 sets the flag Flag used to switch the reading voltage search direction in the subsequent loop processing from monotone decreasing to monotone increasing to "true".

In step ST36, the controller 200 determines that a valley position is not detected in the loop processing of m=2, and sets the shift amount of a reading voltage VB3 applied to middle page shift reading in the loop processing of m=3. The shift amount is set such that the reading voltage VB3 becomes higher than a reading voltage VB0 applied to the loop processing of m=0 (VB3>VB0). When the shift amount setting in step ST36 is completed, the controller 200 advances to step ST22.

In step ST37, the controller 200 determines whether the flag Flag set in the mth loop processing is "true". Upon determining that the flag Flag is "false" (NO in step ST37), the controller 200 advances to step ST38. If the flag Flag is "true" (YES in step ST37), the controller 200 advances to step ST39.

In step ST38, the controller 200 determines whether a bit count ΔBm is not less than a bit count ΔB(m−1). Upon determining that the bit count ΔBm is less than the bit count ΔB(m−1) (ΔBm<ΔB(m−1)) (NO in step ST38), the controller 200 advances to step ST32. Upon determining that the bit count ΔBm is not less than the bit count ΔB(m−1) (ΔBm≥ΔB(m−1)) (YES in step ST38), the controller 200 advances to step ST43.

In step ST39, the controller 200 determines whether the value m is not equal to "3". Upon determining that the value m is equal to "3" (m=3) (NO in step ST39), the controller advances to step ST40. Upon determining that the value m is not equal to "3" (m>3) (YES in step ST39), the controller advances to step ST42.

In step ST40, the controller 200 determines whether a bit count ΔB3 is not less than the bit count ΔB1. Upon determining that the bit count ΔB3 is less than the bit count ΔB1 (ΔB3<ΔB1) (NO in step ST40), the controller 200 advances to step ST41. Upon determining that the bit count ΔB3 is not less than the bit count ΔB1 (ΔB3≥ΔB1) (YES in step ST40), the controller 200 advances to step ST43.

In step ST41, the controller 200 determines that a valley position is not detected in the mth loop processing, and sets the shift amount of the reading voltage VB(m+1) applied to middle page shift reading in the loop processing of (m+1)≥4. The shift amount is set such that the reading voltage VB(m+1) becomes higher than the reading voltage VBm applied to the loop processing of m≥3 (VB(m+1)>VBm). When the shift amount setting in step ST41 is completed, the controller 200 advances to step ST22.

In step ST42, the controller 200 determines whether the bit count ΔBm is not less than the bit count ΔB(m−1). Upon determining that the bit count ΔBm is less than the bit count ΔB(m−1) (ΔBm<ΔB(m−1)) (NO in step ST42), the controller 200 advances to step ST41. Upon determining that the bit count ΔBm is not less than the bit count ΔB(m−1) (ΔBm≥ΔB(m−1)) (YES in step ST42), the controller 200 advances to step ST43.

In step ST43, the controller 200 determines that a valley position is detected in the mth loop processing, and advances to step ST22.

Figure 15:
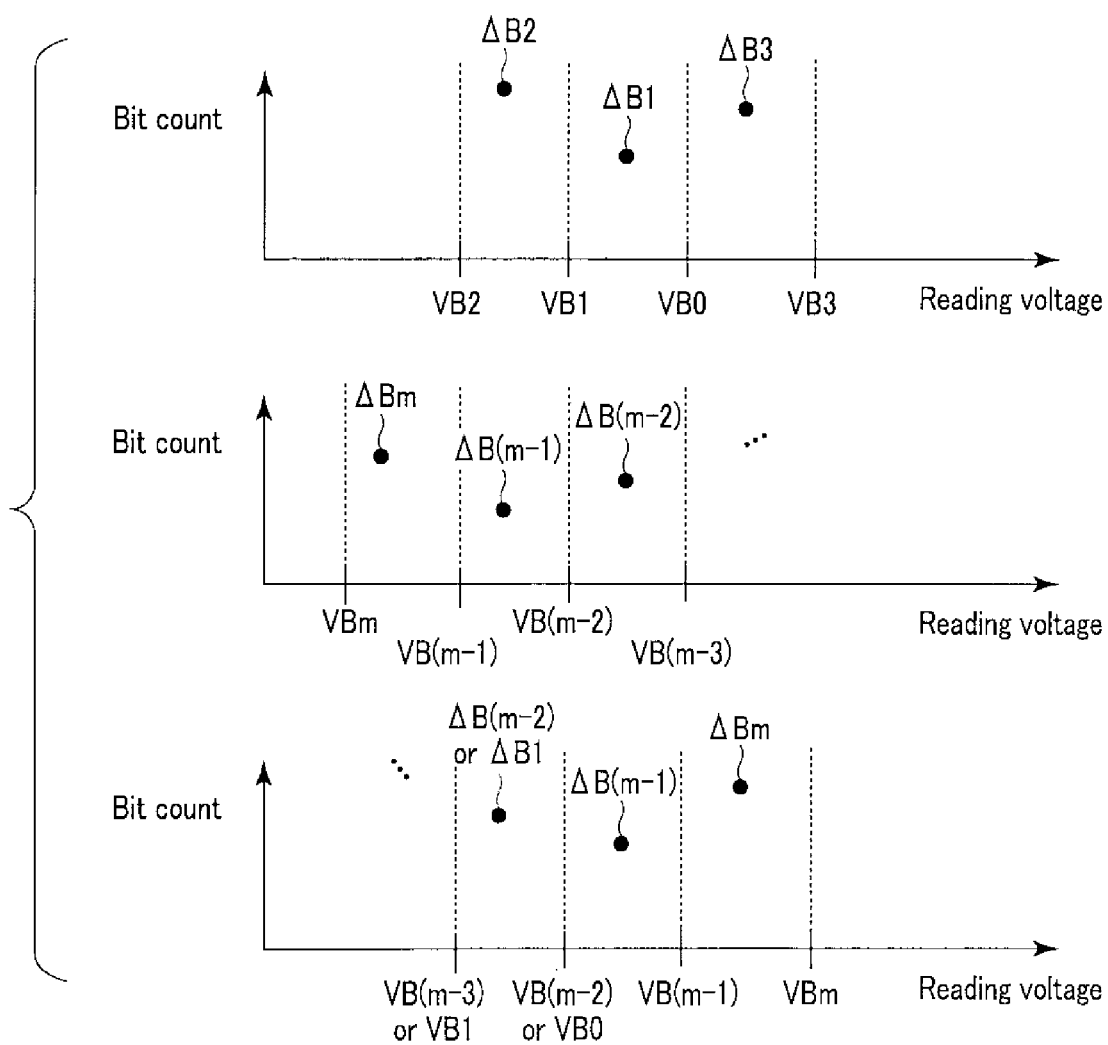
FIG. 15 is a diagram showing the valley position detection operation according to the first embodiment.

FIG. 15 is a diagram showing the relationship between a bit count ΔB and the reading voltage VB applied in the detection operation of the valley position voltage VB' described with reference to FIG. 14. The upper, middle, and lower views of FIG. 15 show cases in which the valley positions are detected via steps ST40, ST38, and ST42 in FIG. 14, respectively. The middle view of FIG. 15 shows a case in which the flag Flag is not changed from "false" to "true", that is, a case in which a valley position is detected without setting the reading voltage VBm higher than the reading voltage VB0. Each of the upper and lower views of FIG. 15 shows a case in which the flag Flag is changed from "false" to "true", that is, a case in which a valley position is detected by setting the reading voltage VBm higher than the reading voltage VB0.

As shown in the upper view of FIG. 15, if the valley position is located between the reading voltage VB0 and the reading voltage VB1, ΔB2>ΔB1<ΔB3 holds in the loop processing of m=3. That is, in the upper view of FIG. 15, the valley position is detected by executing a total of four shift reading operations.

As shown in the middle view of FIG. 15, if the flag Flag is finally set to "false", and the valley position is located between a reading voltage VB(m−2) and a reading voltage VB(m−1), ΔBm>ΔB(m−1)<ΔB(m−2) holds in the loop processing of m≥3. That is, in the middle view of FIG. 15, the valley position is detected by executing a total of four or more shift reading operations of monotone decreasing.

As shown in the lower view of FIG. 15, if the flag Flag is finally set to "true", and the valley position is located between the reading voltage VB(m−2) or VB0 and the reading voltage VB(m−1), ΔBm>ΔB(m−1)<(ΔB(m−2) or ΔB1) holds in the loop processing of m≥4. That is, in the lower view of FIG. 15, the valley position is detected by executing a total of five or more shift reading operations.

Note that the valley position voltage VB' between the "A" state and the "B" state can be calculated by, for example, $$VB'=VB\ \min+(VBgap/2)\{(\Delta Blow-\Delta Bhigh)/(\Delta Blow-\Delta B\ \min)+(\Delta Bhigh-\Delta B\ \min)\} \quad (1)$$

where ΔB min is the minimum value of the bit count ΔB calculated in the reading operation BR, ΔBlow and ΔBhigh are bit counts adjacent to ΔB min, and they have a relationship ΔBlow>ΔB min<ΔBhigh. If ΔB min is calculated based on the reading voltage VB(m−1) in the (m−1)th loop processing and the reading voltage VBm in the mth loop processing, VBgap and VBmin are calculated by, for example, $$VBgap=|VB(m-1)-VBm| \quad (2)$$

$$VB\ \min=(VB(m-1)+VBm)/2 \quad (3)$$

According to equations (1) to (3), the valley position voltage VB' is detected as a value that internally divides the section between the reading voltage VB(m−1) and the reading voltage VBm by a ratio (ΔBlow−ΔB min):(ΔBhigh−ΔB min).

Note that the above valley position detection operation has been described concerning a case in which the valley position voltage VB' is detected. However, the remaining valley position voltages VD' and VF' in the middle page can also be detected by the same operation as described above. That is, steps ST31 to ST42 of FIG. 14 can similarly be applied to steps ST20-2 and ST21-2 and steps ST20-3 and ST21-3 of FIG. 12. In this case, the valley position voltages VD' and VF' can be calculated by replacing the reading voltage VB with VD and VF, respectively, and replacing the bit count $\Delta B$ with $\Delta D$ and $\Delta F$, respectively, in equations (1) to (3) described above.

1.2.3.3.4 Timing Chart

In the above-described valley position detection determination operation, the three valley position voltages VB' VD', and VF' are detected independently of each other in the mth loop processing. Accordingly, the shift amounts to decide the reading voltages VB(m+1), VD(m+1), and VF(m+1) applied in the (m+1)th loop processing are independently set.

Figure 16:
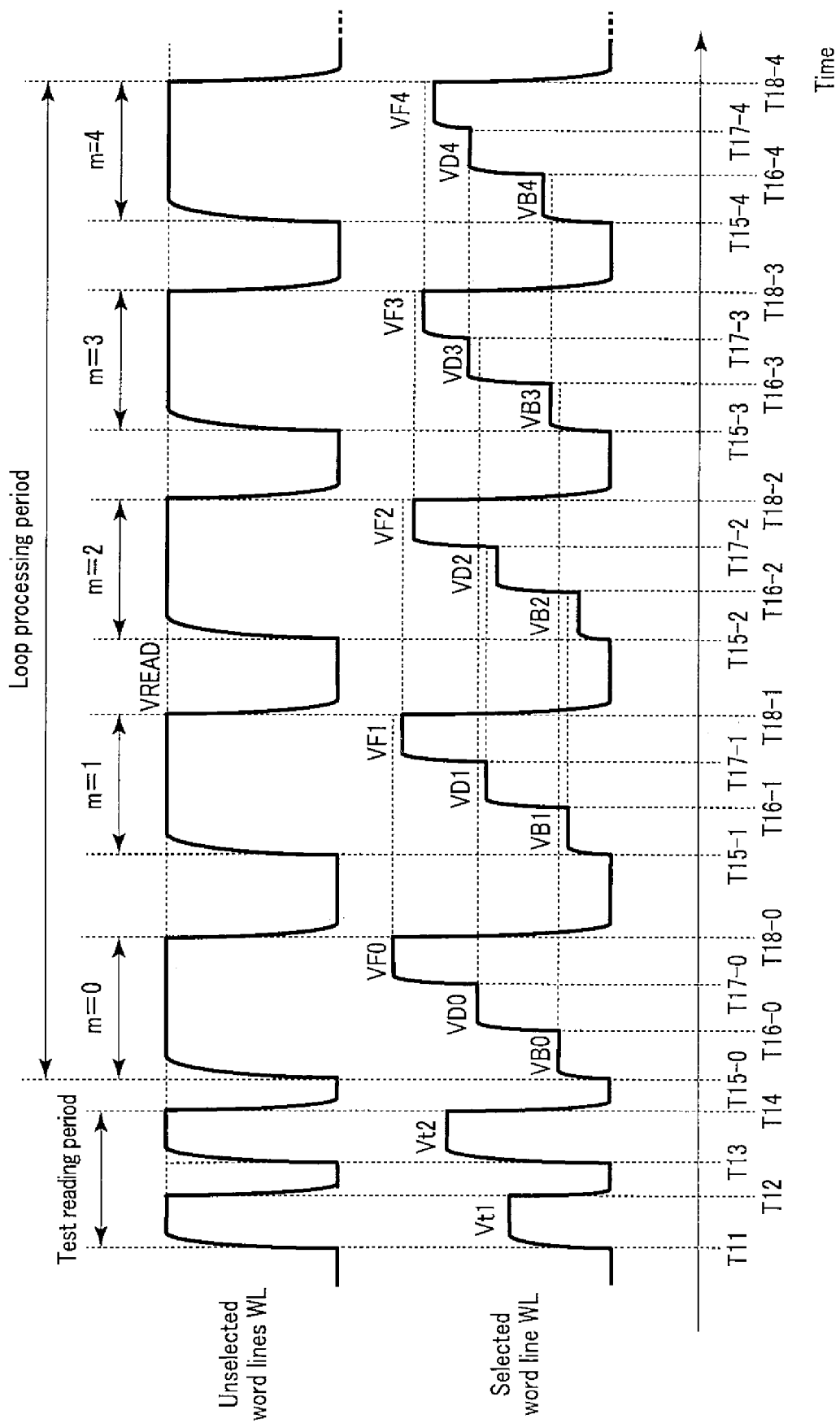
FIG. 16 is a timing chart showing the M-point Vth tracking operation according to the first embodiment.

FIG. 16 is an example of a timing chart for explaining the valley position detection operation according to the first embodiment. The example of FIG. 16 shows a case in which the valley position voltages VB', VD', and VF' are searched for in accordance with the detection patterns shown in the lower, upper, and middle views of FIG. 15, respectively, and the loop processing ends at m=4.

Note that FIG. 16 corresponds to steps ST12, ST14, and ST17 of FIG. 12. That is, FIG. 16 includes a test reading period corresponding to the period from time T11 to time T14 and the mth loop processing period corresponding to the period from time T15_m to time T18_m.

As shown in FIG. 16, in the period from time T11 to time T12, the row decoder 120 applies the voltage Vt1 to the selected word line WL, and applies the voltage VREAD to the unselected word lines WL. Note that the voltage Vt1 is higher than the reading voltage VB in the reading operation BR and lower than the reading voltage VD in the reading operation DR.

Next, in the period from time T13 to time T14, the row decoder 120 applies the voltage Vt2 to the selected word line WL, and applies the voltage VREAD to the unselected word lines WL. Note that the voltage Vt2 is higher than the reading voltage VD and lower than the reading voltage VF in the reading operation FR.

Next, in the loop processing operation of m=0, the row decoder 120 applies the voltages VB0, VD0, and VF0 to the selected word line WL in the period from time T15-0 to time T16-0, in the period from time T16-0 to time T17-0, and in the period from time T17-0 to time T18-0, respectively. The row decoder 120 also applies the voltage VREAD to the unselected word lines WL in the period from T15-0 to T18-0.

Next, in the loop processing operation of m=1, the row decoder 120 applies the voltages VB1, VD1, and VF1 to the selected word line WL in the period from time T15-1 to time T16-1, in the period from time T16-1 to time T17-1, and in the period from time T17-1 to time T18-1, respectively. The row decoder 120 also applies the voltage VREAD to the unselected word lines WL in the period from T15-1 to T18-1.

In this way, in the mth loop, the row decoder 120 applies the voltages VBm, VDm, and VFm to the selected word line WL in the period from time T15-$m$ to time T16-$m$, in the period from time T16-$m$ to time T17-$m$, and in the period from time T17-$m$ to time T18-$m$, respectively. The row decoder 120 also applies the voltage VREAD to the unselected word lines WL in the period from T15-$m$ to T18-$m$.

As described above, up to the loop processing of m=2, the reading voltages VBm, VDm, and VFm are set to be lower than the reading voltages VB(m−1), VD(m−1), and VF(m−1) in the preceding loop processing, respectively (VB2<VB1<VB0, VD2<VD1<VD0, VF2<VF1<VF0).

In the loop processing of m=2, since $\Delta F2<\Delta F1$ holds in step ST34 of the detection operation of the valley position voltage VF', the flag Flag is not changed from "false" to "true". Hence, a value lower than the reading voltage VF2 is set to a reading voltage VF3 (VF3<VF2). On the other hand, since $\Delta B2 \geq \Delta B1$, and $\Delta D2 \geq \Delta D1$ hold in step ST34 of the detection operation of the valley position voltages VB' and VD', the flag Flag is changed from "false" to "true". Hence, values higher than the reading voltages VB0 and VD0 are set to reading voltages VB3 and VD3, respectively (VB3>VB0, VD3>VD0).

In the loop processing of m=3, $\Delta F3<\Delta F2$ holds in step ST38 of the detection operation of the valley position voltage VF'. Hence, a value lower than the reading voltage VF3 is set to a reading voltage VF4 (VF4<VF3). In step ST40 of the detection operation of the valley position voltage VD', since $\Delta D3 \geq \Delta D1$ holds, it is determined that the valley position is detected. For this reason, a reading voltage VD4 is not changed from, for example, the reading voltage VD3 (VD4=VD3). In step ST40 of the detection operation of the valley position voltage VB', $\Delta B3<\Delta B1$ holds. For this reason, a value higher than the reading voltage VB3 is set to a reading voltage VB4 (VB4<VB3).

In the loop processing of m=4, in step ST38 of the detection operation of the valley position voltage VF', $\Delta F4 \geq \Delta F3$ holds. Hence, it is determined that the valley position is detected. In step ST42 of the detection operation of the valley position voltage VB', $\Delta B4 \geq \Delta B3$ holds. Hence, it is determined that the valley position is detected. For this reason, it is determined in step ST21 that all valley positions are detected, and the loop processing ends.

1.2.3.4 Valley Position Estimation Operation

Figure 17:
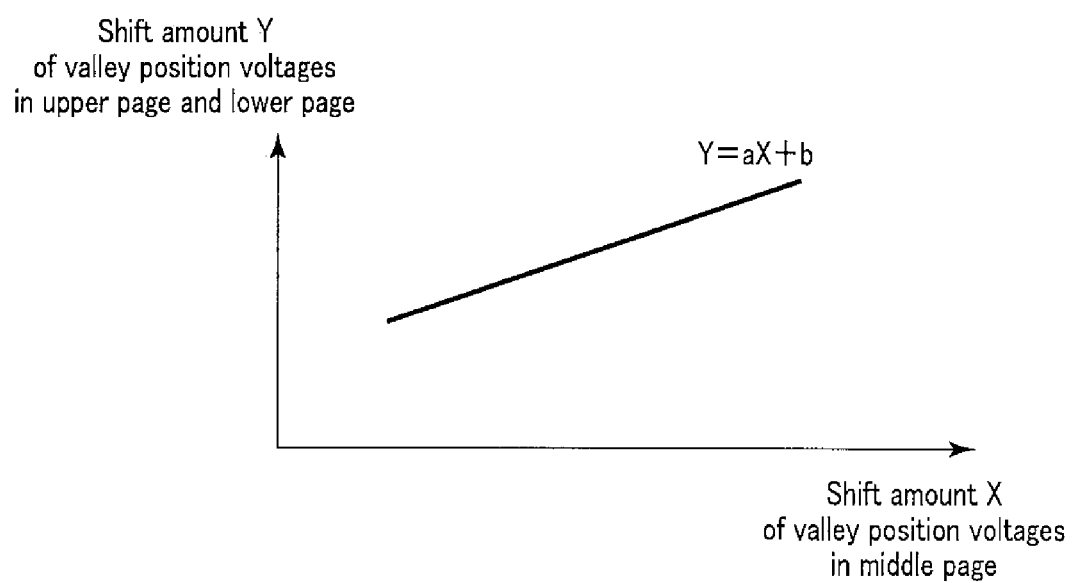
FIG. 17 is a diagram showing a valley position estimation operation according to the first embodiment.

The valley position estimation operation according to the first embodiment will be described next. As shown in FIG. 17, a shift amount Y of a valley position voltage in the upper and lower pages is associated with a shift amount X of a valley position voltage in the middle page by, for example, $$Y=aX+b \tag{4}$$

The shift amount X is the difference between the reading voltage in normal reading and the detected value of the valley position voltage, and includes XB (=VB'−VBdef), XD (=VD'−VDdef), and XF (=VF'−VFdef). The shift amount Y is the difference between the reading voltage in normal reading and the estimated value of the valley position voltage, and includes YA (=VA'−VAdef), YC(=VC'−VCdef), YE (=VE'−VEdef), and YG (=VG'−VGdef). The coefficients a and b are values set in advance to calculate the shift amount Y based on the shift amount X.

Since the shift amount X and the shift amount Y correlate with each other, the valley position voltage in the upper and lower pages can be estimated by detecting the valley position voltage in the middle page. The correlation of the shift amounts X and Y may be strong if, for example, the levels are close to each other. For this reason, in the first embodiment, as shown in FIG. 10, the shift amount YA is estimated from the shift amount XB, the shift amounts YC and YE are estimated from the shift amount XD, and the shift amount YG is estimated from the shift amount XF. However, the present invention is not limited to this, and the shift amount YA may be estimated from the shift amounts XD and XF, the shift amounts YC and YE may be estimated from the shift amounts XB and XF, and the shift amount YG may be estimated from the shift amounts XB and XD.

Equation (4) explains a case in which the shift amounts X and Y are associated by a linear function. However, the present invention is not limited to this. For example, the shift amounts X and Y may be associated by an arbitrary polynomial.

1.2.4 Relationship with Sequential Reading Operation

The relationship between the M-point Vth tracking operation and a case in which reading from different pages is continuously executed (this will be referred to as sequential reading) in the same memory cell transistor MT will be described next.

1.2.4.1 when Valley Position Voltages can be Used

A case in which the values of valley position voltages detected and estimated by the M-point Vth tracking operation executed in reading from a certain page can be used for reading from another page will be described first. This operation is assumed to be an operation in a case in which, for example, the controller 200 can hold the values of valley position voltages detected and estimated by the M-point Vth tracking operation even after the reading operation from the certain page.

Figure 18:
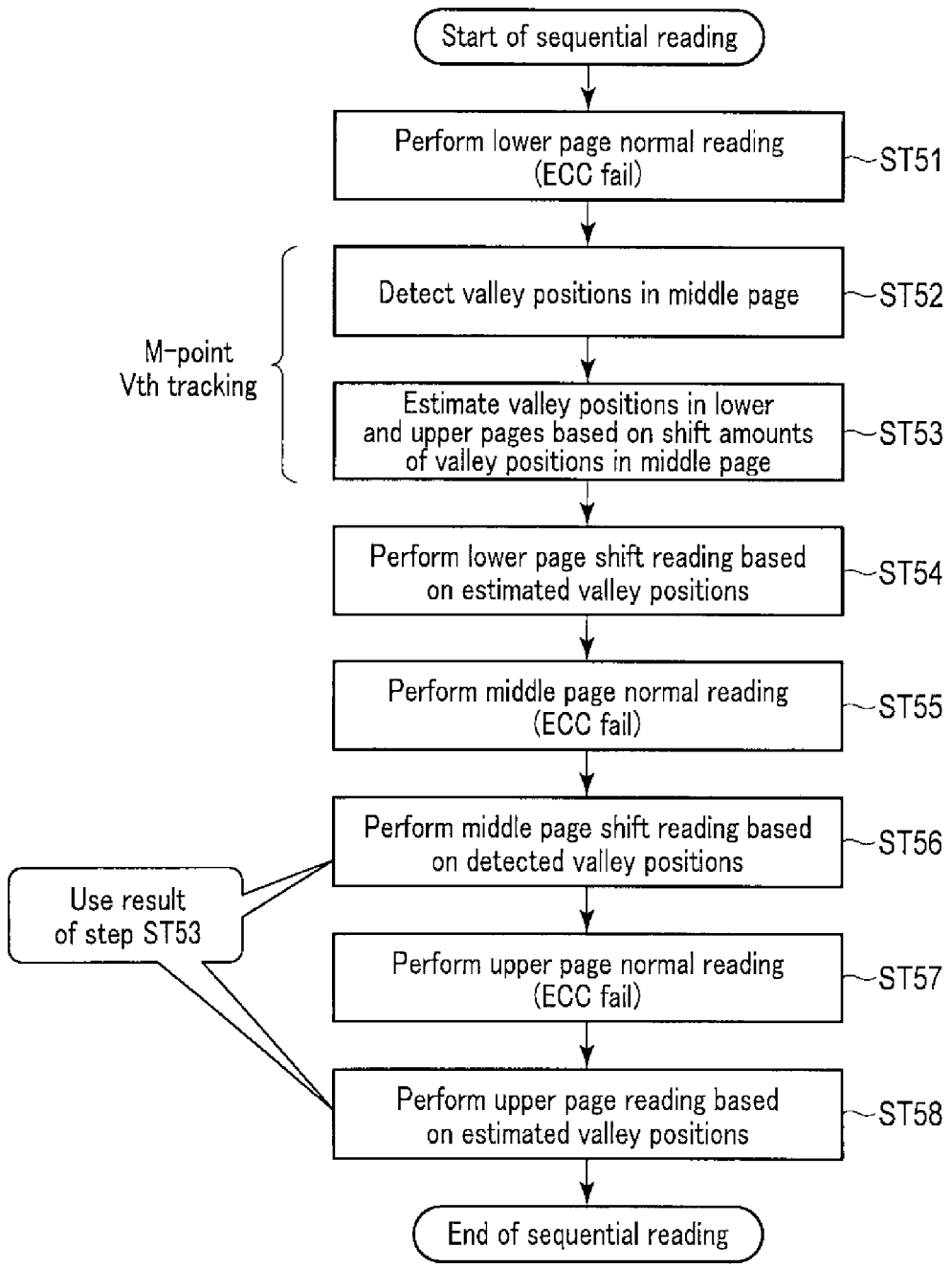
FIGS. 18 and 19 are flowcharts showing a sequential reading operation according to the first embodiment.

FIG. 18 is a flowchart of the sequential reading operation in the case in which the valley position voltages can be used. The example of FIG. 18 shows a case in which normal reading is executed in the order of lower, middle, and upper pages, and all read data fail in ECC.

As shown in FIG. 18, in step ST51, the controller 200 executes normal reading and reads the data of the lower page from the NAND flash memory 100. The ECC circuit 260 executes ECC based on the read data and fails in error correction processing.

In step ST52, the controller 200 and the NAND flash memory 100 acquire the status of ECC fail, and execute the M-point Vth tracking operation. The controller 200 executes steps ST11 to ST23 of FIG. 12, detects the valley position voltages VB', VD', and VF' in the middle page, and holds them during the sequential reading operation.

In step ST53, the controller 200 executes step ST5 of FIG. 11, estimates the valley position voltages VA', VC', VE', and VG' in the upper and lower pages, and holds them during the sequential reading operation.

In step ST54, the controller 200 executes shift reading based on the estimated valley position voltages VA' and VE' and reads the data of the lower page from the NAND flash memory 100 again. The ECC circuit 260 executes ECC based on the read data and succeeds in error correction processing.

Next, in step ST55, the controller 200 executes normal reading and reads the data of the middle page from the NAND flash memory 100. The ECC circuit 260 executes ECC based on the read data and fails in error correction processing.

In step ST56, the controller 200 executes shift reading based on the valley position voltages VB', VD', and VF' detected in step ST52 and reads the data of the middle page from the NAND flash memory 100 again. The ECC circuit 260 executes ECC based on the read data and succeeds in error correction processing.

Next, in step ST57, the controller 200 executes normal reading and reads the data of the upper page from the NAND flash memory 100. The ECC circuit 260 executes ECC based on the read data and fails in error correction processing.

In step ST58, the controller 200 executes shift reading based on the valley position voltages VC' and VG' estimated in step ST53 and reads the data of the upper page from the NAND flash memory 100 again. The ECC circuit 260 executes ECC based on the read data and succeeds in error correction processing.

The sequential reading operation thus ends.

If the result of the M-point Vth tracking operation can be held during the sequential reading operation, as described above, the valley position voltages detected and estimated by one M-point Vth tracking operation can be applied to the reading of the lower, middle, and upper pages.

Note that in this example, the normal reading of steps ST55 and ST57 may be omitted, and steps ST56 and ST58 may be executed. This is because the data can probably be correctly read not by normal reading but using the voltages estimated in step ST53.

1.2.4.2 when Valley Position Voltages Cannot be Used

A case in which the values of valley position voltages detected and estimated by the M-point Vth tracking operation executed in reading from a certain page cannot be used for reading from another page will be described next. This operation is assumed to be an operation in a case in which, for example, the controller 200 cannot hold the values of valley position voltages detected and estimated by the M-point Vth tracking operation after the reading operation from the certain page.

Figure 19:
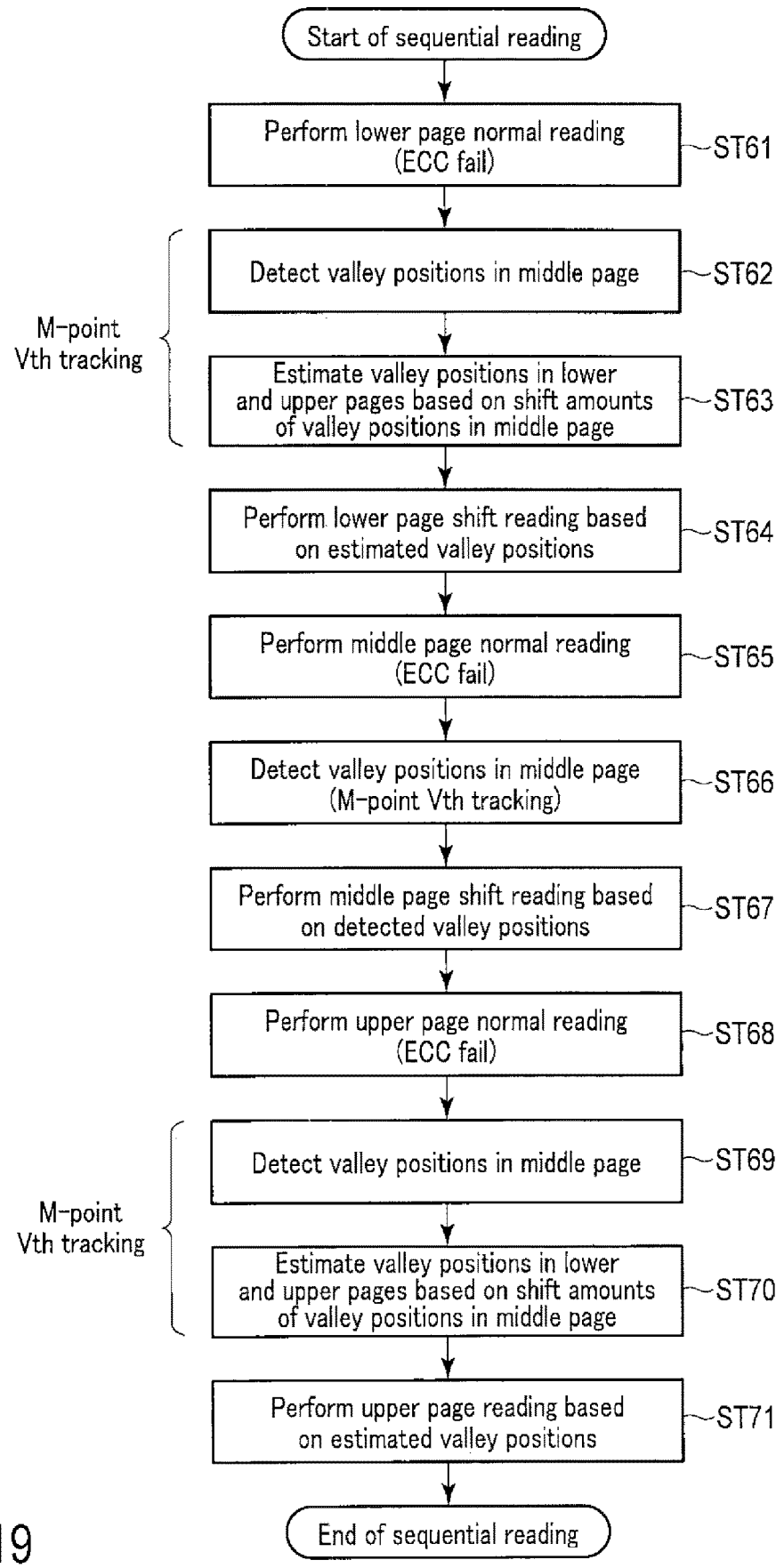

FIG. 19 is a flowchart of the sequential reading operation in the case in which the valley position voltages cannot be used. The example of FIG. 19 shows a case in which normal reading is executed in the order of lower, middle, and upper pages, and all read data fail in ECC, as in FIG. 18.

As shown in FIG. 19, steps ST61 to ST64 are the same as steps ST51 to ST54 in FIG. 18, and a description thereof will be omitted.

Next, in step ST65, the controller 200 executes normal reading and reads the data of the middle page from the NAND flash memory 100. The ECC circuit 260 executes ECC based on the read data and fails in error correction processing.

In step ST66, the controller 200 and the NAND flash memory 100 acquire the status of ECC fail, and execute the M-point Vth tracking operation. The controller 200 executes steps ST11 to ST22 of FIG. 12, detects the valley position voltages VB', VD', and VF' in the middle page.

In step ST67, the controller 200 executes shift reading based on the detected valley position voltages VB', VD', and VF' and reads the data of the middle page from the NAND flash memory 100 again. The ECC circuit 260 executes ECC based on the read data and succeeds in error correction processing.

Next, in step ST68, the controller 200 executes normal reading and reads the data of the upper page from the NAND flash memory 100. The ECC circuit 260 executes ECC based on the read data and fails in error correction processing.

In step ST69, the controller 200 and the NAND flash memory 100 acquire the status of ECC fail, and execute the M-point Vth tracking operation. The controller 200 executes steps ST11 to ST22 of FIG. 12, detects the valley position voltages VB', VD', and VF' in the middle page.

In step ST70, the controller 200 executes step ST5 of FIG. 11, and estimates the valley position voltages VC' and VG' in the upper page.

In step ST71, the controller 200 executes shift reading based on the estimated valley position voltages VC' and VG' and reads the data of the upper page from the NAND flash memory 100 again. The ECC circuit 260 executes ECC based on the read data and succeeds in error correction processing.

The sequential reading operation thus ends.

If the result of the M-point Vth tracking operation cannot be held during the sequential reading operation, as described above, the M-point Vth tracking operation is executed every time one of the lower, middle, and upper pages is read.

1.3 Effect According to this Embodiment

As described above, the configuration according to this embodiment makes it possible to perform a high-speed reading operation and improve the reading performance of the memory system. This effect will be described below.

That is, in this embodiment, when each memory cell holds a plurality of bits, in other words, a plurality of pages are assigned to one word line WL, Vth tracking is performed in one of the plurality of pages. At this time, if there are two or more types of reading voltages of the Vth tracking target page, M-point Vth tracking is executed for all the reading voltages. More specifically, in the above embodiment, Vth tracking is executed for the reading voltages VB, VD, and VF in the middle page, as described with reference to FIG. 10. Hence, the reading accuracy of the middle page can be improved.

In addition, Vth tracking is performed for all of the three reading voltages of the middle page, and the reading voltages (VA, VC, VE, and VG in the example of FIG. 10) of the remaining pages are estimated from the result. Hence, the estimation accuracy is improved as compared to a case in which Vth tracking is performed for only one reading voltage. As a result, the reading accuracy of the lower and upper pages is also improved.

The reading voltages VB, VD, and VF as the Vth tracking targets are parallelly tracked, as described with reference to FIG. 16, and the tracking is done using an optimum algorithm (the reading voltage shift direction) for each reading voltage. Hence, the time needed for the tracking is almost the same as in a case in which Vth tracking is performed for only one reading voltage. Furthermore, as described above with reference to FIG. 18, if the tracking result of the middle page can be used for the remaining pages, the speed of the entire reading operation can be improved as compared to a case in which the Vth tracking is performed for each page.

2. Second Embodiment

A memory system according to the second embodiment will be described next. The second embodiment is different from the first embodiment in the valley position estimation operation. More specifically, in the first embodiment, the valley position voltages VA', VC', VE', and VG' are estimated using equation (4) that associates one of the shift amounts XB, XD, and XF with one of the shift amounts YA, YC, YE, and YG in the valley position estimation operation. On the other hand, in the second embodiment, valley position voltages VA', VC', VE', and VG' are directly associated with valley position voltages VB', VD', and VF' without intervention of shift amounts X and Y.

A description of the same configurations and operations as in the first embodiment will be omitted, and configurations and operations different from the first embodiment will be described below.

2.1 Valley Position Estimation Operation

Figure 20:
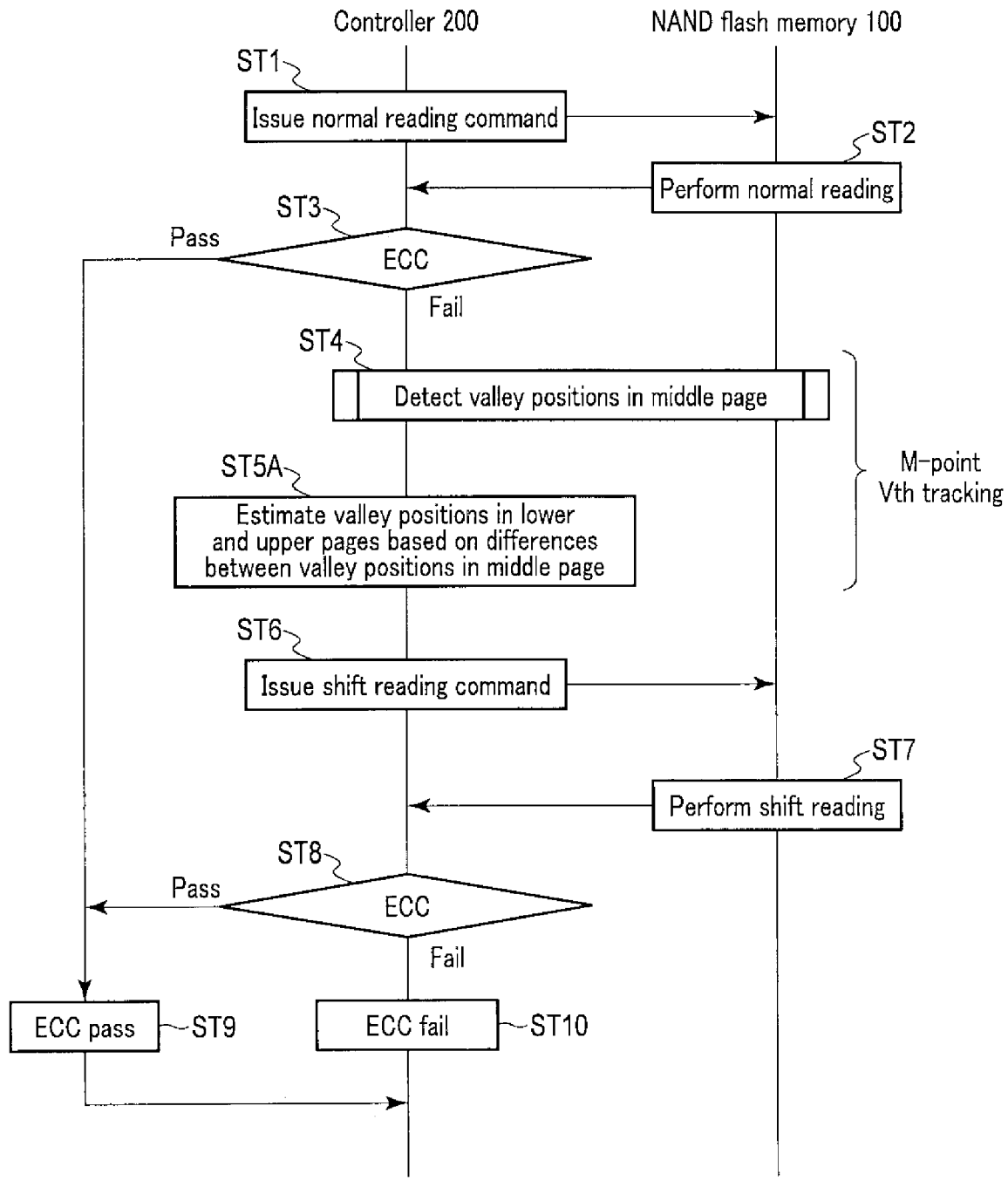
FIG. 20 is a flowchart showing an operation including the M-point Vth tracking operation of a memory system according to a second embodiment.

FIG. 20 is a flowchart for explaining an operation including an M-point Vth tracking operation according to the second embodiment. FIG. 20 corresponds to FIG. 11 explained in the first embodiment.

As shown in FIG. 20, in the second embodiment, steps ST1 to ST4 and steps ST6 to ST10 except step ST5A concerning valley position estimation are the same as in the first embodiment.

In step ST5A, a controller 200 estimates valley positions in the lower and upper pages based on the differences between the detected valley position voltages VB', VD', and VF' in the middle page.

Figure 21:
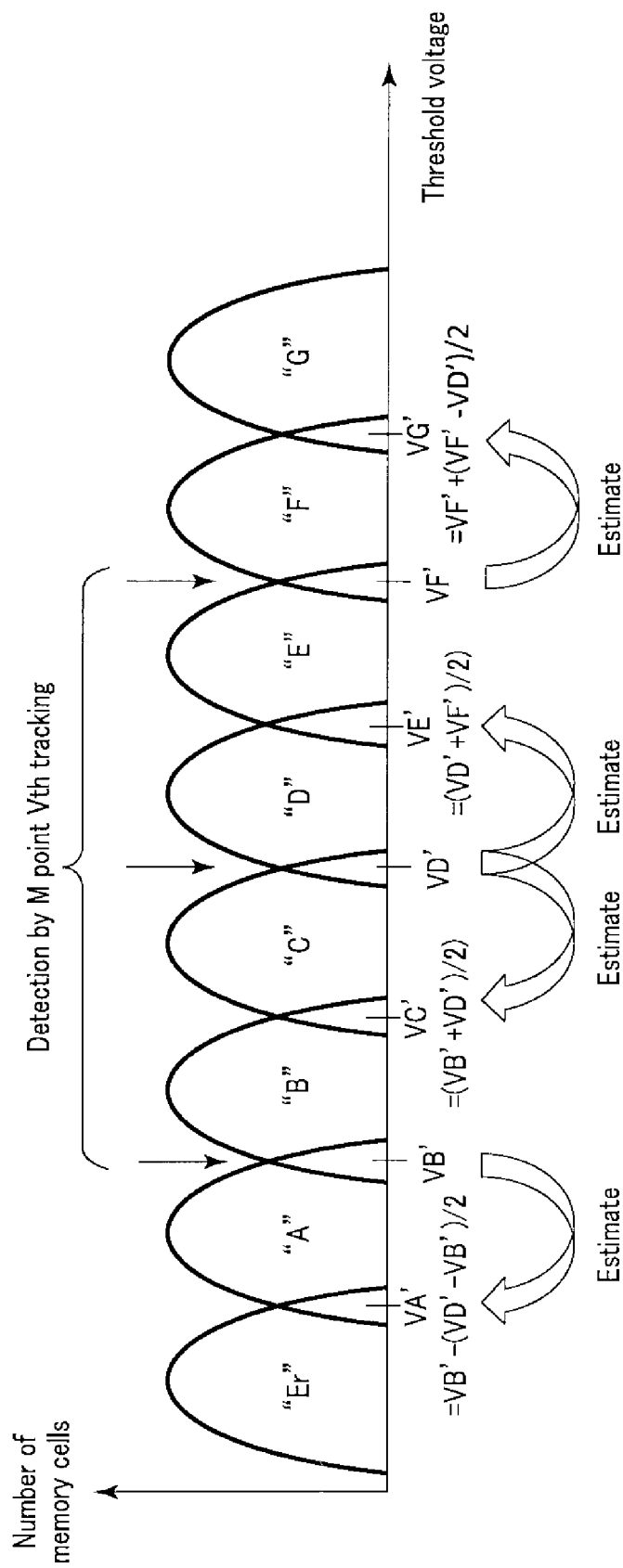
FIG. 21 is a schematic view showing a valley position estimation operation according to the second embodiment.

More specifically, as shown in FIG. 21, the valley position voltages VA', VC', VE', and VG' are estimated according to $$VA' = VB' - (VD' - VB')/2 \qquad (5)$$

$$VC' = (VB' + VD')/2 \qquad (6)$$

$$VE' = (VD' + VF')/2 \qquad (7)$$

$$VG' = VF' + (VF' - VD')/2 \qquad (8)$$

In this way, by assuming that the valley positions are adjacent to each other at even intervals, the valley position voltages in the lower and upper pages can directly be estimated from the detected valley position voltages in the middle page.

2.2 Effect According to this Embodiment

As described above, according to this embodiment, the intermediate voltages between the reading voltages as the Vth tracking targets are estimated as other page reading voltages. Hence, as compared to the first embodiment, the estimation method is very easy, and processing is simplified. As a result, the reading speed can be improved.

3. Third Embodiment

A memory system according to the third embodiment will be described next. In the third embodiment, valley position voltages detected by an M-point Vth tracking operation may be different from the first embodiment. More specifically, in the first embodiment, the valley position voltages VB', VD', and VF' in the middle page are detected regardless of which one of the lower, middle, and upper pages fails in ECC in normal reading. On the other hand, in the third embodiment, the set of valley position voltages to be detected changes in accordance with a page that fails in ECC in normal reading.

A description of the same configurations and operations as in the first embodiment will be omitted, and configurations and operations different from the first embodiment will be described below.

3.1 M-Point Vth Tracking Operation

3.1.1 Outline of M-Point Vth Tracking Operation

Figure 22:
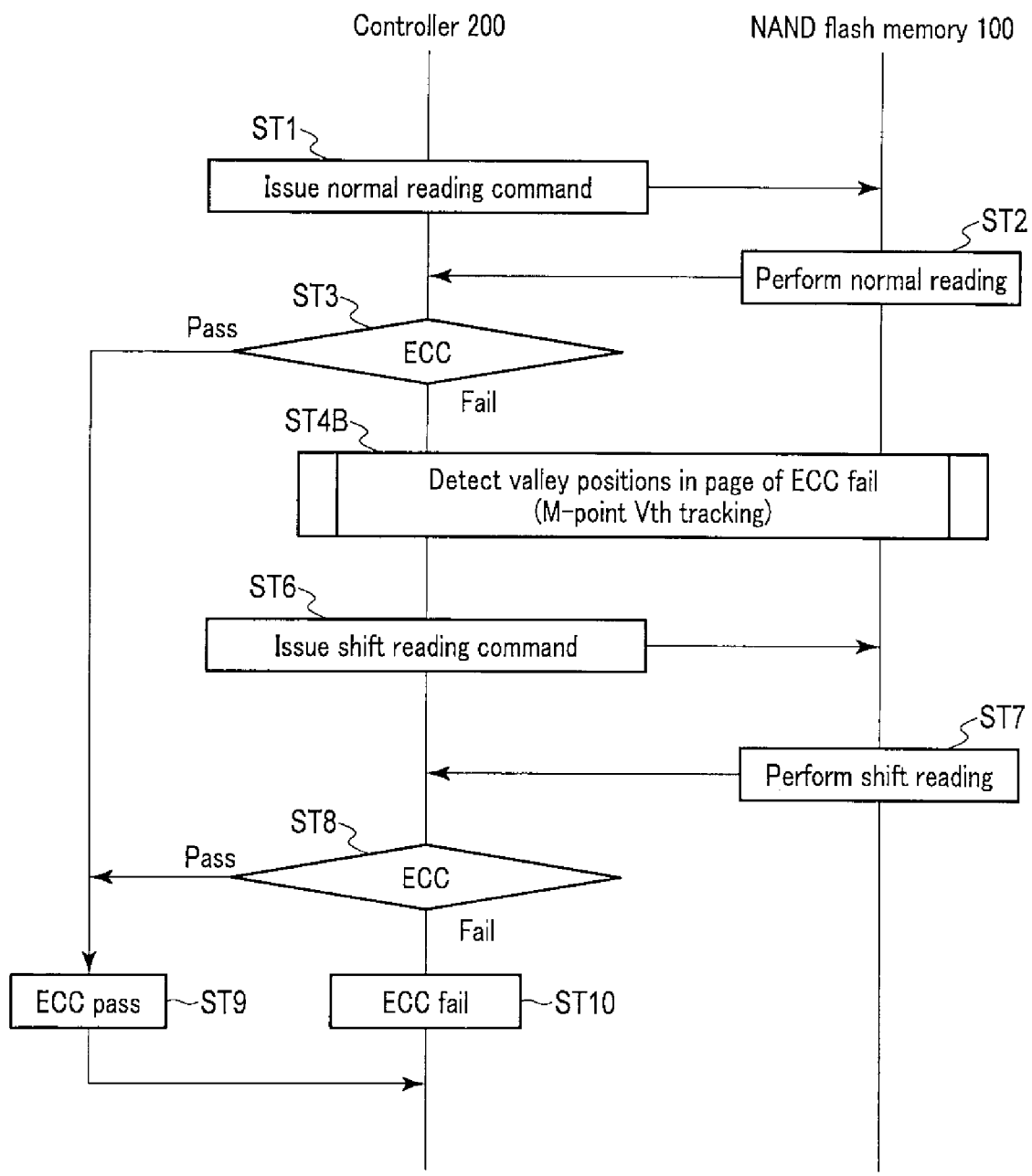
FIG. 22 is a flowchart showing an operation including the M-point Vth tracking operation of a memory system according to a third embodiment.

FIG. 22 is a flowchart for explaining an operation including an M-point Vth tracking operation according to the third embodiment. FIG. 22 corresponds to FIG. 11 explained in the first embodiment.

As shown in FIG. 22, in the third embodiment, step ST4B concerning the M-point Vth tracking operation is different from step ST4 of FIG. 11 described in the first embodiment. Additionally, in the third embodiment, step ST5 concerning valley position estimation in FIG. 11 is not executed. Remaining steps ST1 to ST3 and steps ST6 to ST10 are the same as in the first embodiment.

In step ST4B, a controller 200 and a NAND flash memory 100 perform the M-point Vth tracking operation, thereby detecting valley positions. The detected valley position voltages correspond to the page reading by normal reading executed in step ST1. That is, if the lower page is read in step ST1, valley position voltages VA' and VE' in the lower page are detected in step ST4B. If the middle page is read in step ST1, valley position voltages VB', VD', and VF' in the middle page are detected in step ST4B. If the upper page is read in step ST1, valley position voltages VC' and VG' in the upper page are detected in step ST4B.

Note that the operation of step ST4B when detecting the valley position voltages VB', VD', and VF' in the middle page is the same as the operation of step ST4 in FIG. 11. Details of the operation of step ST4B in each of a case in which the valley position voltages VA' and VE' in the lower page are detected and a case in which the valley position voltages VC' and VG' in the upper page are detected will be described below.

3.1.2 Valley Position Detection Operation for Lower Page

FIG. 23 is a flowchart showing details of the M-point Vth tracking operation of detecting valley positions in the lower page according to the third embodiment.

As shown in FIG. 23, in step ST81, the controller 200 issues a test reading command to the NAND flash memory 100.

In step ST82, the NAND flash memory 100 executes test reading, and reads read data TL. The NAND flash memory 100 holds the read data TL in a latch circuit.

In step ST83, the controller 200 initializes loop processing to be executed in steps ST84 to ST91 (m=0, Flag=false).

In step ST84, the controller 200 issues a shift reading command for the lower page to the NAND flash memory 100.

In step ST85, the NAND flash memory 100 executes shift reading for the lower page, and reads read data ARm/ERm (AR0/ER0, AR1/ER1, . . . ). The NAND flash memory 100 holds the read data ARm/ERm in the latch circuit. The read data ARm/ERm in the mth loop processing corresponds to the result of shift reading of the lower page using voltages VAm and VEm. For this reason, the read data ARm/ERm has, in each bit, data "0" or "1" based on the relationship between the threshold voltage of a corresponding memory cell transistor MT and the voltages VAm and VEm.

In step ST86, the NAND flash memory 100 generates separated data ARsm (ARs0, ARs1, . . . ) and ERsm (ERs0, ERs1, . . . ) based on the read data TL and ARm/ERm held by the latch circuits. The NAND flash memory 100 then transmits the separated data ARsm and ERsm to the controller 200. The separated data ARsm and ERsm have partial information of the read data ARm/ERm. Details of the separated data ARsm and ERsm will be described later.

In step ST87 (steps ST87-1 and ST87-2), the controller 200 calculates bit counts ΔAm and ΔEm based on the separated data ARsm and ERsm, respectively.

In step ST88 (steps ST88-1 and ST88-2), the controller 200 determines whether the valley position between the "Er" state and the "A" state and the valley position between the "D" state and the "E" state are detected. Upon determining that the valley positions are not detected (NO in step ST88), the controller 200 advances to step ST89 (steps ST89-1 and ST89-2) to set a shift amount to be applied to shift reading in the (m+1)th loop processing and then advances to step ST90. Upon determining that the valley positions are detected (YES in step ST88), the controller 200 advances to step ST90.

In step ST90, the controller 200 determines whether all valley positions concerning the lower data are detected. Upon determining that all valley positions concerning the lower data are not detected (NO in step ST90), the controller 200 advances to step ST91 to increment the number of loops and then returns to step ST84. Upon determining that all valley positions concerning the lower data are detected (YES in step ST90), the controller 200 advances to step ST6 to subsequently perform shift reading based on the detected valley position voltages.

The M-point Vth tracking operation of detecting the valley positions in the lower page thus ends.

Separated data used in valley position detection for the lower page will be described next.

Figure 24:
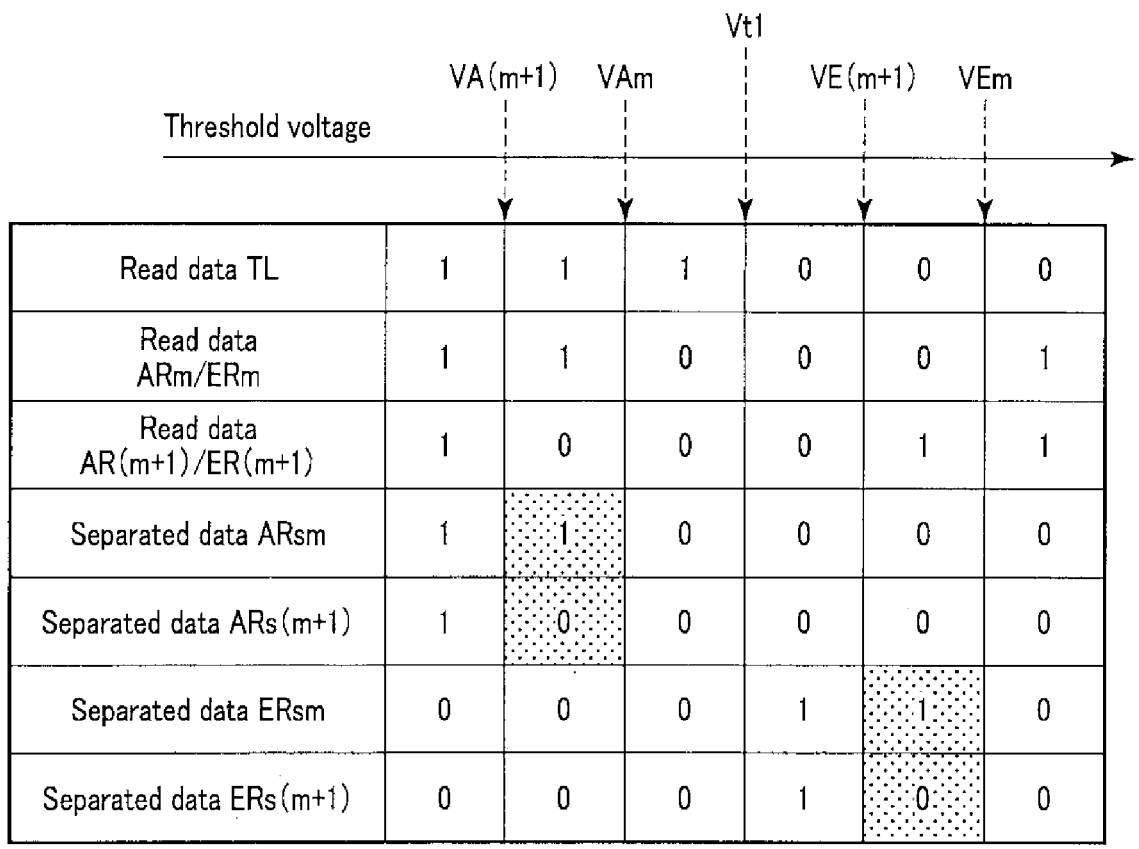
FIG. 24 is a table showing separated data according to the third embodiment.

FIG. 24 is a table for explaining separated data generated by lower page shift reading according to the third embodiment, which corresponds to steps ST82, ST85, and ST86 in FIG. 23. FIG. 24 shows the read data TL of the test reading, the read data ARm/ERm and ARm(m+1)/ERm(m+1) of the shift reading, and the separated data ARsm, ARs(m+1), ERsm, and ERs(m+1).

As shown in FIG. 24, if the threshold voltage of the memory cell transistor MT is less than a voltage Vt1, the read data TL is data "1". If the threshold voltage is not less than the voltage Vt1, the read data TL is data "0".

If the threshold voltage of the memory cell transistor MT is less than the voltage VAm, the read data ARm/ERm is data "1". If the threshold voltage ranges from than the voltage VAm (inclusive) to the voltage VEm (exclusive), the read data ARm/ERm is data "0". If the threshold voltage is not less than the voltage VEm, the read data ARm/ERm is data "1". This also applies to the read data AR(m+1)/ER(m+1).

The separated data ARsm and ARs(m+1) are, for example, data "1" if the threshold voltage of the memory cell transistor MT is less than the voltage VAm and if the threshold voltage is less than the voltage VA(m+1), respectively. The separated data ARsm and ARs(m+1) are data "0" if the threshold voltage is not less than the voltage VAm and if the threshold voltage is not less than the voltage VA(m+1), respectively. That is, the number of separated data ARsm that are data "1" corresponds to the number of memory cell transistors MT whose threshold voltage is less than the voltage VAm.

If the threshold voltage of the memory cell transistor MT ranges from the voltage Vt1 (inclusive) to the voltage VEm (exclusive), the separated data ERsm is data "1". If the threshold voltage is less than the voltage Vt1 or not less than the voltage VEm, the separated data ERsm is data "0". If the threshold voltage of the memory cell transistor MT ranges from the voltage Vt1 (inclusive) to the voltage VE(m+1) (exclusive), the separated data ERs(m+1) is data "1". If the threshold voltage is less than the voltage Vt1 or not less than the voltage VE(m+1), the separated data ERs(m+1) is data "0". That is, the number of separated data ERsm that are data "1" corresponds to the number of memory cell transistors MT whose threshold voltage ranges from the voltage Vt1 (inclusive) to the voltage VEm (exclusive).

For this reason, in step ST87 of FIG. 23, by comparing the separated data ARsm with ARs(m+1), the controller 200 can monitor, as a bit count ΔA(m+1), the number of memory cells each having a threshold voltage between the voltage VAm and the voltage VA(m+1). Similarly, by comparing the separated data ERsm with ERs(m+1), the controller 200 can monitor, as a bit count ΔE(m+1), the number of memory cells each having a threshold voltage between the voltage VEm and the voltage VE(m+1).

Note that the separated data ARsm and ERsm are generated based on, for example, the read data TL and ARm/ERm. An operation unit OP performs, for example, the AND operation between the read data TL and the read data ARm/ERm, thereby generating the separated data ARsm (ARsm=TL AND (ARm/ERm)). In addition, the operation unit OP performs, for example, the AND operation between a NOT operation −TL of the read data TL and a NOT operation −(ARm/ERm) of the read data ARm/ERm, thereby generating the separated data ERsm (ERsm=−TL AND −(ARm/ERm)).

Note that the above-described manner the separated data ARsm and ERsm are defined by the operation unit OP is an example, and an arbitrary manner of definition can be applied.

3.1.3 Valley Position Detection Operation for Upper Page

Figure 25:
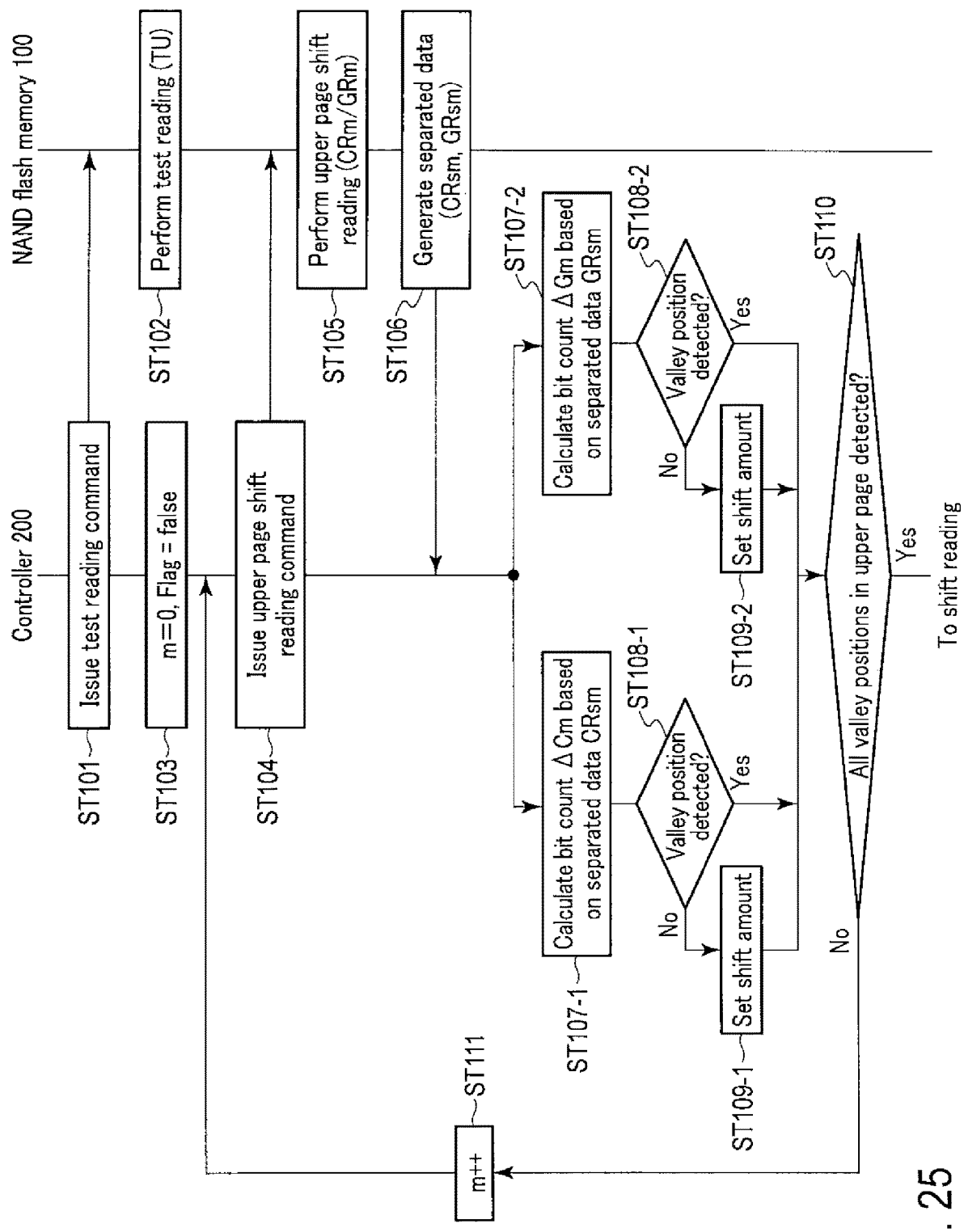
FIG. 25 is a flowchart showing an M-point Vth tracking operation according to the third embodiment.

FIG. 25 is a flowchart showing details of the M-point Vth tracking operation of detecting valley positions in the upper page according to the third embodiment.

As shown in FIG. 25, in step ST101, the controller 200 issues a test reading command to the NAND flash memory 100.

In step ST102, the NAND flash memory 100 executes test reading, and reads read data TU. The NAND flash memory 100 holds the read data TU in a latch circuit.

In step ST103, the controller 200 initializes loop processing to be executed in steps ST104 to ST111 (m=0, Flag=false).

In step ST104, the controller 200 issues a shift reading command for the upper page to the NAND flash memory 100.

In step ST105, the NAND flash memory 100 executes shift reading for the upper page, and reads read data CRm/GRm (CR0/GR0, CR1/GR1, . . . ) The NAND flash memory 100 holds the read data CRm/GRm in the latch circuit. The read data CRm/GRm in the mth loop processing corresponds to the result of shift reading of the upper page using voltages VCm and VGm. For this reason, the read data CRm/GRm has, in each bit, data "0" or "1" based on the relationship between the threshold voltage of a corresponding memory cell transistor MT and the voltages VCm and VGm.

In step ST106, the NAND flash memory 100 generates separated data CRsm (CRs0, CRs1, . . . ) and GRsm (GRs0, GRs1, . . . ) based on the read data TU and CRm/GRm held by the latch circuits. The NAND flash memory 100 then transmits the separated data CRsm and GRsm to the controller 200. The separated data CRsm and GRsm have partial information of the read data CRm/GRm. Details of the separated data CRsm and GRsm will be described later.

In step ST107 (steps ST107-1 and ST107-2), the controller 200 calculates bit counts ΔCm and ΔGm based on the separated data CRsm and GRsm, respectively.

In step ST108 (steps ST108-1 and ST108-2), the controller 200 determines whether the valley position between the "B" state and the "C" state and the valley position between the "F" state and the "G" state are detected. Upon determining that the valley positions are not detected (NO in step ST108), the controller 200 advances to step ST109 (steps ST109-1 and ST109-2) to set a shift amount to be applied to shift reading in the (m+1)th loop processing and then advances to step ST110. Upon determining that the valley positions are detected (YES in step ST108), the controller 200 advances to step ST110.

In step ST110, the controller 200 determines whether all valley positions concerning the upper data are detected. Upon determining that all valley positions concerning the upper data are not detected (NO in step ST110), the controller 200 advances to step ST111 to increment the number of loops and then returns to step ST104. Upon determining that all valley positions concerning the upper data are detected (YES in step ST110), the controller 200 advances to step ST6 to subsequently perform shift reading based on the detected valley position voltages.

The M-point Vth tracking operation of detecting the valley positions in the upper page thus ends.

Separated data used in valley position detection for the upper page will be described next.

Figure 26:
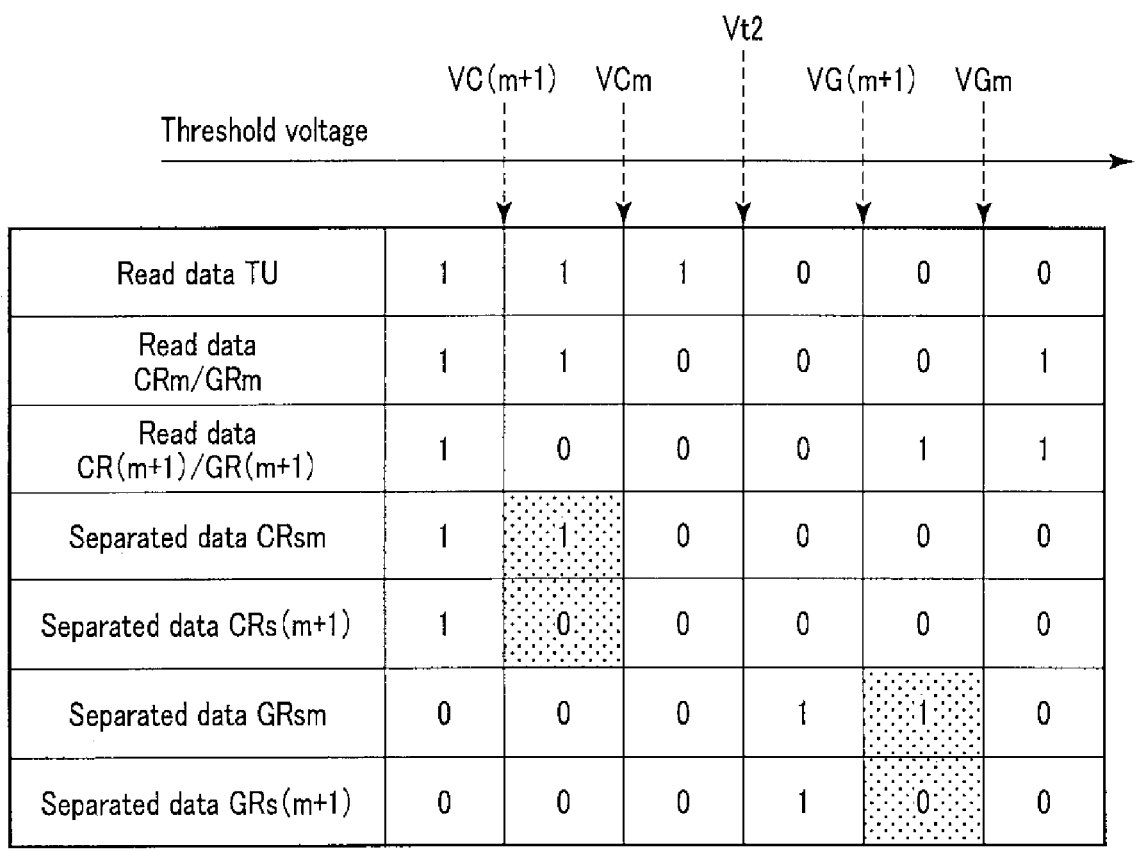
FIG. 26 is a table showing separated data according to the third embodiment.

FIG. 26 is a table for explaining separated data generated by upper page shift reading according to the third embodiment, which corresponds to steps ST102, ST105, and ST106 in FIG. 25. FIG. 26 shows the read data TU of the test reading, the read data CRm/GRm and CRm(m+1)/GRm(m+1) of the shift reading, and the separated data CRsm, CRs(m+1), GRsm, and GRs(m+1).

As shown in FIG. 26, if the threshold voltage of the memory cell transistor MT is less than a voltage Vt2, the read data TU is data "1". If the threshold voltage is not less than the voltage Vt2, the read data TU is data "0".

If the threshold voltage of the memory cell transistor MT is less than the voltage VCm, the read data CRm/GRm is data "1". If the threshold voltage ranges from than the voltage VCm (inclusive) to the voltage VGm (exclusive), the read data CRm/GRm is data "0". If the threshold voltage is not less than the voltage VGm, the read data CRm/GRm is data "1". This also applies to the read data CR(m+1)/GR(m+1).

The separated data CRsm and CRs(m+1) are, for example, data "1" if the threshold voltage of the memory cell transistor MT is less than the voltage VCm and if the threshold voltage is less than the voltage VC(m+1), respectively. The separated data CRsm and CRs(m+1) are data "0" if the threshold voltage is not less than the voltage VCm and if the threshold voltage is not less than the voltage VC(m+1), respectively. That is, the number of separated data CRsm that are data "1" corresponds to the number of memory cell transistors MT whose threshold voltage is less than the voltage VCm.

If the threshold voltage of the memory cell transistor MT ranges from the voltage Vt2 (inclusive) to the voltage VGm (exclusive), the separated data GRsm is data "1". If the threshold voltage is less than the voltage Vt2 or not less than the voltage VGm, the separated data GRsm is data "0". If the threshold voltage of the memory cell transistor MT ranges from the voltage Vt2 (inclusive) to the voltage VG(m+1) (exclusive), the separated data GRs(m+1) is data "1". If the threshold voltage is less than the voltage Vt2 or not less than the voltage VG(m+1), the separated data GRs(m+1) is data "0". That is, the number of separated data GRsm that are data "1" corresponds to the number of memory cell transistors MT whose threshold voltage ranges from the voltage Vt2 (inclusive) to the voltage VGm (exclusive).

For this reason, in step ST107 of FIG. 25, by comparing the separated data CRsm with CRs(m+1), the controller 200 can monitor, as a bit count ΔC(m+1), the number of memory cells each having a threshold voltage between the voltage VCm and the voltage VC(m+1). Similarly, by comparing the separated data GRsm with GRs(m+1), the controller 200 can monitor, as a bit count ΔG(m+1), the number of memory cells each having a threshold voltage between the voltage VGm and the voltage VG(m+1).

Note that the separated data CRsm and GRsm are generated based on, for example, the read data TU and CRm/GRm. The operation unit OP performs, for example, the AND operation between the read data TU and the read data CRm/GRm, thereby generating the separated data CRsm (CRsm=TU AND (CRm/GRm)). In addition, the operation unit OP performs, for example, the AND operation between a NOT operation −TU of the read data TU and a NOT operation −(CRm/GRm) of the read data CRm/GRm, thereby generating the separated data GRsm (GRsm=−TU AND −(CRm/GRm)).

Note that the above-described manner the separated data CRsm and GRsm are defined by the operation unit OP is an example, and an arbitrary manner of definition can be applied.

3.2 Relationship with Sequential Reading Operation

As described above, in the third embodiment, if data of a certain page is read in normal reading, the valley position voltages in the certain page are detected. For this reason, regardless of whether the controller 200 can hold the values of valley position voltages during the sequential reading operation, the M-point Vth tracking operation is executed every time one of the lower, middle, and upper pages is read.

Figure 27:
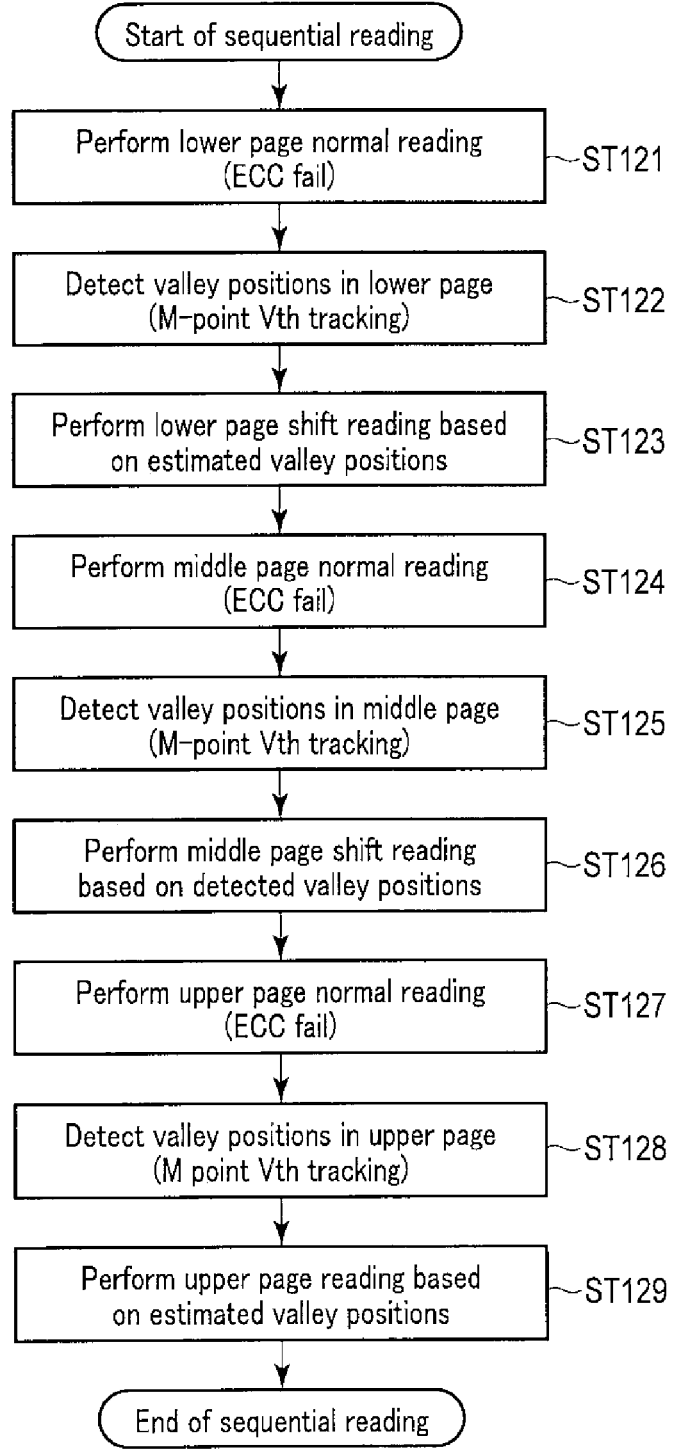
FIG. 27 is a flowchart showing a sequential reading operation according to the third embodiment.

FIG. 27 is a flowchart of the sequential reading operation according to the third embodiment. The example of FIG. 27 shows a case in which normal reading is executed in the order of lower, middle, and upper pages, and all read data fail in ECC.

As shown in FIG. 27, in step ST121, the controller 200 executes normal reading and reads the data of the lower page from the NAND flash memory 100. An ECC circuit 260 executes ECC based on the read data and fails in error correction processing.

In step ST122, the controller 200 and the NAND flash memory 100 acquire the status of ECC fail, and execute the M-point Vth tracking operation. The controller 200 executes steps ST81 to ST91 of FIG. 23 and detects valley position voltages VA' and VE' in the lower page.

In step ST123, the controller 200 executes shift reading based on the detected valley position voltages VA' and VE' and reads the data of the lower page from the NAND flash memory 100 again. The ECC circuit 260 executes ECC based on the read data and succeeds in error correction processing.

Next, in step ST124, the controller 200 executes normal reading and reads the data of the middle page from the NAND flash memory 100. The ECC circuit 260 executes ECC based on the read data and fails in error correction processing.

In step ST125, the controller 200 and the NAND flash memory 100 acquire the status of ECC fail, and execute the M-point Vth tracking operation. The controller 200 executes steps ST11 to ST23 of FIG. 12 and detects valley position voltages VB', VD', and VF' in the middle page.

In step ST126, the controller 200 executes shift reading based on the detected valley position voltages VB', VD', and VF' and reads the data of the middle page from the NAND flash memory 100 again. The ECC circuit 260 executes ECC based on the read data and succeeds in error correction processing.

Next, in step ST127, the controller 200 executes normal reading and reads the data of the upper page from the NAND flash memory 100. The ECC circuit 260 executes ECC based on the read data and fails in error correction processing.

In step ST128, the controller 200 and the NAND flash memory 100 acquire the status of ECC fail, and execute the M-point Vth tracking operation. The controller 200 executes steps ST101 to ST111 of FIG. 25 and detects valley position voltages VC' and VG' in the upper page.

In step ST129, the controller 200 executes shift reading based on the detected valley position voltages VC' and VG' and reads the data of the upper page from the NAND flash memory 100 again. The ECC circuit 260 executes ECC based on the read data and succeeds in error correction processing.

The sequential reading operation thus ends.

3.3 Effect According to This Embodiment

According to this embodiment, Vth tracking described in the first embodiment is performed for each page that has failed in reading. That is, if lower page reading fails, Vth tracking is performed for the lower page. If middle page reading fails, Vth tracking is performed for the middle page. If upper page reading fails, Vth tracking is performed for the upper page. Hence, an estimation operation is unnecessary, and data can be read using an optimum reading voltage for each page. Hence, the reading accuracy is improved.

4. Fourth Embodiment

A memory system according to the fourth embodiment will be described next. In the fourth embodiment, an erroneous detection suppressing operation of suppressing erroneously detecting, as a valley position to be detected, a valley position adjacent to the valley position to be detected is further executed in the valley position detection operation executed in each of the first to third embodiments. A case in which the erroneous detection suppressing operation is applied to the valley position detection operations according to the first and second embodiments will mainly be described below, and a case in which it is applied to the valley position detection operation according to the third embodiment will also be described as needed supplementarily.

4.1 Outline of Erroneous Detection Suppressing Operation

Figure 28:
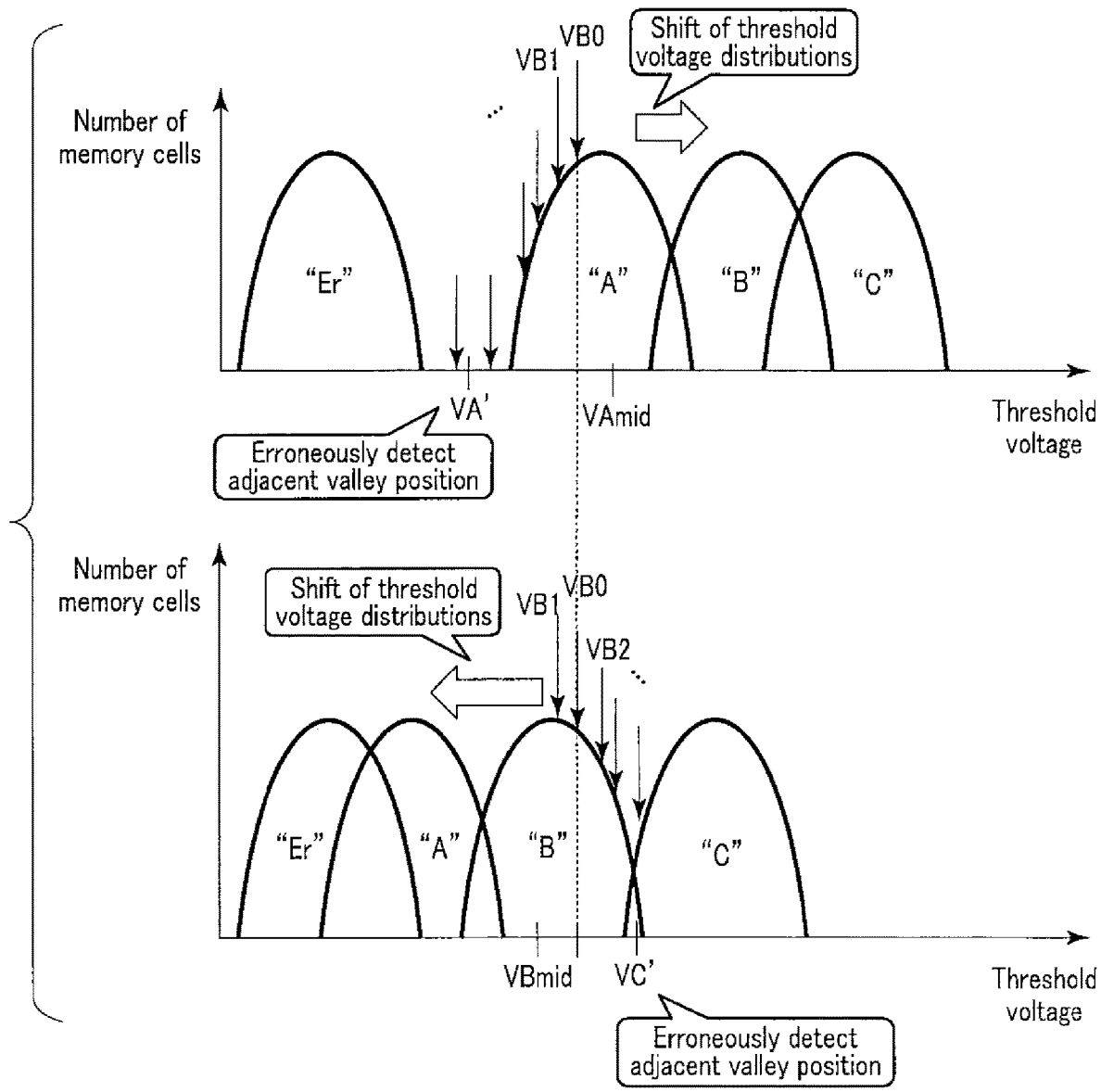
FIG. 28 is a schematic view showing the valley position detection operation of a memory system according to a comparative example.
Figure 29:
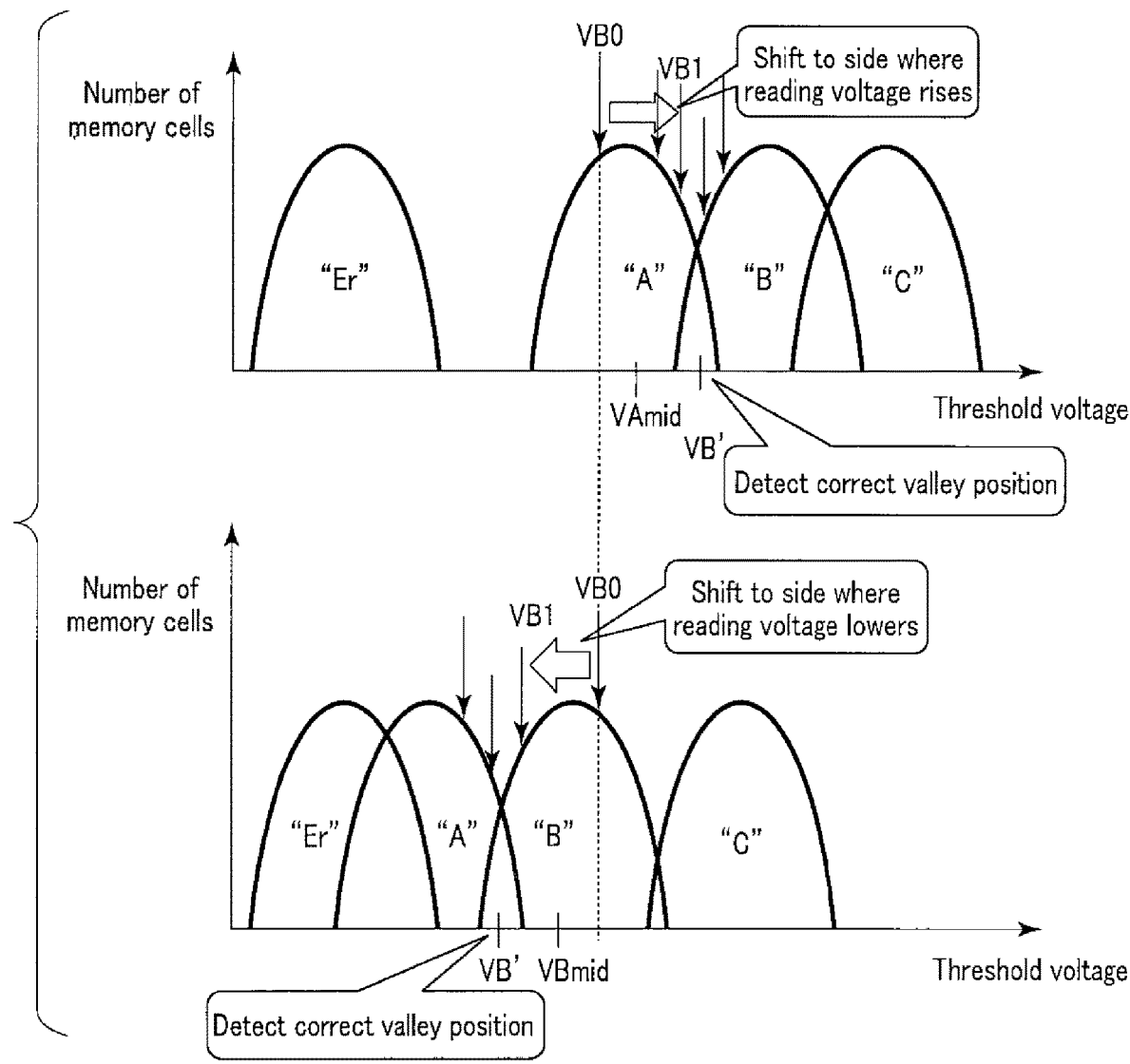
FIG. 29 is a schematic view showing the erroneous detection suppressing operation of a memory system according to a fourth embodiment.

FIGS. 28 and 29 are schematic views for explaining the valley position detection operations of memory systems according to a comparative example and the fourth embodiment, respectively. FIG. 28 shows a case in which when detecting a valley position voltage VB', valley position voltages VA' and VC' at adjacent valley positions are erroneously detected. FIG. 29 shows a case in which the valley position voltage VB' is correctly detected by the erroneous detection suppressing operation. The upper views of FIGS. 28 and 29 show a case in which the threshold voltage distributions of an "A" state and a "B" state largely shift to the right side (the side where the threshold voltage rises). The lower views of FIGS. 28 and 29 show a case in which the threshold voltage distributions of the "A" state and the "B" state largely shift to the left side (the side where the threshold voltage lowers).

As shown in the upper view of FIG. 28, if the threshold voltage distributions largely shift to the right side, a reading voltage VB0 in loop processing of m=0 in the valley position detection operation can be lower than a voltage VAmid. In this case, the reading voltages VB0, VB1, . . . are searched for in the left half of the threshold voltage distribution of the "A" state. Finally, a valley position voltage VA' at the valley position between an "Er" level and the "A" state is erroneously detected as the valley position voltage VB'.

Additionally, as shown in the lower view of FIG. 28, if the threshold voltage distributions largely shift to the left side (the side where the threshold voltage lowers), the reading voltage VB0 can be higher than a voltage VBmid. In this case, the reading voltages VB0, VB1, VB2, . . . are searched for in the right half of the threshold voltage distribution of the "B" state. Finally, a valley position voltage VC' at the valley position between the "B" state and a "C" state is erroneously detected as the valley position voltage VB'.

As described above, if VBm<VAmid, or VBm>VBmid, an erroneous detection of the valley position voltage VB' can occur. That is, if the reading voltage VBm can be set within the range higher than the voltage VAmid and lower than the voltage VBmid independently of a variation in the threshold voltage distribution (VAmid<VBm<VBmid), an erroneous detection can be suppressed.

Hence, in the erroneous detection suppressing operation, if VBm<VAmid, or VBm>VBmid, a reading voltage VB(m+1) is shifted such that VAmid<VBm(m+1)<VBmid holds, as shown in FIG. 29.

More specifically, for example, as shown in the upper view of FIG. 29, if VB0<VAmid, the reading voltage VB1 is shifted to the side where the threshold voltage rises relative to VB0. Accordingly, in the subsequent loop processing, the valley position detection operation can be performed within the range of VAmid<VB(m+1)<VBmid, and the valley position voltage VB' can correctly be detected.

In addition, for example, as shown in the lower view of FIG. 29, if VBm<VBmid, the reading voltage VB1 is shifted to the side where the threshold voltage lowers relative to VB0. Accordingly, in the subsequent loop processing, the valley position detection operation can be performed within the range of VAmid<VB(m+1)<VBmid, and the valley position voltage VB' can correctly be detected.

Figure 30:
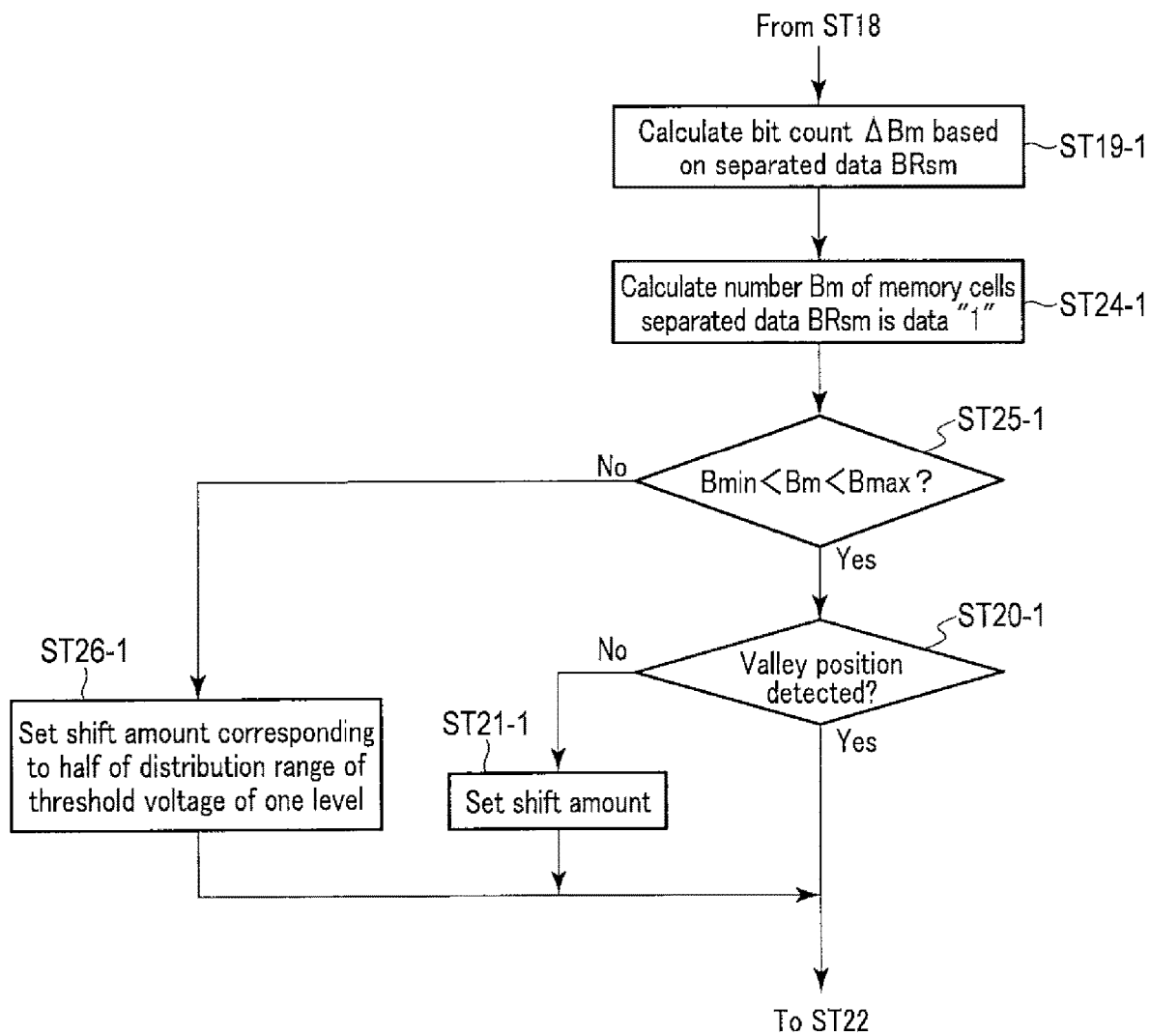
FIG. 30 is a flowchart showing the erroneous detection suppressing operation according to the fourth embodiment.

FIG. 30 is a flowchart for explaining the valley position detection operation including the erroneous detection suppressing operation according to the fourth embodiment. FIG. 30 shows an example in which steps ST24-1, ST25-1, and ST26-1 are further executed as the erroneous detection suppressing operation in addition to steps ST19-1, ST20-1, and ST21-1 shown as the valley position detection operation in FIG. 12.

As shown in FIG. 30, after a bit count ΔBm is calculated in step ST19-1 of the mth loop processing, in step ST24-1, a controller 200 calculates the number Bm of memory cells in which separated data BRsm is data "1". As described above, the number Bm of memory cells corresponds to the number of memory cells whose threshold voltage is less than the reading voltage VBm.

In step ST25-1, the controller 200 compares the magnitudes of the number Bm of memory cells and thresholds B max and B min. Upon determining that the number Bm of memory cells is not more than the threshold B min or not less than the threshold B max (Bm<B min, or Bm B max) (NO in step ST25-1), the controller 200 considers that an erroneous detection may occur, and advances to step ST26-1. Upon determining that the number Bm of memory cells is more than the threshold B min and less than the threshold B max (B min<Bm<B max) (YES in step ST25-1), the controller 200 considers that the possibility that an erroneous detection occurs is low, and advances to step ST20-1. The thresholds B min and B max are, respectively, the lower limit value and the upper limit value of the number Bm of memory cells in which no erroneous detection occurs. Details of the thresholds B min and B max will be described later.

In step ST26-1, the controller 200 sets a shift amount corresponding to the reading voltage VB(m+1) in the (m+1)th loop processing. More specifically, the controller 200 sets a shift amount corresponding to a half of the distribution range of a threshold voltage of one level. After the shift amount is set, the controller 200 advances to step ST22. Note that the shift amount in this example is merely an example, and the shift amount used for the measure against the erroneous detection can arbitrarily be set.

The erroneous detection suppressing operation thus ends.

Note that an example in which the above-described erroneous detection suppressing operation is applied to the detection operation of the valley position voltage VB' has been described above. The erroneous detection suppressing operation is also applied to the detection operation of other valley position voltages. More specifically, for example, for remaining valley position voltages VD' and VF' in the middle page, the numbers Dm and Fm of memory cells in which separated data DRsm and FRsm are data "1" are calculated in step ST24-1. In step ST25-1, using thresholds D min, D max, F min, and F max, it is determined whether D min<Dm<D max, and F min<Fm<F max.

When the fourth embodiment is applied to the third embodiment, the above-described erroneous detection suppressing operation can also be applied to the valley position detection operation for the lower page and the upper page. More specifically, for the valley position voltages VA' and VE' in the lower page, the numbers Am and Em of memory cells in which separated data ARsm and ERsm are data "1" are calculated in step ST24-1. In step ST25-1, using thresholds A min, A max, E min, and E max, it is determined whether A min<Am<A max, and E min<Em<E max. For the valley position voltages VC' and VG' in the upper page, the numbers Cm and Gm of memory cells in which separated data CRsm and GRsm are data "1" are calculated in step ST24-1. In step ST25-1, using thresholds C min, C max, G min, and G max, it is determined whether C min<Cm<C max, and G min<Gm<G max.

Figure 31:
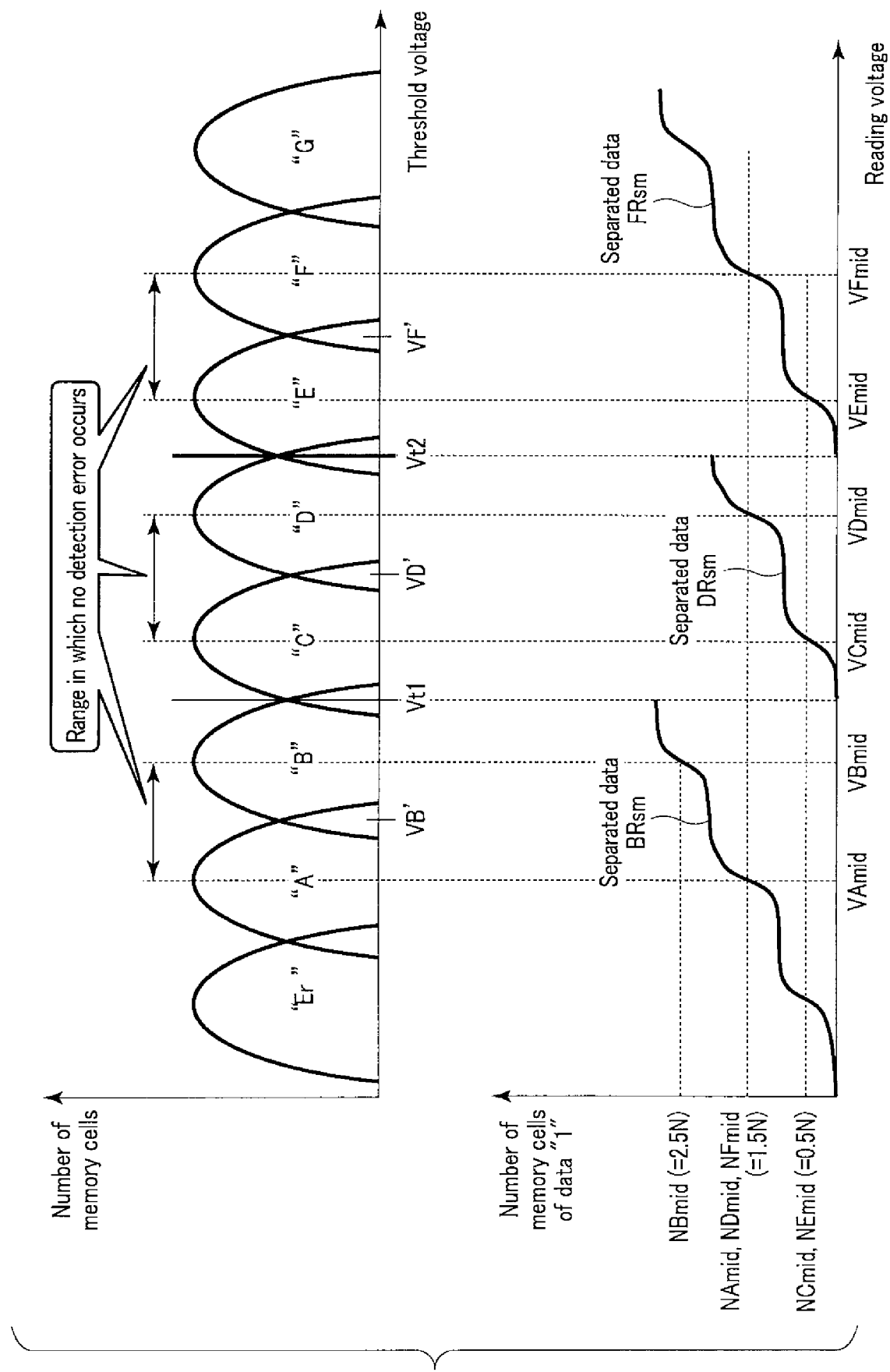
FIG. 31 is a schematic view showing the erroneous detection suppressing operation according to the fourth embodiment.

4.2 Setting of Thresholds in Valley Position Detection Operation for Middle Page Details of thresholds set in the valley position detection operation for the middle page, which is an operation commonly executed in the first to third embodiments, will be described next. The upper view of FIG. 31 shows, of the threshold voltage distributions, ranges in which no erroneous detection occurs in the valley position detection operation for the middle page. The lower view of FIG. 31 shows the relationship between separated data generated in the threshold voltage distributions shown in the upper view and the number of memory cells in which the separated data are data "1".

As described above, when the reading voltage BRm is set within the range from the voltage VAmid to the voltage VBmid independently of a variation in the threshold voltage distribution, the valley position voltage VB' is correctly detected. Additionally, as shown in the upper view of FIG. 31, for the remaining valley positions as well, when the reading voltage DRm is set within the range from the voltage VCmid that is the median of the "C" state to the voltage VDmid that is the median of the "D" state, the valley position voltage VD' is correctly detected. Also, when the reading voltage FRm is set within the range from the voltage VEmid that is the median of the "E" state to the voltage VFmid that is the median of the "F" state, the valley position voltage VF' is correctly detected.

On the other hand, as shown in the lower view of FIG. 31, the number of memory cells in which the separated data BRsm is data "1" monotonically increases up to the voltage Vt1. For this reason, the magnitude relationship between the number NAmid of memory cells in which the separated data BRsm is data "1" at the voltage VAmid and the number NBmid of memory cells in which the separated data BRsm is data "1" at the voltage VBmid corresponds to the magnitude relationship between the voltage VAmid and the voltage VBmid in a one-to-one correspondence. That is, if the number Bm of memory cells satisfies NAmid<Bm<NBmid, the reading voltage VBm satisfies VAmid<VBm<VBmid. Hence, when the thresholds B min and B max are set such that B min=NAmid, and B max=NBmid hold, it can be determined whether the valley position voltage VB' is erroneously detected.

In addition, the number of memory cells in which the separated data DRsm is data "1" monotonically increases from the voltage Vt1 to the voltage Vt2. For this reason, the magnitude relationship between the number NCmid of memory cells in which the separated data DRsm is data "1" at the voltage VCmid and the number NDmid of memory cells in which the separated data DRsm is data "1" at the voltage VDmid corresponds to the magnitude relationship between the voltage VCmid and the voltage VDmid in a one-to-one correspondence. That is, if the number Dm of memory cells satisfies NCmid<Dm<NDmid, the reading voltage VDm satisfies VCmid<VDm<VDmid. Hence, when the thresholds D min and D max are set such that D min=NCmid, and D max=NDmid hold, it can be determined whether the valley position voltage VD' is erroneously detected.

In addition, the number of memory cells in which the separated data FRsm is data "1" monotonically increases from the voltage Vt2. For this reason, the magnitude relationship between the number NEmid of memory cells in which the separated data FRsm is data "1" at the voltage VEmid and the number NFmid of memory cells in which the separated data FRsm is data "1" at the voltage VFmid corresponds to the magnitude relationship between the voltage VEmid and the voltage VFmid in a one-to-one correspondence. That is, if the number Fm of memory cells satisfies NEmid<Fm<NFmid, the reading voltage VFm satisfies VEmid<VFm<VFmid. Hence, when the thresholds F min and F max are set such that F min=NEmid, and F max=NFmid hold, it can be determined whether the valley position voltage VF' is erroneously detected.

Note that in data writing, if data is written (randomized) such that the threshold voltages are evenly distributed to all levels, the number (N) of memory cells distributed to one level is expected to be almost uniform. In this case, based on the number N of memory cells, the numbers NCmid and NEmid of memory cells can be expressed as "0.5N", the numbers NAmid, NDmid, and NFmid of memory cells can be expressed as "1.5N", and the number NBmid of memory cells can be expressed as "2.5N".

That is, as shown in FIG. 32, the thresholds B min and B max are preferably set to "1.5N" and "2.5N", respectively, relative to the number N of memory cells. The thresholds D min and D max are preferably set to "0.5N" and "1.5N", respectively, relative to the number N of memory cells. The thresholds F min and F max are preferably set to "0.5N" and "1.5N", respectively, relative to the number N of memory cells.

4.3 Setting of Thresholds in Valley Position Detection Operation for Lower Page Details of thresholds set in the valley position detection operation for the lower page, which is an operation particularly executed in the third embodiment, will be described next. The thresholds in the lower page can be set like the thresholds in the above-described middle page.

Figure 33:
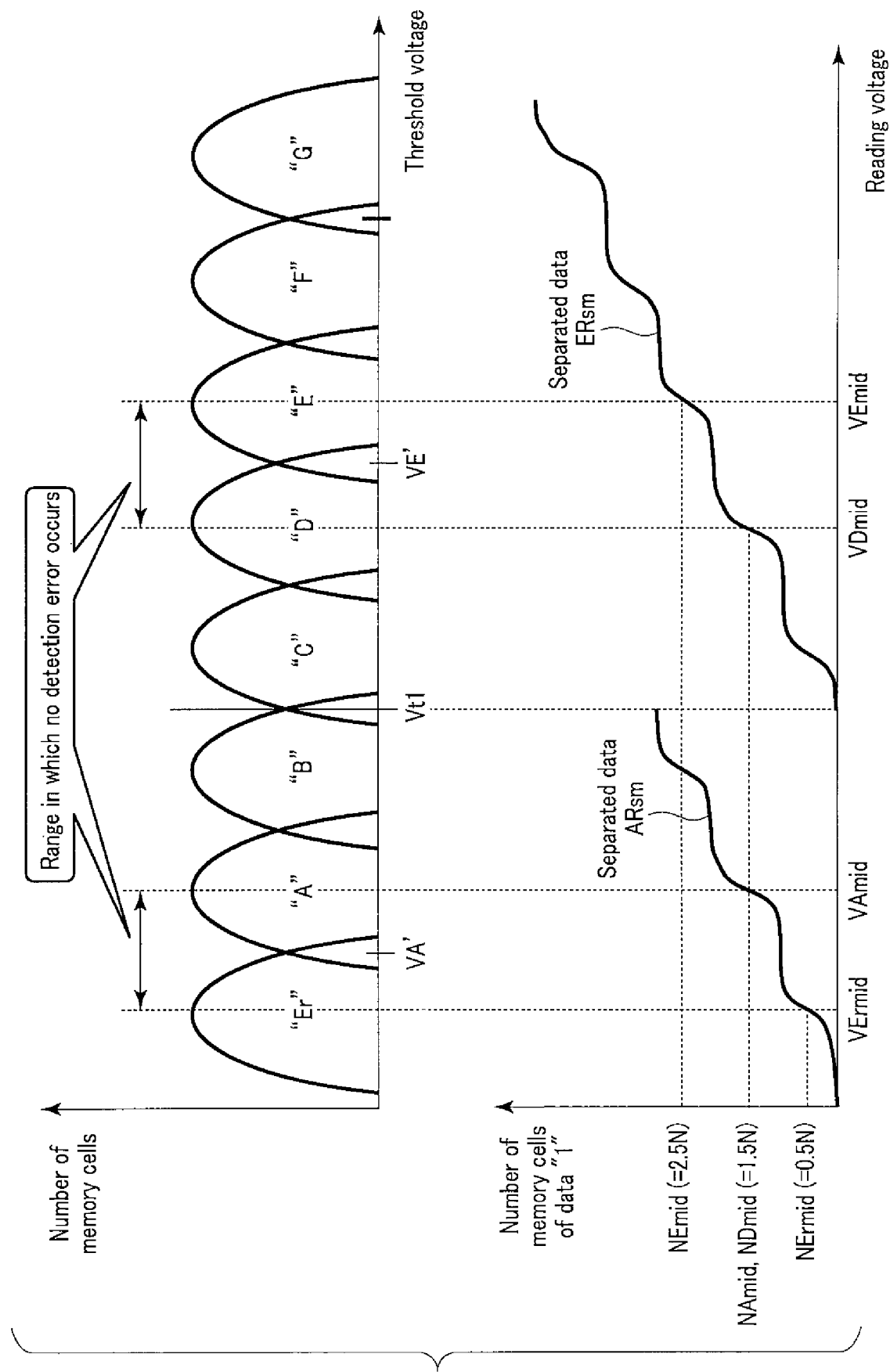
FIG. 33 is a schematic view showing the erroneous detection suppressing operation according to the fourth embodiment.

The upper view of FIG. 33 shows, of the threshold voltage distributions, ranges in which no erroneous detection occurs in the valley position detection operation for the lower page. The lower view of FIG. 33 shows the relationship between separated data generated in the threshold voltage distributions shown in the upper view of FIG. 33 and the number of memory cells in which the separated data are data "1".

As shown in the upper view of FIG. 33, in the valley position detection operation for the lower page, when the reading voltage VAm is set within the range from a voltage VErmid that is the median of the "Er" level to the voltage VAmid, the valley position voltage VA' is correctly detected. In addition, when the reading voltage VEm is set within the range from the voltage VDmid to the voltage VEmid, the valley position voltage VE' is correctly detected.

On the other hand, as shown in the lower view of FIG. 33, the number of memory cells in which the separated data ARsm is data "1" monotonically increases from a voltage 0 to the voltage Vt1. For this reason, the magnitude relationship between the number NErmid of memory cells in which the separated data ARsm is data "1" at the voltage VErmid and the number NAmid of memory cells in which the separated data ARsm is data "1" at the voltage VAmid corresponds to the magnitude relationship between the voltage VErmid and the voltage VAmid in a one-to-one correspondence. That is, if the number Am of memory cells satisfies NErmid<Am<NAmid, the reading voltage VAm satisfies VErmid<VAm<VAmid. Hence, when the thresholds A min and A max are set such that A min=NErmid, and A max=NAmid hold, it can be determined whether the valley position voltage VA' is erroneously detected.

In addition, the number of memory cells in which the separated data ERsm is data "1" monotonically increases from the voltage Vt1. For this reason, the magnitude relationship between the number NDmid of memory cells in which the separated data ERsm is data "1" at the voltage VDmid and the number NEmid of memory cells in which the separated data ERsm is data "1" at the voltage VEmid corresponds to the magnitude relationship between the voltage VDmid and the voltage VEmid in a one-to-one correspondence. That is, if the number Em of memory cells satisfies NDmid<Em<NEmid, the reading voltage VEm satisfies VDmid<VEm<VEmid. Hence, when the thresholds E min and E max are set such that E min=NDmid, and E max=NEmid hold, it can be determined whether the valley position voltage VE' is erroneously detected.

Note that in a case in which data writing to the NAND flash memory 100 is randomized, based on the number N of memory cells considered to be distributed to one level, the number NErmid of memory cells can be expressed as "0.5N", the numbers NAmid and NDmid of memory cells can be expressed as "1.5N", and the number NEmid of memory cells can be expressed as "2.5N".

That is, as shown in FIG. 34, the thresholds A min and A max are preferably set to "0.5N" and "1.5N", respectively, relative to the number N of memory cells. The thresholds E min and E max are preferably set to "1.5N" and "2.5N", respectively, relative to the number N of memory cells.

4.4 Setting of Thresholds in Valley Position Detection Operation for Upper Page Details of thresholds set in the valley position detection operation for the upper page, which is an operation particularly executed in the third embodiment, will be described next. The thresholds in the upper page can be set like the above-described thresholds in the middle and lower pages.

The upper view of FIG. 35 shows, of the threshold voltage distributions, ranges in which no erroneous detection occurs in the valley position detection operation for the upper page. The lower view of FIG. 35 shows the relationship between separated data generated in the threshold voltage distributions shown in the upper view and the number of memory cells in which the separated data are data "1".

As shown in the upper view of FIG. 35, in the valley position detection operation for the upper page, when the reading voltage VCm is set within the range from the voltage VBmid to the voltage VCmid, the valley position voltage VC' is correctly detected. In addition, when the reading voltage VGm is set within the range from the voltage VFmid to the voltage VGmid that is the median of the "G" state, the valley position voltage VG' is correctly detected.

On the other hand, as shown in the lower view of FIG. 35, the number of memory cells in which the separated data CRsm is data "1" monotonically increases from the voltage 0 to the voltage Vt2. For this reason, the magnitude relationship between the number NBmid of memory cells in which the separated data CRsm is data "1" at the voltage VBmid and the number NCmid of memory cells in which the separated data CRsm is data "1" at the voltage VCmid corresponds to the magnitude relationship between the voltage VBmid and the voltage VCmid in a one-to-one correspondence. That is, if the number Cm of memory cells satisfies NBmid<Cm<NCmid, the reading voltage VCm satisfies VBmid<VCm<VCmid. Hence, when the thresholds C min and C max are set such that C min=NBmid, and C max=NCmid hold, it can be determined whether the valley position voltage VC' is erroneously detected.

In addition, the number of memory cells in which the separated data GRsm is data "1" monotonically increases from the voltage Vt2. For this reason, the magnitude relationship between the number NFmid of memory cells in which the separated data GRsm is data "1" at the voltage VFmid and the number NGmid of memory cells in which the separated data GRsm is data "1" at the voltage VGmid corresponds to the magnitude relationship between the voltage VFmid and the voltage VGmid in a one-to-one correspondence. That is, if the number Gm of memory cells satisfies NFmid<Gm<NGmid, the reading voltage VGm satisfies VFmid<VGm<VGmid. Hence, when the thresholds G min and G max are set such that G min=NFmid, and G max=NGmid hold, it can be determined whether the valley position voltage VG' is erroneously detected.

Note that in a case in which data writing to the NAND flash memory 100 is randomized, based on the number N of memory cells considered to be distributed to one level, the number NFmid of memory cells can be expressed as "1.5N", the numbers NBmid and NGmid of memory cells can be expressed as "2.5N", and the number NCmid of memory cells can be expressed as "3.5N".

That is, as shown in FIG. 36, the thresholds C min and C max are preferably set to "2.5N" and "3.5N", respectively, relative to the number N of memory cells. The thresholds G min and G max are preferably set to "1.5N" and "2.5N", respectively, relative to the number N of memory cells.

4.5 Effect According to This Embodiment

As described above, according to this embodiment, even if the threshold voltage distribution largely shifts, tracking within an appropriate range can be performed, and a reading voltage erroneous detection can be suppressed.

5. Fifth Embodiment

A memory system according to the fifth embodiment will be described next. In the fifth embodiment, a correction value considering the influence (this will be referred to as an inter-cell effect) from the threshold variation amount of a memory cell transistor MT connected to a word line WL(n+1) adjacent to a word line WLn is applied to the valley position voltage of the memory cell transistor MT connected to the word line WLn, which is detected and estimated by Vth tracking. Note that n is the number of the selected word line, which takes one of values 0 to 6 in this example. This is because in this example, the number of memory cell transistors included in one NAND string is 8, and the inter-cell effect needs not be taken into consideration for the memory cell transistor MT connected to a word line WL7 (n=7) located closest to the drain (in other words, the word line WL(n+1) adjacent on the drain side does not exist for the word line WL7 according to this example).

In the following explanation, as shown in FIG. 37, the memory cell transistors MT connected to the adjacent word lines WL(n+1) are divided into three groups Gr1 to Gr3. The "Er" level and the "A" level belong to the group Gr1, and the inter-cell effect is considered to be almost absent between them. The "B" to "E" levels belong to the group Gr2, and they are assumed to have a moderate influence. The "F" level and the "G" level belong to the group Gr3, and the inter-cell effect between them is assumed to be the largest. However, this embodiment is not limited to this. For example, the memory cell transistors MT connected to the adjacent word lines WL(n+1) can be divided into two or more than three groups.

5.1 Flowchart

An operation including a Vth tracking operation according to the fifth embodiment will be described next with reference to the flowchart shown in FIG. 38.

As shown in FIG. 38, in step ST131, a controller 200 issues, to a NAND flash memory 100, a normal reading command that applies a predetermined reading voltage VCGRV to the memory cell transistor MT connected to the word line WLn.

In step ST132, the NAND flash memory 100 executes normal reading for the memory cell transistor MT connected to the word line WLn and transmits read data to the controller 200.

In step ST133, an ECC circuit 260 executes ECC based on the read data of normal reading. If the read data of normal reading passes ECC (pass in step ST133), the controller 200 advances to step ST140. If the read data fails in ECC (fail in step ST133), the controller 200 advances to step ST134.

In step ST134, the controller 200 and the NAND flash memory 100 execute Vth tracking with shift reading and detect a valley position voltage VCGRV'. More specifically, for example, if the data of the middle page is the reading target, valley position voltages VB', VD', and VF' are detected. Note that the Vth tracking with shift reading includes, for example, M-point Vth tracking described in the first to fourth embodiments, but the present invention is not limited to this.

In step ST135, the controller 200 issues, to the NAND flash memory 100, a command used to correct the valley position voltage VCGRV' of the valley position detected in step ST134.

In step ST136, the controller 200 issues, to the NAND flash memory 100, a command that instructs the NAND flash memory 100 to do an operation including preliminary reading for the memory cell transistor MT connected to the word line WL(n+1) and main-reading for the memory cell transistor MT connected to the word line WLn. Note that in the main-reading operation, reading based on the valley position corrected in step ST135 is executed for the valley position detected in step ST134.

In step ST137, the NAND flash memory 100 executes preliminary reading for the memory cell transistor MT connected to the word line WL(n+1) and, for example, holds read data in a latch circuit.

In step ST138, the NAND flash memory 100 executes main-reading for the memory cell transistor MT connected to the word line WLn. Read data by the main-reading is decided based on the preliminary read data read in step ST137. The NAND flash memory 100 transmits the main-read data to the controller 200.

In step ST139, an ECC circuit 260 executes ECC based on the main-read data. If the main-read data passes ECC (pass in step ST139), the controller 200 advances to step ST140. If the main-read data fails in ECC (fail in step ST139), the controller 200 advances to step ST141.

In steps ST140, the controller 200 acquires the status of ECC pass, and ends the operation. In step ST141, the controller 200 determines based on the ECC result that the data cannot properly be corrected, and ends the operation.

The operation including the Vth tracking thus ends.

5.2 Command Sequence

Figure 39:
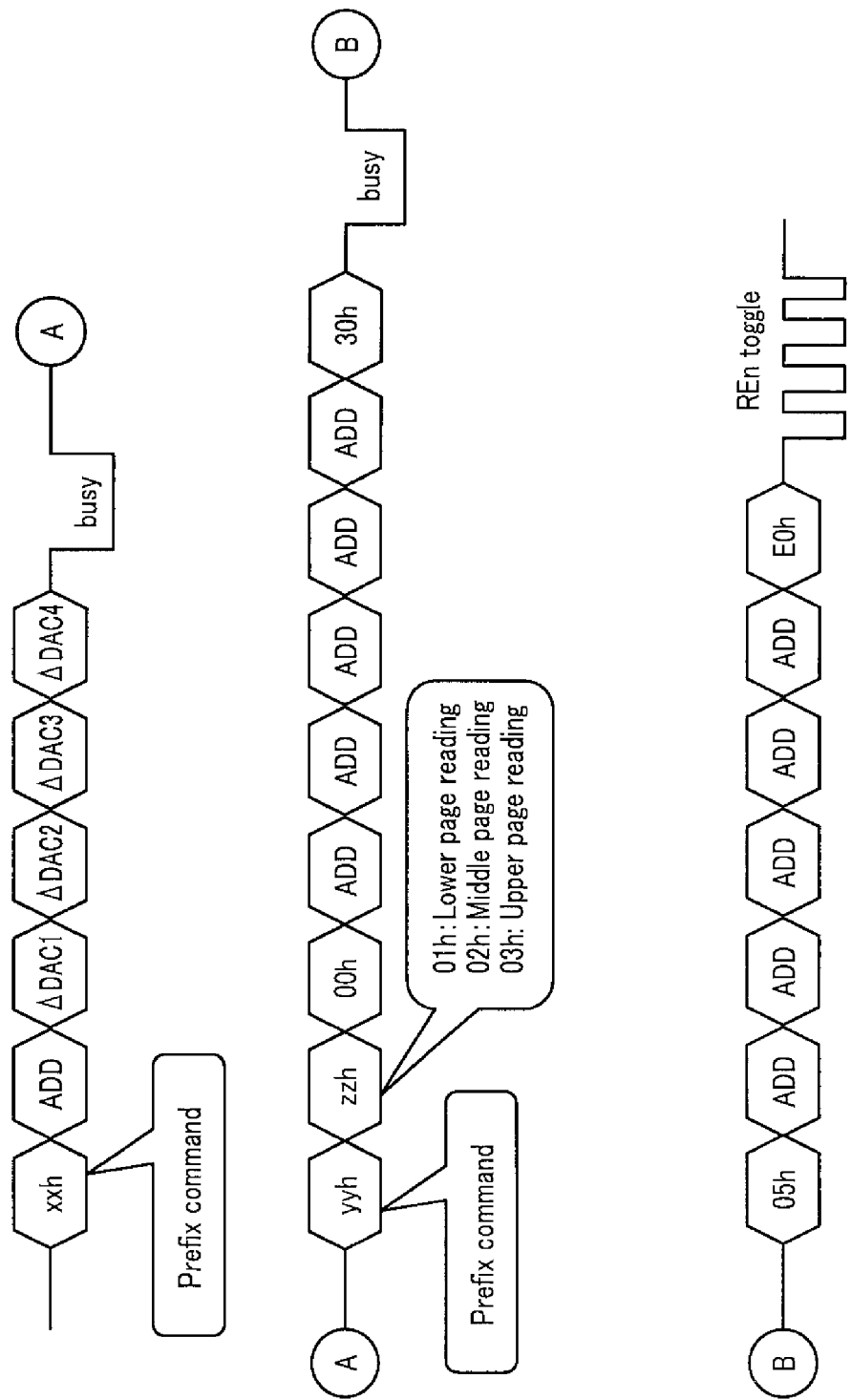
FIG. 39 is a command sequence showing the Vth tracking operation of the memory system according to the fifth embodiment.

An operation including preliminary reading and main-reading according to the fifth embodiment will be described next using a command sequence shown in FIG. 39. FIG. 39 corresponds to steps ST135 to ST138 shown in FIG. 38.

As shown in FIG. 39, first, the controller 200 issues a prefix command "xxh". The command "xxh" is a command used by the controller 200 to set, to the NAND flash memory 100, the shift amount of shift reading corresponding to main-reading to be executed later. Subsequently, the controller 200 issues addresses for, for example, one cycle. After that, the controller 200 issues values ΔDAC1 to ΔDAC4 corresponding to the shift amount of a voltage VCGRVdef for, for example, four cycles. A DAC (D/A converter) value is, for example, an instruction value used by the controller 200 to designate the reading voltage VCGRV to the NAND flash memory 100. For example, each of the values ΔDAC1 to ΔDAC4 corresponds to a shift amount Δ from the reading voltage VCGRVdef of a level applied to the selected word line WL in shift reading.

During the setting of the shift amount Δ, the NAND flash memory 100 notifies the controller 200 that the NAND flash memory 100 is in the ready state by setting a signal RBn to "H" level.

Note that in the fifth embodiment, the shift amount Δ is decided using, for example, the valley position voltage VCGRV' and a correction value ΔVCGRV, in accordance with $$\Delta = (VCGRV' - VCGRVdef) + \Delta VCGRV \quad (9)$$

That is, a valley position voltage VCGRV" after correction, which is applied to the word line WLn in the main-reading later, is expressed, using the valley position voltage VCGRV' detected in step ST134 of FIG. 38 and the correction value ΔVCGRV, as $$VCGRV'' = VCGRVdef + \Delta = VCGRV' + \Delta VCGRV \quad (10)$$

Figure 40:
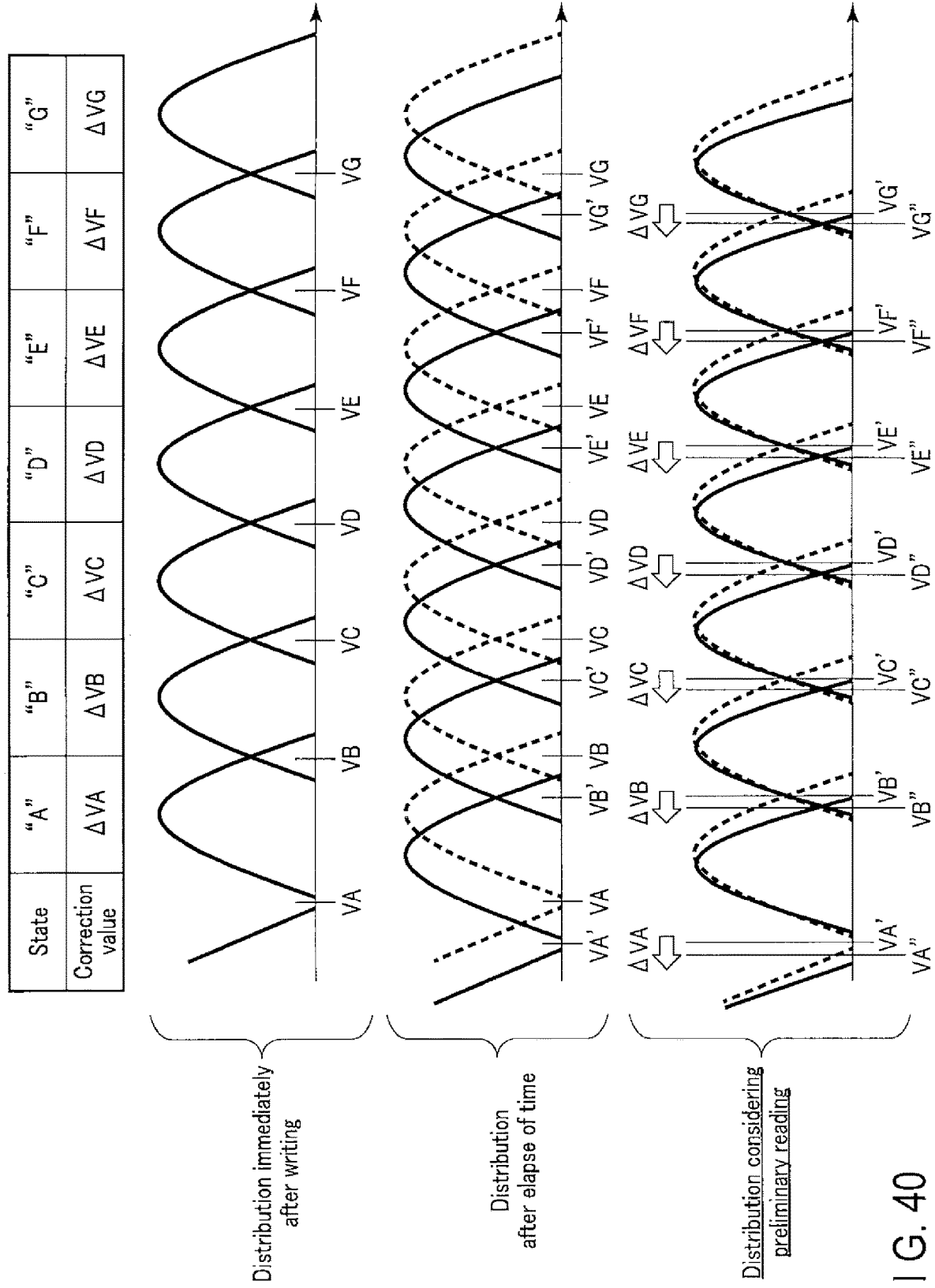
FIG. 40 is a table showing correction values of shift reading according to the fifth embodiment.

Note that the correction value ΔVCGRV is, for example, a predetermined value, and is held by a memory 220 in the controller 200 as, for example, a lookup table as shown in FIG. 40. As shown in FIG. 40, the correction value ΔVCGRV is set to a value according to the state of the threshold voltage distribution. More specifically, correction values ΔVA, ΔVB, ΔVC, ΔVD, ΔVE, ΔVF, and ΔVG are applied to the memory cell transistors MT in the "A" state, "B" state, "C" state, "D" state, "E" state, "F" state, and "G" state, respectively. Note that the correction values ΔVA to ΔVG can be set to values independent of each other. That is, the correction values ΔVA to ΔVG may be equal to each other or different from each other. In addition, the correction values ΔVA to ΔVG may be set to "0". That is, the valley position voltage VCGRV" after correction may be equal to or different from the valley position voltage VCGRV' before correction.

FIG. 40 also shows the relationship between VCGRV", VCGRV', and ΔVCGRV. As shown in FIG. 40, in the threshold voltage distributions immediately after writing, the valley positions between the distributions are VA to VG. However, the threshold voltage distributions tend to shift to the low voltage side along with the elapse of time. As a result, the valley positions between the distributions shift from VA to VG to VA' to VG'. This is VCGRV'. In addition, the valley positions considering the inter-cell effect from the word line WL(n+1) are VA" to VG". This is VCGRV". The differences between the VA' to VG' and VA" to VG" are the correction values ΔVA to ΔVG. A valley position detected by Vth tracking without considering the inter-cell effect is VCGRV'. In this embodiment, the correction value ΔVCGRV is applied to VCGRV', thereby obtaining VCGRV". Reading is performed again using VCGRV" to reduce the influence of the inter-cell effect.

Referring back to FIG. 39, the next command sequence will be described. When the NAND flash memory 100 is set in the ready state, the controller 200 issues a command "yyh". The command "yyh" is a command used to declare to execute preliminary reading for the memory cell transistor MT connected to the word line WL(n+1) adjacent to the word line WLn that is the reading target and main-reading for the memory cell transistor MT connected to the word line WLn.

Next, the controller 200 issues a command "zzh". The command "zzh" is a variable, which, for example, instructs lower page reading when "zzh"="01h", instructs middle page reading when "zzh"="02h", and instructs upper page reading when "zzh"="03h".

After that, the controller 200 issues a first reading command "00h", and subsequently issues addresses (including a column address, a block address, and a page address) for, for example, five cycles. After that, the controller 200 issues a second reading command "30h".

When the command "30h" is stored in a command register 160, a sequencer 170 starts the reading operation by controlling a row decoder 120, a column control circuit 140, and the like. The NAND flash memory 100 notifies the controller 200 that the NAND flash memory 100 is in the busy state by setting the signal RBn to "L" level. First, in preliminary reading, the NAND flash memory 100 reads data from the memory cell transistor MT connected to the word line WL(n+1) using a reading level (one level may be used, or two or more levels may be used) considering the influence of the inter-cell effect, and causes a latch circuit to hold the data. Next, in main-reading, based on the result of the preliminary reading, the NAND flash memory 100 reads data of one page from the memory cell transistor MT connected to the word line WL, and causes a latch circuit to hold the data. The NAND flash memory 100 notifies the controller 200 that the NAND flash memory 100 is in the ready state by setting the signal RBn to "H" level.

When the NAND flash memory 100 is set in the ready state, the controller 200 issues a command "05h". The command "05h" is a command used to declare to execute data reading from a cache memory or the like that holds the read data in the NAND flash memory 100. In this example, the command declares an instruction of read from the latch circuit that holds the main-reading result. Next, the controller 200 issues addresses for, for example, five cycles. The cycles for addresses are not limited to five cycles, and may be, for example, two cycles to designate only the column address. After that, the controller 200 issues a second reading command "E0h". The command "E0h" is a command that instructs the NAND flash memory 100 to output data from the latch circuit designated by the address. The controller 200 repetitively asserts a signal REn. Every time the signal REn is toggled, the data of main-reading held by the latch circuit is transmitted to the controller 200.

5.3 Timing Chart

Figure 41:
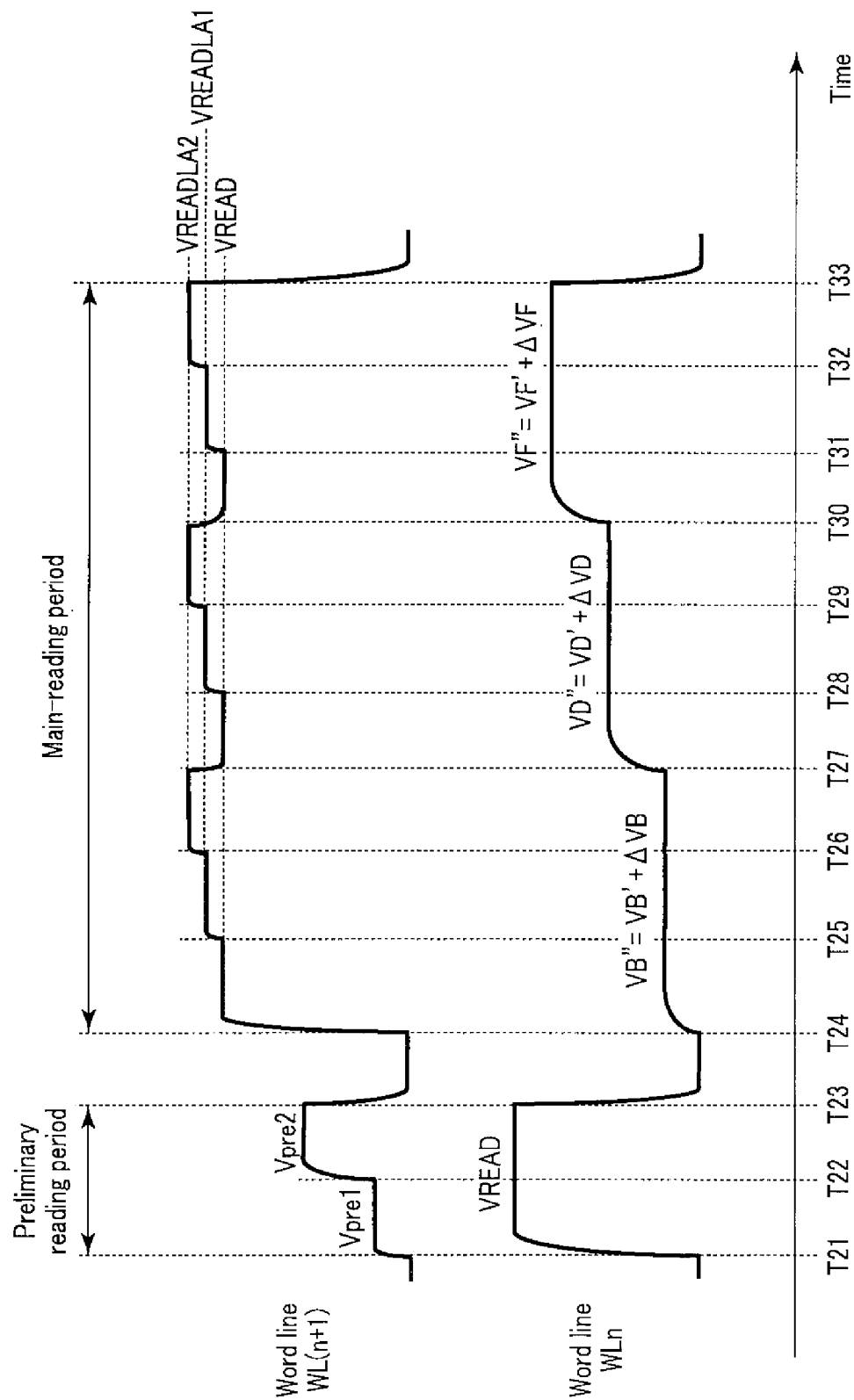
FIG. 41 is a timing chart showing the Vth tracking operation according to the fifth embodiment.

An operation including preliminary reading and main-reading according to the fifth embodiment will be described next with reference to the timing chart shown in FIG. 41. FIG. 41 corresponds to steps ST137 and ST138 shown in FIG. 38.

As shown in FIG. 41, a period of times T21 to T23 includes a preliminary reading period, and a period of times T24 to T33 includes an main-reading period.

First, the sequencer 170 performs preliminary reading. The row decoder 120 applies a voltage Vpref1 to the word line WL(n+1) at time T21, and applies a voltage Vpref2 at time T22. In addition, the row decoder 120 applies a voltage VREAD to the word line WLn from time T21 to time T23. As a result, which group the data of the memory cell transistor MT connected to the word line WL(n+1) in a selected string unit SU belongs to is determined as the preliminary reading result. The sequencer 170 causes a latch circuit to hold the preliminary reading result.

Next, the row decoder 120 applies the voltage VB"=VB'+ΔVB to the word line WLn during a reading operation BR (from time T24 to time T27). The row decoder 120 applies the voltage VREAD to the word line WL(n+1) from time T24, applies a voltage VREADLA1 from time T25, and applies a voltage VREADLA2 from time T26. The voltages VREAD, VREADLA1, and VREADLA2 satisfy, for example, VREAD<VREADLA1<VREADLA2. The voltage VREAD is applied to the remaining unselected word lines WL. For a column (bit line BL) for which the preliminary reading result represents the group Gr1, the column control circuit 140 determines the data at the timing of assertion of a signal STB between time T24 and time T25. For a column for which the preliminary reading result represents the group Gr2, the column control circuit 140 determines the data at the timing of assertion of the signal STB between time T25 and time T26. For a column for which the preliminary reading result represents the group Gr3, the column control circuit 140 determines the read data at the timing of assertion of the signal STB between time T26 and time T27.

Next, the row decoder 120 applies the voltage VD"=VD'+ΔVD to the word line WLn during a reading operation DR (from time T27 to time T30). The row decoder 120 applies the voltage VREAD to the word line WL(n+1) from time T27, applies the voltage VREADLA1 from time T28, and applies the voltage VREADLA2 from time T29. The voltage VREAD is applied to the remaining unselected word lines WL. For a column for which the preliminary reading result represents the group Gr1, the column control circuit 140 determines the data at the timing of assertion of the signal STB between time T27 and time T28. For a column for which the preliminary reading result represents the group Gr2, the column control circuit 140 determines the data at the timing of assertion of the signal STB between time T28 and time T29. For a column for which the preliminary reading result represents the group Gr3, the column control circuit 140 determines the read data at the timing of assertion of the signal STB between time T29 and time T30.

Next, the row decoder 120 applies the voltage VF"=VF'+ΔVF to the word line WLn during a reading operation FR (from time T30 to time T33). The row decoder 120 applies the voltage VREAD to the word line WL(n+1) from time T30, applies the voltage VREADLA1 from time T31, and applies the voltage VREADLA2 from time T32. The voltage VREAD is applied to the remaining unselected word lines WL. For a column for which the preliminary reading result represents the group Gr1, the column control circuit 140 determines the data at the timing of assertion of the signal STB between time T30 and time T31. For a column for which the preliminary reading result represents the group Gr2, the column control circuit 140 determines the data at the timing of assertion of the signal STB between time T31 and time T32. For a column for which the preliminary reading result represents the group Gr3, the column control circuit 140 determines the read data at the timing of assertion of the signal STB between time T32 and time T33.

The operation including preliminary reading and main-reading thus ends.

5.4 Effect According to this Embodiment

The threshold of the memory cell transistor MT sometimes varies due to the influence of the threshold variation amount of the adjacent memory cell transistor MT (inter-cell effect). In this embodiment, the data of the adjacent word line WL(n+1) is read by preliminary reading, and the read data is determined by main-reading based on the result. It is therefore possible to suppress the influence of the inter-cell effect and improve the reading accuracy. However, a valley position detected by performing Vth tracking without considering the inter-cell effect may be shifted from a valley position when reading the data in consideration of the inter-cell effect. Hence, in this embodiment, the shift amount is corrected by the correction value ΔV prepared in advance. In this way, when data reading considering the inter-cell effect is performed using an optimum valley position, accurate data reading can be performed.

5.5 Modification

In the above fifth embodiment, a case in which the amount of valley position shift that occurs when the influence of the inter-cell effect is taken into consideration is applied a the correction value ΔV to the valley position voltage VCGRV' detected by Vth tracking. However, the present invention is not limited to this. For example, the valley position voltage VCGRV" considering correction corresponding to the above-described correction value ΔV may be detected by considering the influence of the inter-cell effect to shift reading executed in Vth tracking. A description of the same parts as in the fifth embodiment will be omitted, and parts different from the fifth embodiment will be described below.

5.5.1 Flowchart

Figure 42:
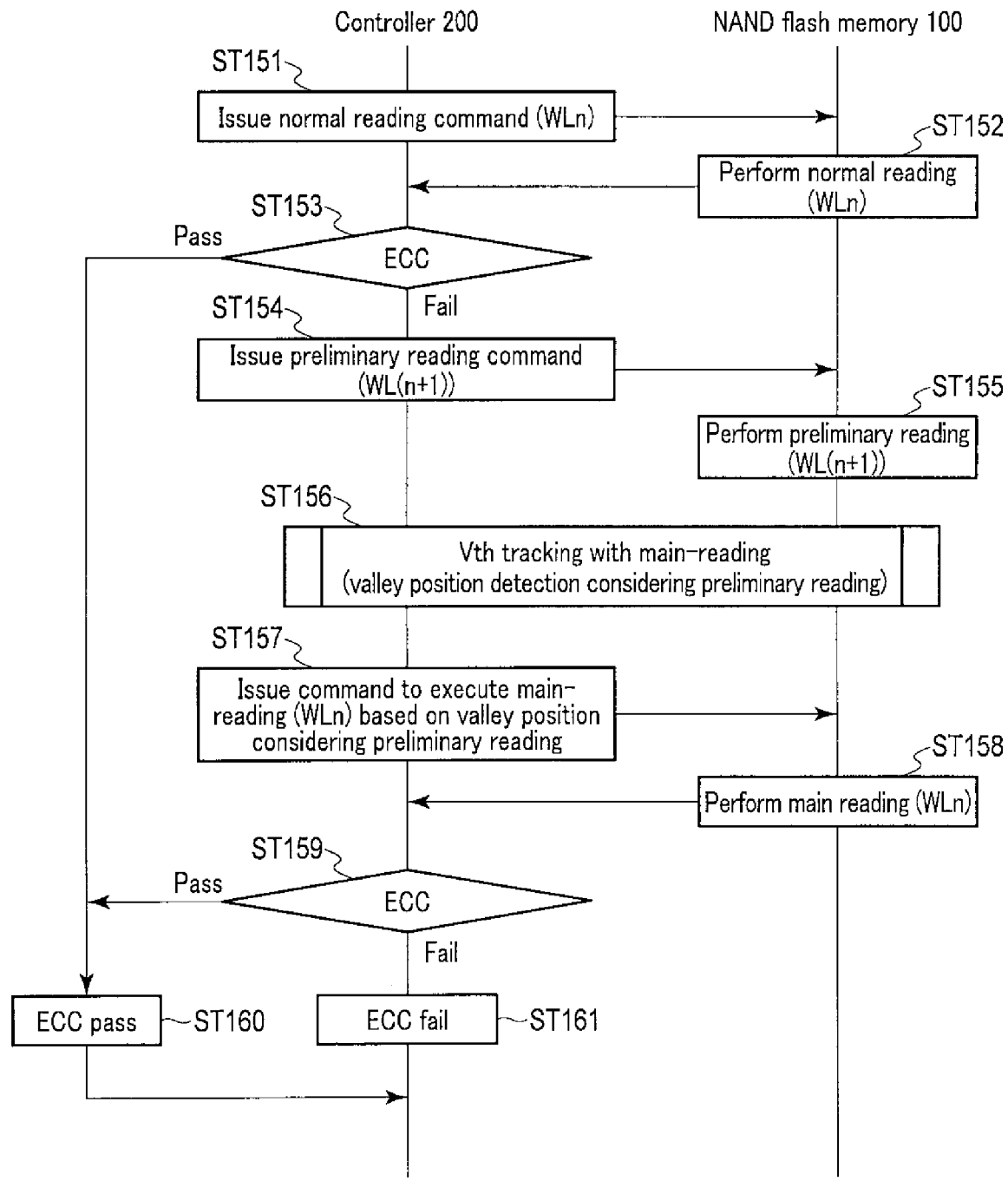
FIG. 42 is a flowchart showing the Vth tracking operation of a memory system according to a modification of the fifth embodiment.

An operation including a Vth tracking operation according to a modification of the fifth embodiment will be described first with reference to the flowchart shown in FIG. 42. FIG. 42 corresponds to FIG. 38.

As shown in FIG. 42, steps ST151 to ST153 are the same as steps ST131 to ST133 shown in FIG. 38, and a description thereof will be omitted.

In step ST154, the controller 200 issues, to the NAND flash memory 100, a command that instructs the NAND flash memory 100 to do an operation including preliminary reading for the memory cell transistor MT connected to the word line WL(n+1).

In step ST155, the NAND flash memory 100 executes preliminary reading for the memory cell transistor MT connected to the word line WL(n+1) and holds read data in a latch circuit.

In step ST156, the controller 200 and the NAND flash memory 100 execute Vth tracking with shift reading and detect a valley position. Here, the shift reading in step ST156 corresponds to main-reading based on the result of preliminary reading in step ST155. For this reason, the controller 200 detects the valley position voltage VCGRV" that can be different from the valley position voltage VCGRV' detected in step ST134 of FIG. 38. More specifically, for example, if the data of the middle page is the reading target, the valley position voltages VB", VD", and VF" are detected.

In step ST157, the controller 200 issues, to the NAND flash memory 100, a command that instructs the NAND flash memory 100 to do an operation including main-reading for the memory cell transistor MT connected to the word line WLn. Note that in this main-reading operation, reading based on the valley position detected in step ST156 is executed.

In step ST158, the NAND flash memory 100 executes main-reading for the memory cell transistor MT connected to the word line WLn. Read data by the main-reading is decided based on the preliminary read data read in step ST155. The NAND flash memory 100 transmits the main-read data to the controller 200.

Steps ST159 to ST161 are the same as steps ST139 to ST141 shown in FIG. 38, and a description thereof will be omitted.

The operation including Vth tracking thus ends.

5.5.2 Command Sequence

Figure 43:
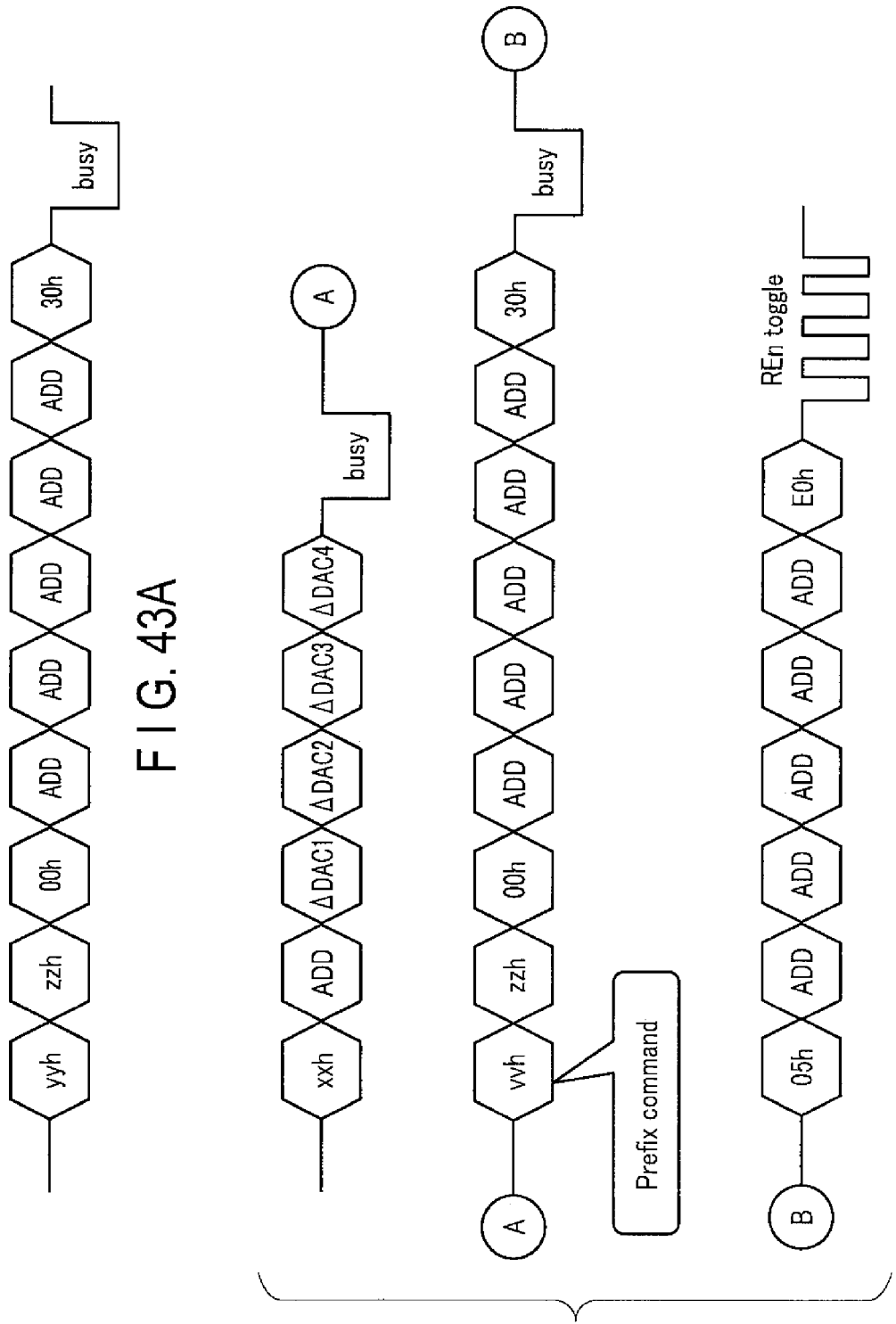
FIGS. 43A and 43B are command sequences showing the Vth tracking operation according to the modification of the fifth embodiment.

An operation including preliminary reading and main-reading according to the modification of the fifth embodiment will be described next using a command sequence shown in FIGS. 43A and 43B. FIG. 43A corresponds to step ST154 shown in FIG. 42, and FIG. 43B shows a sequence common to steps ST156 and ST157.

As shown in FIG. 43A, the controller 200 issues commands "yyh" and "zzh" continuously to execute the preliminary reading operation. Then, the controller 200 issues the first reading command "00h", and subsequently issues addresses (including a column address, a block address, and a page address) for, for example, five cycles. After that, the controller 200 issues the second reading command "30h".

When the command "30h" is stored in the command register 160, the sequencer 170 starts the reading operation by controlling the row decoder 120, the column control circuit 140, and the like. The NAND flash memory 100 notifies the controller 200 that the NAND flash memory 100 is in the busy state by setting the signal RBn to "L" level. First, in preliminary reading, the NAND flash memory 100 reads data from the memory cell transistor MT connected to the word line WL(n+1) using a reading level considering the influence of the inter-cell effect, and causes a latch circuit to hold the data. Next, in main-reading, based on the result of the preliminary reading, the NAND flash memory 100 reads data of one page from the memory cell transistor MT connected to the word line WL. However, in the following operation, only the preliminary read data needs to be held, and the main-read data is unnecessary. Hence, the main-read data read by this operation may be discarded. The NAND flash memory 100 notifies the controller 200 that the NAND flash memory 100 is in the ready state by setting the signal RBn to "H" level.

The preliminary reading operation thus ends.

As shown in FIG. 43B, to execute the main-reading operation, the controller 200 issues the prefix command "xxh", and subsequently issues addresses for, for example, one cycle. After that, the controller 200 issues the values ΔDAC1 to ΔDAC4 corresponding to the shift amount of the voltage VCGRVdef for, for example, four cycles, and sets the shift amount Δ. During the setting of the shift amount ΔV, the NAND flash memory 100 notifies the controller 200 that the NAND flash memory 100 is in the ready state by setting the signal RBn to "H" level.

Note that the shift amount Δ changes between shift reading in step ST156 and shift reading in step ST157. For example, in shift reading of step ST156, the shift amount Δ is decided, using a reading voltage VCGRVm in the mth loop processing, in accordance with $$\Delta = (VCGRVm - VCGRVdef) \quad (11)$$

Additionally, for example, in shift reading of step ST157, the shift amount Δ is decided, using the valley position voltage VCGRV" detected in step ST156, in accordance with $$\Delta = (VCGRV'' - VCGRVdef) \quad (12)$$

When the NAND flash memory 100 is set in the ready state, the controller 200 issues a prefix command "vvh". The command "vvh" is a command used to declare to execute main-reading based on the preliminary read data saved in the data latch without performing preliminary reading anew.

Next, the controller 200 continuously issues the command "zzh" and the first reading command "00h". The controller 200 subsequently issues addresses (including a column address, a block address, and a page address) for, for example, five cycles. After that, the controller 200 issues the second reading command "30h".

When the command "30h" is stored in the command register 160, the sequencer 170 starts the reading operation by controlling the row decoder 120, the column control circuit 140, and the like. The NAND flash memory 100 notifies the controller 200 that the NAND flash memory 100 is in the busy state by setting the signal RBn to "L" level. In main-reading, based on the result of the preliminary reading, the NAND flash memory 100 reads data of one page from the memory cell transistor MT connected to the word line WL, and causes a latch circuit to hold the data. The NAND flash memory 100 notifies the controller 200 that the NAND flash memory 100 is in the ready state by setting the signal RBn to "H" level.

After that, as described with reference to FIG. 39, the controller 200 issues the command "05h", addresses, and the command "E0h", and then repetitively asserts the signal REn. Every time the signal REn is toggled, the data of main-reading held by the latch circuit is transmitted to the controller 200.

5.5.3 Timing Chart

An operation including preliminary reading and main-reading according to the modification of the fifth embodiment will be described next with reference to the timing charts shown in FIGS. 44 and 45. FIG. 44 corresponds to steps ST155 and ST156 shown in FIG. 42, and FIG. 45 corresponds to step ST158. Note that FIG. 44 does not illustrate the main-reading operation formally executed during the preliminary reading period.

Figure 45:
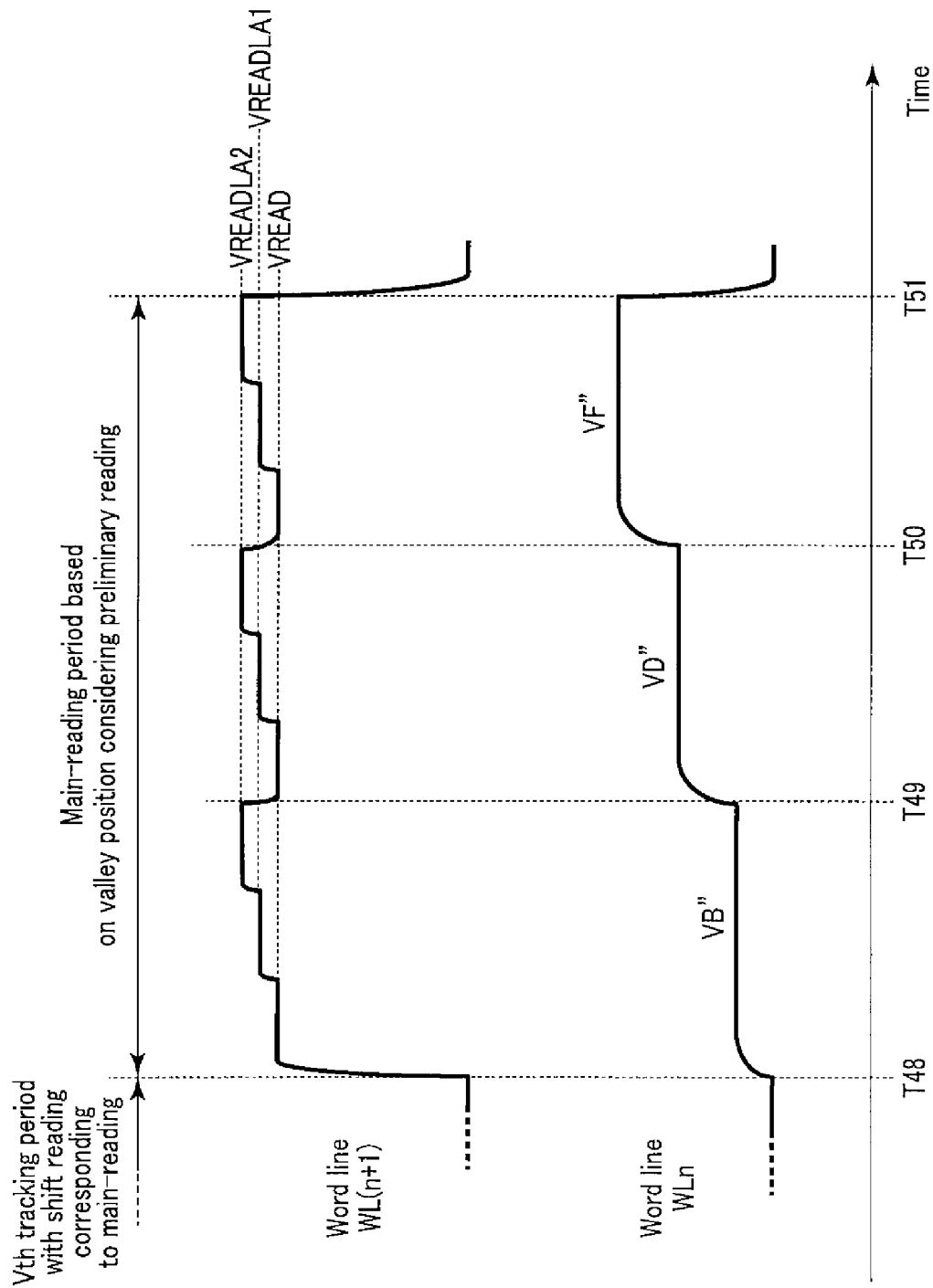

As shown in FIGS. 44 and 45, in this example, the reading operation considering the influence of the inter-cell effect is performed even when Vth tracking is performed. That is, in FIG. 44, preliminary reading is performed in a period of times T41 to T43. In the main-reading period from time T44-0 to time T47-0, the voltage of the word line WL(n+1) is stepped up in three stages to VREAD, VREADLA1, and VREADLA2 in three periods in which voltages VB0, VD0, and VF0 are applied to the selected word line WL. A valley position is searched for by repeating the reading operation while stepping up the voltage of the word line WL(n+1) in this way. A valley position detected as a result is the voltage VCGRV" described with reference to FIG. 40.

Hence, as shown in FIG. 45, in the reading operation of step ST158, data is read using the voltages VB", VD", and VF" detected by the tracking shown in FIG. 44. The voltages VREAD, VREADLA1, and VREADLA2 are sequentially applied to the word line WL(n+1), as a matter of course.

As described above, from the viewpoint of accurately searching for the valley position, the inter-cell effect is preferably taken into consideration in the Vth tracking operation for valley position detection, as in this example. However, from the viewpoint of the speed of the entire reading operation, use of a correction value may be preferable as described with reference to FIG. 38. Note that in Vth tracking of this example, both a prior-reading operation and the main-reading operation may be repeated. That is, when m=0, the prior-reading operation and the main-reading operation are executed. When m=1, the prior-reading operation and the main-reading operation with shifting of the reading voltage are executed. When m=2, the prior-reading operation and the main-reading operation with further shifting of the reading voltage are executed, and so on. However, as described with reference to FIG. 44, the prior-reading operation and the main-reading operation may be executed in combination only in the first reading, that is, only when m=0. From m=1, the prior-reading operation result in m=0 may be used, so the main-reading operation itself need not be performed. According to this method, the prior-reading operation needs to be performed only once in one Vth tracking operation, and the speed of the reading operation can be improved. However, the prior-reading result obtained when m=0 needs to be held by one of the latch circuits during the period of Vth tracking execution without being reset.

6. Other Modifications

As described above, a memory system according to the embodiment includes a semiconductor memory including a first memory cell coupled to a first word line and capable of holding data, and a controller capable of issuing a first command and a second command. The data that the semiconductor memory can hold is multi-bit data including a first bit and a second bit. Upon receiving the first command, the semiconductor memory applies a voltage (for example, BR in FIG. 5) within a first range and a voltage (for example, DR in FIG. 5) within a second range to the first word line and reads the first bit (for example, the middle bit in FIG. 5) from the first memory cell. Upon receiving the second command, the semiconductor memory applies a voltage (for example, CR in FIG. 5) within a third range to the first word line and reads the second bit (for example, the upper bit in FIG. 5) from the first memory cell. The controller issues the first command a plurality of times and changes the voltages to be applied to the first word line within the first range and the second range in accordance with the plurality of first commands (Vth tracking in FIG. 16). Based on the first bit read from the first memory cell for each of the plurality of first commands, a first voltage is specified within the first range, and a second voltage is specified within the second range (Vth cross point). Furthermore, based on at least the first voltage (for example, VB, VD, or VF in FIG. 10), a third voltage (for example, VA, VC, VE, or VG in FIG. 10) is estimated within the third range. The voltage applied to the first word line to read the second bit when the second command is issued is the estimated third voltage (ST54 and ST58 in FIG. 18).

Additionally, according to one embodiment, a memory system includes a semiconductor memory capable of reading data on a page basis, and a controller capable of issuing a first instruction and a second command. The semiconductor memory includes a first word line and a first memory cell connected to the first word line. At least a first page (middle page) and a second page (upper or lower page) are associated with the first word line. Upon receiving the first command, the semiconductor memory executes a first reading operation of applying voltages (VB, VD, and VF in FIG. 16) in three steps to the first word line and reading the first page (middle page) at least four times for the first page (middle page) (4 point Vth tracking). In the four reading operations (m=0 to 3 in FIG. 16), the voltages (VB, VD, and VF in FIG. 16) in three steps are changed, and the manners the voltages (VB, VD, and VF in FIG. 16) in three steps are changed are different from each other (VB, VD, and VF in FIG. 16).

Any one of the voltages (VB, VD, and VF in FIG. 16) in three steps monotonically decreases or monotonically increases during the four reading operations, or changes from decrease to increase or from increase to decrease at any timing.

The embodiment is not limited to the forms described in the above-described first to fifth embodiments, and various changes and modifications can be made. In the above-described first to fifth embodiments, the NAND flash memory 100 generates the separated data, and the controller 200 calculates the bit count. However, the present invention is not limited to this. For example, the separated data may be generated by the controller 200, and the bit count may be calculated by the NAND flash memory 100. In this way, the NAND flash memory 100 may transmit all of the test reading result, the shift reading result, and the like to the controller 200, and the controller 200 may calculate the separated data or bit count or perform valley position detection. That is, the NAND flash memory 100 may read data from the memory cell array in response to a request from the controller 200, and the controller 200 may perform various operations using the read data.

In the fifth embodiment, a case in which the influence from only the word line WL(n+1) is taken into consideration as the inter-cell effect has been described. However, the inter-cell effect from a word line WL(n−1) may be taken into consideration. Normally, data is written sequentially from the source side. That is, when writing data to the word line WLn, data writing to the word line WL(n−1) is already completed. Hence, by writing data to the word line WLn, a threshold variation caused by the inter-cell effect from the word line WL(n−1) can be neglected. However, if the write data to the word line WLn is at "Er" level, that is, if electron injection to the charge accumulation layer of the memory cell transistor MT is inhibited, and the threshold voltage maintains the erasing level, the influence of the inter-cell effect received at the time of data writing to the word line WL(n−1) remains. That is, especially for the memory cell transistor MT that holds the "Er" level, the influence of the inter-cell effect from the word line WL(n−1) is preferably taken into consideration. In this case, data is read not only from the word line WL(n+1) but also from the word line WL(n−1) in preliminary reading described in the above embodiment. At the time of main-reading, the appropriate voltage VREADLA is applied not only to the word line WL(n+1) but also to the word line WL(n−1), and data strobed at an appropriate timing according to the combination of the data of the unselected word lines WL(n−1) and WL(n+1) is employed. Note that if only a case in which the word line WLn is at the "Er" level is taken into consideration, the above-described operation need only be performed in the reading operation AR. In the remaining reading operations, the inter-cell effect from only the word line WL(n+1) is taken into consideration. However, in the remaining reading operations as well, the inter-cell effect from the word line WL(n−1) may also be taken into consideration.

In the above-described embodiments, a case in which one memory cell transistor MT can hold three bits (TLC: Triple Level Cell) has been described. However, the present invention is not limited to this. For example, the memory cell transistor MT may be able to hold two bits (MLC: Multi Level Cell) or four or more bits.

Additionally, the following matters can be applied to the embodiments and modifications.

In the multilevel reading operation (read), the voltage applied to the selected word line in the reading operation of A level ranges from, for example, 0 V to 0.55 V. However, the voltage is not limited to this and may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the reading operation of B level ranges from, for example, 1.5 V to 2.3 V. However, the voltage is not limited to this and may be set within any one of the ranges of 1.75 V to 1.8 V, 1.8 V to 1.95 V, 1.95 V to 2.1 V, and 2.1 V to 2.3 V.

The voltage applied to the selected word line in the reading operation of C level ranges from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.7 V, and 3.7 V to 4.0 V.

A time (tR) of the reading operation may be set within the range of, for example, 25 μs to 38 μs, 38 μs to 70 μs, or 70 μs to 80 μs.

A writing operation includes a program operation and a verifying operation. In the writing operation, the voltage first applied to the selected word line in the program operation ranges from, for example, 13.7 V to 14.3 V. The voltage is not limited to this and may be set within any one of the ranges of, for example, 13.7 V to 14.0 V and 14.0 V to 14.7 V.

The voltage first applied to the selected word line when write-accessing an odd-numbered word line and the voltage first applied to the selected word line when write-accessing an even-numbered word line may be different.

If the program operation is ISPP (Incremental Step Pulse Program), the voltage of step-up is, for example, 0.5 V.

The voltage applied to an unselected word line may be set within the range of, for example, 7.0 V to 7.3 V. However, the voltage is not limited to this and may be set within the range of, for example, 7.3 V to 8.4 V or set to 7.0 V or less.

The pass voltage to be applied may be changed depending on whether the unselected word line is an odd-numbered word line or an even-numbered word line.

A time (tProg) of the writing operation may be set within the range of, for example, 1,700 μs to 1,800 μs, 1,800 μs to 1,900 μs, or 1,900 μs to 2000 μs.

In the erasing operation, the voltage first applied to the well which is formed in the upper portion of the semiconductor substrate and above which the memory cell is arranged is set within the range of, for example, 12 V to 13.7 V. However, the voltage is not limited to this and may be set within the range of, for example, 13.7 V to 14.8 V, 14.8 V to 19.0 V, 19.0 V to 19.8 V, or 19.8 V to 21 V.

A time (tErase) of the erasing operation may be set within the range of, for example, 3,000 μs to 4,000 μs, 4,000 μs to 5,000 μs, or 4,000 μs to 9,000 μs.

The memory cell includes a charge accumulation layer arranged on a 4 to 10 nm thick tunnel insulating film on the semiconductor substrate (silicon substrate). The charge accumulation layer can have a stacked structure of a 2 to 3 nm thick insulating film such as an SiN or SiOn film and 3 to 8 nm thick polysilicon. A metal such as Ru may be added to the polysilicon. An insulating film is formed on the charge accumulation layer. The insulating film includes, for example, a 4 to 10 nm thick silicon oxide film sandwiched between a 3 to 10 nm thick lower High-k film and a 3 to 10 nm thick upper High-k film. As the High-k film, HfO or the like is usable. The silicon oxide film may be thicker than the High-k film. A 30 to 70 nm thick control electrode is formed on a 3 to 10 nm thick work function adjusting material on the insulating film. Here, the work function adjusting material is a metal oxide film such as TaO or a metal nitride film such as TaN. As the control electrode, W or the like is usable.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory including a first word line and a first memory cell coupled to the first word line, the first memory cell being capable of holding multi-bit data including a first bit and a second bit; and
a controller configured to issue a first command and a second command, wherein
in response to the issued first command, the semiconductor memory is configured to execute a first reading operation, the first reading operation including applying a voltage within a first range and a voltage within a second range to the first word line and reading a first data item from the first memory cell, the first data item corresponding to the first bit, in response to the issued second command, the semiconductor memory is configured to execute a second reading operation, the second reading operation applying a voltage between the first range and the second range to the first word line and reading a second data item from the first memory cell, the controller is configured to determine a first voltage within the first range based on at least the first data item and the second data item, the controller is configured to determine a second voltage within a third range based on at least the first voltage, the third range being different from the first range and the second range, the second voltage being for reading the second bit, the controller is configured to issue a third command, and in response to the issued third command, the semiconductor memory is configured to apply the second voltage to the first word line and read a third data item from the first memory cell, the third data item corresponding to the second bit.

2. The memory system of claim 1, wherein the controller is configured to issue the first command a plurality of times and change the voltage within the first range and the voltage within the second range in accordance with the plurality of first commands, and the controller is configured to determine the first voltage based on a first bit count based on at least a plurality of first data items and the second data item, each of the plurality of the first data items corresponding to each of the plurality of first commands.

3. The memory system of claim 2, wherein the semiconductor memory is configured to generate each of a plurality of third bits based on at least each of the plurality of the first data items and the second data item, each of the plurality of third bits corresponding to each of the first data items, and the controller is configured to generate the first bit count based on the plurality of third bits.

4. The memory system of claim 2, wherein the semiconductor memory is configured to generate each of a plurality of fifth bits based on at least each of the plurality of the first data items and the second data item, each of the plurality of fifth bits corresponding to each of the plurality of the first data items, and the controller is configured to generate a second bit count based on the plurality of fifth bits and determine a third voltage within the second range based on the second bit count.

5. The memory system of claim 4, wherein the controller is configured to determine the second voltage within a third range based on a difference between the first voltage and the third voltage.

6. The memory system of claim 4, wherein the controller is configured to determine the second voltage within a third range based on an intermediate voltage between the first voltage and the third voltage.

7. The memory system of claim 2, wherein the number of the plurality of times is at least four times, the voltage within the first range in a second time of the plurality of times is lower than the voltage within the first range in a first time of the plurality of times, the voltage within the first range in a third time of the plurality of times is lower than the voltage within the first range in the second time of the plurality of times, the voltage within the second range in the second time of the plurality of times is lower than the voltage within the second range in the first time of the plurality of times, and the voltage within the second range in the third time of the plurality of times is lower than the voltage within the second range in the second time of the plurality of times.

8. The memory system of claim 2, wherein the first reading operation includes further applying a voltage within a fourth range to the first word line, the controller is configured to issue further a fourth command, in response to the issued fourth command, the semiconductor memory is configured to execute a third reading operation, the third reading operation applying a voltage within between the second range and the fourth range to the first word line and read a fourth data item from the first memory cell, the first bit count is generated based on the plurality of first data items, the second data item and the fourth data item, and the controller is configured to determine the first voltage based on the generated first bit count.

9. The memory system of claim 8, wherein the semiconductor memory is configured to generate each of a plurality of fourth bits based on each of the first data items, the second data item, and the fourth data item, each of the plurality of fourth bits corresponding to each of the first data items, and the controller is configured to generate the first bit count based on the plurality of fourth bits.

10. The memory system of claim 9, wherein the semiconductor memory further includes a first latch, a second latch, and a third latch, the semiconductor memory is configured to store the second data item in the first latch, store the fourth data item in the second latch, and store one of the first data items in the third latch, the semiconductor memory is configured to generate one of the plurality of fourth bits based on the second data item in the first latch, the fourth data item in the second latch, and the one of the first data items in the third latch, and the semiconductor memory is configured to send each of the plurality of the fourth bits to the controller.

11. The memory system of claim 1, wherein the controller is configured to determine the second voltage based on a difference between the first voltage and a fourth voltage within the first range.

12. The memory system of claim 1, wherein the semiconductor memory further includes a second word line and a second memory cell coupled to the second word line, the first memory cell and the second memory cell are connected in series, and in response to the issued third command, the semiconductor memory is configured to apply, to the second word line, a fourth voltage and a fifth voltage during which the second voltage is applied to the first word line, the fifth voltage being different from the fourth voltage.

13. The memory system of claim 12, wherein the semiconductor memory is configured to sequentially apply to the second word line, the fourth voltage and the fifth voltage, and the fifth voltage is higher than the fourth voltage.

14. The memory system of claim 13, wherein the second memory cell is capable of holding multi-bit data including the first bit and the second bit.

* * * * *